United States Patent [19]
Park et al.

[11] Patent Number: 5,631,871
[45] Date of Patent: May 20, 1997

[54] SYSTEM FOR SELECTING ONE OF A PLURALITY OF MEMORY BANKS FOR USE IN AN ACTIVE CYCLE AND ALL OTHER BANKS FOR AN INACTIVE PRECHARGE CYCLE

[75] Inventors: Churoo Park, Suwon; Hyun-Soon Jang, Seoul; Chull-Soo Kim, Suwon; Myung-Ho Kim, Suwon; Seung-Hun Lee, Suwon; Si-Yeol Lee, Kyungki-do; Ho-Cheol Lee; Tae-Jin Kim, both of Seoul; Yun-Ho Choi, Suwon, all of Rep. of Korea

[73] Assignee: Samsung Electronics Co., Ltd., Suwon, Rep. of Korea

[21] Appl. No.: 578,151

[22] Filed: Dec. 29, 1995

Related U.S. Application Data

[62] Division of Ser. No. 130,138, Oct. 4, 1993.

[30] Foreign Application Priority Data

| Oct. 2, 1992 | [KR] | Rep. of Korea | 18130 |
| Oct. 2, 1992 | [KR] | Rep. of Korea | 18131 |
| Apr. 27, 1993 | [KR] | Rep. of Korea | 7127 |

[51] Int. Cl.$^6$ ............................. B01F 7/00; B01F 13/00
[52] U.S. Cl. .................. 365/203; 365/228; 375/405; 375/475; 364/DIG. 1
[58] Field of Search .............................. 395/475, 405; 365/203, 228; 364/DIG. 1

[56] References Cited

U.S. PATENT DOCUMENTS

| 3,969,706 | 7/1976 | Proebsting | 365/189.02 |
| 4,079,454 | 3/1978 | Sorenson | 395/800 |
| 4,339,795 | 7/1982 | Brereton | 395/308 |
| 4,750,839 | 6/1988 | Wang | 365/233 |
| 4,800,531 | 1/1989 | Dehganpour | 365/222 |
| 4,833,650 | 5/1989 | Hirayama | 365/225.7 |
| 4,875,196 | 10/1989 | Spaderna | 365/189.04 |
| 4,907,199 | 3/1990 | Dosaka | 365/189.04 |
| 4,943,944 | 7/1990 | Sakui | 365/189.05 |
| 4,980,862 | 12/1990 | Foss | 365/203 |
| 4,987,325 | 1/1991 | Seo | 326/50 |
| 5,128,897 | 7/1992 | McClure | 365/230.03 |
| 5,261,064 | 11/1993 | Wyland | 365/221 |
| 5,289,431 | 2/1994 | Konishi | 365/189.04 |
| 5,319,755 | 6/1994 | Farmwald et al. | 395/284 |
| 5,343,438 | 8/1994 | Choi | 365/233 |
| 5,475,647 | 12/1995 | Yim | 365/230.03 |
| 5,485,426 | 1/1996 | Lee | 365/230.03 |

*Primary Examiner*—Reba I. Elmore
*Assistant Examiner*—J. Peikari
*Attorney, Agent, or Firm*—Cushman Darby & Cushman IP Group of Pillsbury Madison & Sutro LLP

[57] ABSTRACT

A synchronous dynamic random access memory capable of accessing data in a memory cell array therein in synchronism with a system clock from an external system such as a central processing unit (CPU). The synchronous DRAM receives an external clock and includes a plurality of memory banks each including a plurality of memory cells and operable in either an active cycle or a precharge cycle, a circuit for receiving a row address strobe signal and latching a logic level of the row address strobe signal in response to the clock, an address input circuit for receiving an externally generated address selecting one of the memory banks, and a circuit for receiving the latched logic level and the address from the address input circuit and for outputting an activation signal to the memory bank selected by the address and an inactivation signals to unselected memory banks when the latched logic level is a first logic level, so that the selected memory bank responsive to the activation signal operates in the active cycle while the unselected memory banks responsive to the inactivation signals operate in the precharge cycle.

1 Claim, 66 Drawing Sheets

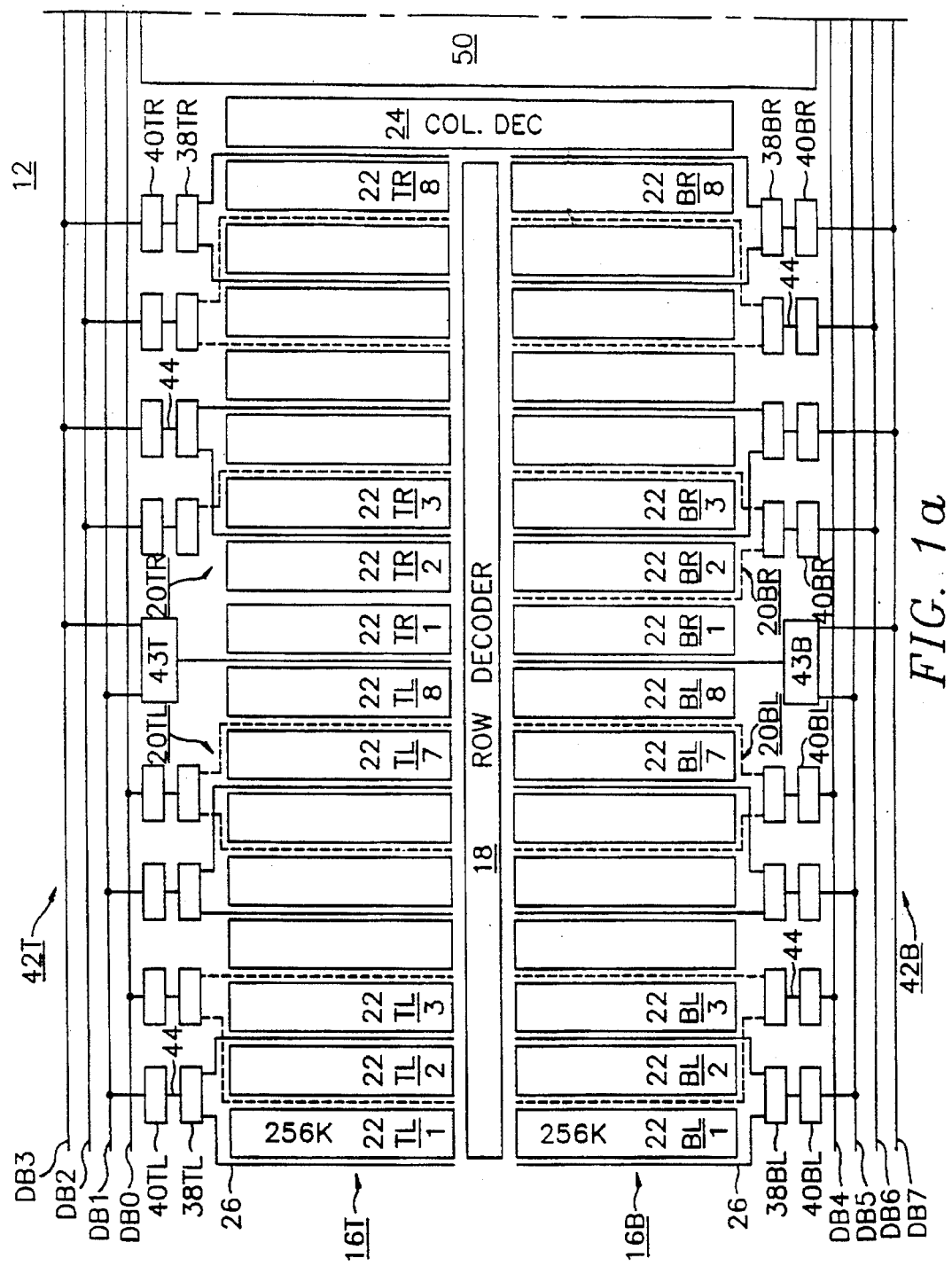
FIG. 1α

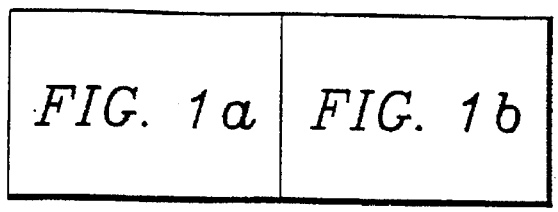
FIG. 1
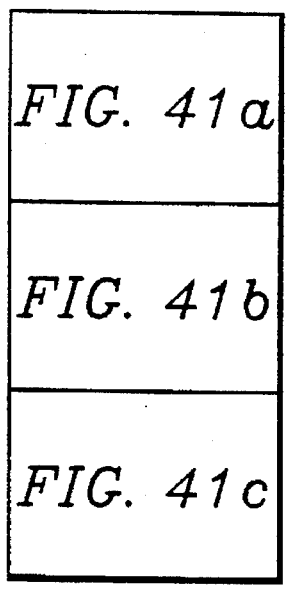
FIG. 33
FIG. 41
FIG. 49
FIG. 62

SYSTEM FOR SELECTING ONE OF A PLURALITY OF MEMORY BANKS FOR USE IN AN ACTIVE CYCLE AND ALL OTHER BANKS FOR AN INACTIVE PRECHARGE CYCLE

This is a division of application Ser. No. 08/130,138, filed Oct. 4, 1993.

FIELD OF THE INVENTION

The present invention relates to a semiconductor memory and, more particularly, to a synchronous dynamic random access memory which is capable of accessing data in a memory cell array disposed therein in synchronism with a system clock from an external system such as a central processing unit (CPU).

BACKGROUND INFORMATION

A computer system generally includes a CPU for executing instructions on given tasks and a main memory for storing data, programs or the like requested by the CPU. To enhance the performance of the computer system, it is basically requested to increase the operating speed of the CPU and also make an access time to the main memory as short as possible, so that the CPU can operate at least with no wait states. Operation clock cycles of modern CPUs such as recent microprocessors are shortening more and more as clock frequencies of 33, 66, 100 MHZ or the like. However, the operating speed of a high density DRAM, which is still the cheapest memory on a price-per-bit base and using as a main memory device, has not been able to keep up with that of the CPU being speeded up. DRAM inherently has a minimum $\overline{RAS}$ access time, i.e., the minimum period of time between activation of $\overline{RAS}$, upon which the signal $\overline{RAS}$ changes from a high level to a low level, and the output of data from a chip thereof with column addresses latched by activation of $\overline{CAS}$. Such a $\overline{RAS}$ access time is called a $\overline{RAS}$ latency, and the time duration between the activation of the signal $\overline{CAS}$ and the output of data therefrom called a $\overline{CAS}$ latency. Moreover, a precharging time is required prior to re-access following the completion of a read operation or cycle. These factors decrease the total amount of operation speed of the DRAM, thereby causing the CPU to have wait states.

To compensate for the gap between the operation speed of the CPU and that of the main memory like the DRAM, the computer system includes an expensive high-speed buffer memory such as a cache memory which is arranged between the CPU and the main memory. The cache memory stores information data from the main memory which is requested by the CPU. Whenever the CPU issues the request for the data, a cache memory controller intercepts it and checks the cache memory to see if the data is stored in the cache memory. If the requested data exists therein, it is called a cache hit, and high-speed data transfer is immediately performed from the cache memory to the CPU. Whereas if there is no presence therein, it is called a cache miss, and the cache memory controller reads out the data from the slower main memory. The read-out data is stored in the cache memory and sent to the CPU. Thus, a subsequent request for this data may be immediately read out from the cache memory. That is, in case of the cache hit, the high-speed data transfer may be accomplished from the cache memory. However, in case of the cache miss, the high-speed data transfer from the main memory to the CPU cannot be expected, thereby incurring wait states of the CPU. Thus, it is extremely important to design DRAMs serving as the main memory to accomplish high-speed operations.

The data transfer between DRAMs and the CPU or the cache memory is accomplished with sequential information or data blocks. To transfer the continuous data at a high speed, various kinds of operating modes such as page, static column, nibble mode or the like have implemented in the DRAM. These operating modes are disclosed in U.S. Pat. Nos. 3,969,706 and 4,750,839. The memory cell array of the DRAM with the nibble mode is divided into four equal parts so that a plurality of memory cells can be made access with the same address. Data is temporarily stored in a shift register to be sequentially read out or written into. However, since the DRAM with the nibble mode cannot continuously transfer more than 5-bit data, the flexibility of the system design cannot be offered upon the application to high-speed data transfer systems. The page mode and the static column mode, after the selection of the same row address in a $\overline{RAS}$ timing, can sequentially access column addresses in synchronism with $\overline{CAS}$ toggling or cycles and with the transition detections of column addresses, respectively. However, since the DRAM with the page or the static column mode needs extra time, such as a setup and a hold times of the column address, for receiving the next new column address after the selection of a column address, it is impossible to access the continuous data at a memory bandwidth higher than 100 Mbits/sec., i.e., to reduce a $\overline{CAS}$ cycle time below 10 nsec. Also, since the arbitrary reduction of the $\overline{CAS}$ cycle time in the page mode cannot guarantee a sufficient column selection time to write data into selected memory cells during a write operation, error data may be written thereinto. However, since these high-speed operation modes are not operations synchronous to the system clock of the CPU, the data transfer system must use a newly designed DRAM controller whenever a CPU having higher speed is replaced. Thus, to keep up with high-speed microprocessors such as CISC and RISC types, the development of a synchronous DRAM is required which is capable of accessing the data synchronous to the system clock of the microprocessor at a high speed. An introduction to synchronous DRAMs appears with no disclosure of detailed circuits in the NIKKEI MICRODEVICES in April, 1992, Pages 158–161.

To increase the convenience of use and also enlarge the range of applications, it is more desirable to allow an on-chip synchronous DRAM to not only operate at various frequencies of the system clock, but also be programmed to have various operation modes such as a latency depending on each clock frequency, a burst length or size defining the number of output bits, a column addressing way or type, and so on. Examples for selecting an operation mode in DRAM are disclosed in U.S. Pat. No. 4,833,650 issued on May 23, 1989, as well as in U.S. Pat. No. 4,987,325 issued on Jan. 22, 1991 and assigned to the same assignee. These prior art patents disclose technologies to select one operation mode, such as page, static column and nibble modes. Selection of the operation mode in these prior art patents is performed by cutting off fuse elements by means of a laser beam from an external laser apparatus or an electric current from an external power supply, or by selectively wiring bonding pads. However, in these prior technologies, once the operation mode had been selected, the selected operation mode cannot be changed into another operation mode. Thus, the prior art does not permit changes between operation modes even if subsequently required.

SUMMARY OF THE INVENTION

An object of the present invention is to provide a synchronous dynamic random access memory in which input/output of data is synchronous with an external system clock.

Another object of the present invention is to provide a synchronous dynamic random access memory with high performance.

Still another object of the present invention is to provide a synchronous dynamic random access memory which is capable of operating at a high data transfer rate.

A further object of the present invention is to provide a synchronous dynamic random access memory which is able of operating at various system clock frequencies.

Still a further object of the present invention is to provide a synchronous dynamic random access memory in which the number of input or output data may be programmed.

Another object of the present invention is to provide a counter circuit in which a counting operation can be performed in either binary or interleave mode.

Still another object of the present invention is to provide a semiconductor memory which can prohibit unnecessary internal operations of the memory chip regardless of the number of input or output data.

A further object of the present invention is to provide a semiconductor memory which can set various operation modes.

Still a further object of the present invention is to provide a semiconductor memory including a data transfer circuit for providing precharge and data transfer operable at a high data transfer rate.

Another object of the present invention is to provide a semiconductor memory which includes at least two memory banks whose operation modes can be set in on-chip semiconductor memory.

According to an aspect of the present invention, a semiconductor memory formed on a semiconductor chip having various operation modes, includes address input circuit for receiving external address designating at least one of the operation modes to the chip, a circuit for generating a mode set control signal in a mode set operation; and a circuit for storing codes based on the external address in response to the mode set control signal and producing an operation mode signal representing the operation mode determined by the codes.

According to another aspect of the present invention, a semiconductor memory having a plurality of internal operation modes includes a circuit for producing a power-on signal upon reaching of a power supply potential at a predetermined value after the application of the power supply potential, and a circuit for automatically storing a plurality of code signals in response to the power-on signal and producing internal operation mode signals indicating selected ones of the internal operation modes which are defined by the code signals.

According to another aspect of the present invention, a dynamic random access memory includes a plurality of memory banks, each bank including a plurality of memory cells and operable in either an active cycle indicating a read cycle or a write cycle, or a precharge cycle, a first circuit for receiving a row address strobe signal and producing a first signal, a second circuit for receiving a row address strobe signal and producing a first signal, a second circuit for receiving a column address strobe signal and producing a second signal, a third circuit for receiving a write enable signal and producing a third signal, an address input circuit for receiving address indicating the selection of the memory banks, and a logic circuit responsive to the first, second and third signals and the address signals including a latch circuit corresponding to the respective banks for storing data representing the active cycle for the bank selected by the address and data representing the precharge cycle for unselected banks.

According to still another aspect of the present invention, a dynamic random access memory receiving an external clock includes a plurality of memory banks each including a plurality of memory cells and operable in either an active cycle indicating a read cycle or a write cycle, or a precharge cycle, a circuit for receiving a row address strobe signal and latching a logic level of the row address strobe signal in response to one of a rising edge and a falling edge of the clock, an address input circuit for receiving an externally generated address selecting one of the memory banks, and a circuit for receiving the latched logic level from the receiving and latching circuit and the address from the address input circuit and for outputting an activation signal to the memory bank selected by the address and an inactivation signals to unselected memory banks when the latched logic level is a first logic level, so that the selected memory bank responsive to the activation signal operates in the active cycle while the unselected memory banks responsive to the inactivation signals operate in the precharge cycle.

According to still another aspect of the present invention, a semiconductor memory formed on a semiconductor chip receiving an external clock to the chip and outputting data read out from memory cells via data output buffer circuit, includes a circuit for generating a burst length signal representing the time interval of output of data and outputting data in synchronism with the clock via the data output buffer circuit during the time interval corresponding to the burst length signal.

According to further still another aspect of the present invention, a semiconductor memory includes a memory array having a plurality of memory cells arranged in rows and columns, a plurality of sub-arrays provided by partitioning the memory cell array in the row direction, each of the sub-arrays having a plurality of word lines respectively connected to associated columns of the memory cells and a plurality of bit lines respectively connected to associated rows of the memory cells, the bit lines of each sub-array divided into first groups of bit lines and second groups of bit lines, the respective ones of which are divided into first sub-groups of bit lines and second sub-groups of bit lines, the first groups of each sub-array alternately arranged with the second groups thereof, the first sub-groups of each sub-array alternately arranged with the second sub-groups thereof, and I/O buses respectively disposed in parallel to the word lines between the sub-arrays and on outer sides of the sub-arrays, and divided into first I/O buses and second I/O buses respectively arranged at odd and even positions, each I/O bus divided into first I/O lines and second I/O lines, the first and the second I/O lines of the respective first I/O buses respectively connected via column selection switches with the bit lines of the first and the second sub-groups of the first groups of sub-arrays adjacent thereto, the first and the second I/O lines of the respective second I/O buses respectively connected via column selection switches with the bit lines of the first and the second sub-groups of the second groups of sub-arrays adjacent thereto.

BRIEF DESCRIPTION OF THE DRAWINGS

These and other objects, features, and advantages of the present invention are better understood by reading the following detailed description of the invention, taken in conjunction with the accompanying drawings, wherein:

FIGS. 1a and 1b show a schematic plane view of various component parts formed on the same semiconductor chip of a synchronous DRAM according to the present invention;

FIGS. 15a, 15b and 15c are a schematic circuit diagram for an address code register in FIG. 13;

FIG. 37 is a timing diagram showing the operation of the circuit of FIG. 36a;

FIG. 62 is a diagram showing the manner in which the separate sheets of drawings of FIG. 1a and FIG. 1b, FIG. 33a to FIG. 33c, FIG. 41a to FIG. 41, and FIG. 49a to FIG. 49c are combined.

DETAILED DESCRIPTION OF THE INVENTION

Figure 1B:
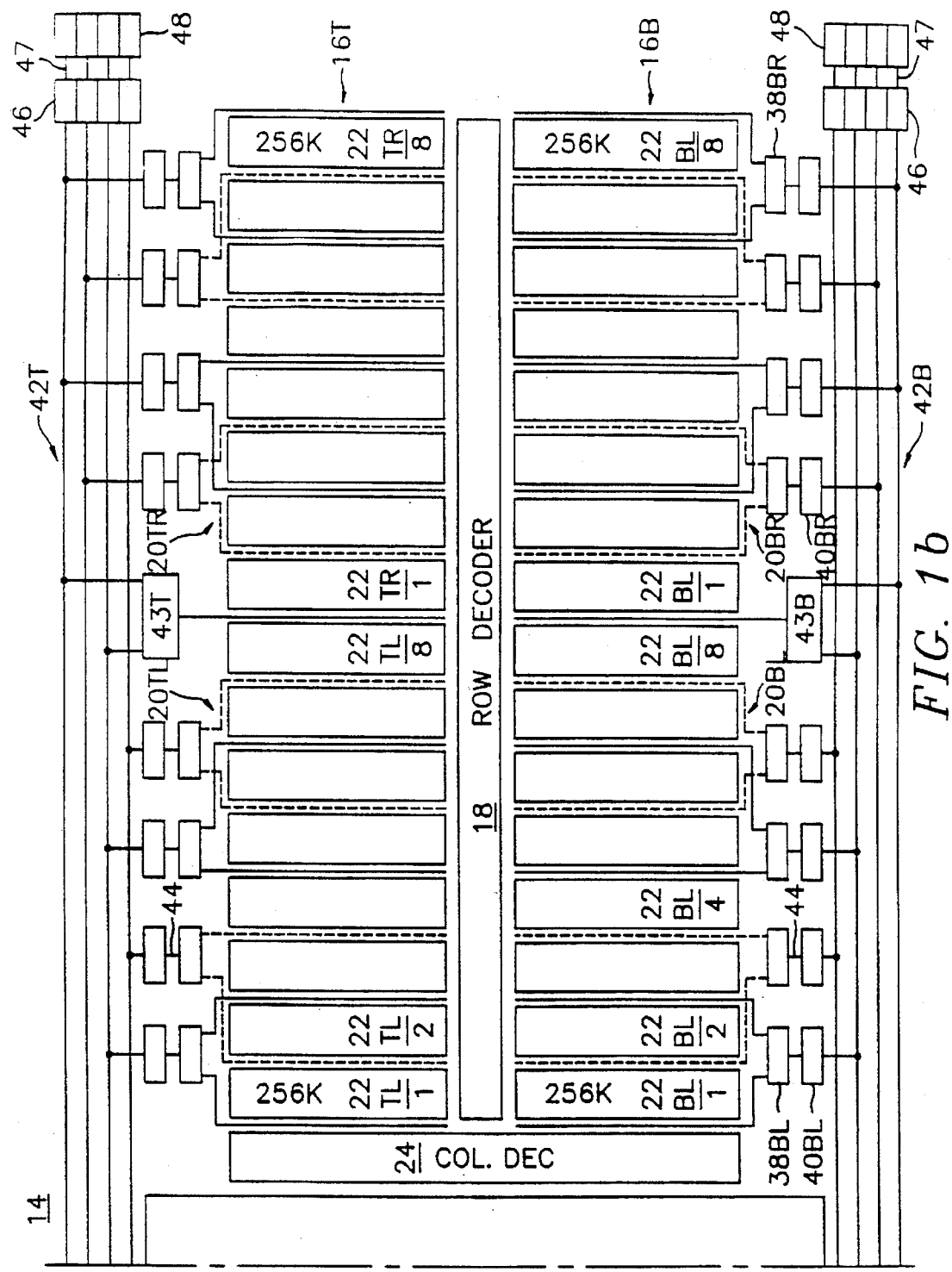

Preferred embodiments of the present invention will be discussed referring to the accompanying drawings. In the drawings, it should be noted that like elements represent like symbols or reference numerals, wherever possible.

In the following description, numerous specific details are set forth such as the number of memory cells, memory cell arrays or memory banks, specific voltages, specific circuit elements or parts and so on in order to provide a thorough understanding of the present invention. It will be obvious to those skilled in the art that the invention may be practiced without these specific details.

The synchronous DRAM in its presently preferred embodiment is fabricated employing a twin well CMOS technology and uses n-channel MOS transistors having a threshold voltage of 0.6 to 0.65 volts, p-channel MOS transistors having a threshold voltage of −0.8 to −0.85 volts and power supply voltage Vcc of approximately 3.3 volts.

CHIP ARCHITECTURE

Referring to FIG. 1 comprising FIG. 1a and FIG. 1b, illustration is made on a schematic plane view for various element portions formed on the same semiconductor chip of a synchronous DRAM according to the present invention. The DRAM in the present embodiment is a 16,777,216 bit (16-Mbit) synchronous DRAM made up of 2,097,152 (2M) ×8 bits. Memory cell arrays are partitioned into a first bank 12 and a second bank 14, as respectively shown in FIG. 1a and FIG. 1b, in order to increase a data transfer rate. Each bank comprises an upper memory cell array 16T and a lower memory cell array 16B respectively positioned at upper and lower portions, each of which contains memory cells of 4,194,304 bits (4-Mbit). The upper and the lower memory cell arrays are respectively divided into left memory cell arrays 20TL and 20BL and right memory cell arrays 20TR and 20BR of 2-Mbit memory cells each, neighboring on their lateral sides. The left and the right memory cell arrays of the upper memory cell array 16T of each bank will be respectively referred to as a upper left memory cell array or a first memory cell array 20TL and a upper right memory cell array or a third memory cell array 20TR. Likewise, the left and the right memory cell arrays of the lower memory cell array 16B of each bank will be respectively referred to as a lower left memory cell array or a fourth memory cell array 20BR. Thus, each bank is divided into four memory cell arrays consisting of the first to the fourth memory cell arrays. The upper left and right memory cell arrays and the lower left and right memory cell arrays are respectively divided into 8 upper left submemory cell arrays (or upper left sub-arrays) 22TL1 to 22TL8, 8 upper right submemory cell arrays (or upper right sub-arrays) 22TR1 to 22TR8 and 8 lower right submemory cell arrays (or lower right sub-arrays) 22BR1 to 22BR8. Each of the sub-arrays has 256K-bit memory cells arranged in a matrix form of 256 rows and 1,024 columns. Each memory cell is of a known one-transistor one-capacitor type.

In each bank, a row decoder 18 is arranged between the upper memory cell array 16T and the lower memory cell array 16B. The row decoder 18 of each bank is connected with 256 row lines (word lines) of each sub-array. Word lines of respective one of the upper and the lower sub-array pairs 22TL1, 22BL1; 22TL2, 22BL2; ...; 22TR8, 22BR8 arranged in a symmetrical relationship with respect to the row decoder 18 are extending in opposite directions therefrom in parallel with a vertical direction. The row decoder 18 responsive to row addresses from a row address buffer selects one of sub-arrays and one of word lines of the respectively selected sub-arrays and provides a row driving potential on each selected word line. Thus, in response to given row addresses in each bank, the row decoder 18 selects total four word lines: one word line selected in a selected one of the upper left sub-arrays 22TL1–22TL8, one word line selected in a selected one of the lower left sub-arrays 22BL1–22BL8, one word line selected in a selected one of the upper right sub-arrays 22TR1–22TR8 and one word line selected in a selected one of the lower right sub-arrays 22BR1–22BR8.

Column decoders 24 are respectively positioned adjacent to right side ends of the upper and the lower memory cell arrays 16T and 16B in the first bank 12 and to left side ends of the upper and lower memory cell arrays 16T and 16B in the second bank 14. Each of the column decoders 24 is connected to 256 column selection lines which are parallel in the horizontal direction and perpendicular to the word lines, serving as selecting one of the column selection lines in response to a column address.

I/O buses 26 are located adjacent to both side ends of the respective sub-arrays 22TL, 22BL, 22TR and 22BR, extending in parallel with the word lines. The I/O buses 26 between opposite side ends of sub-arrays are shared by these two adjacent sub-arrays. Each of the I/O buses 26 is composed of our pairs of I/O lines, each pair of which consists of two signal lines in the complementary relation and is connected with corresponding bit line pair via a column selection switch and a sense amplifier.

Figure 2:
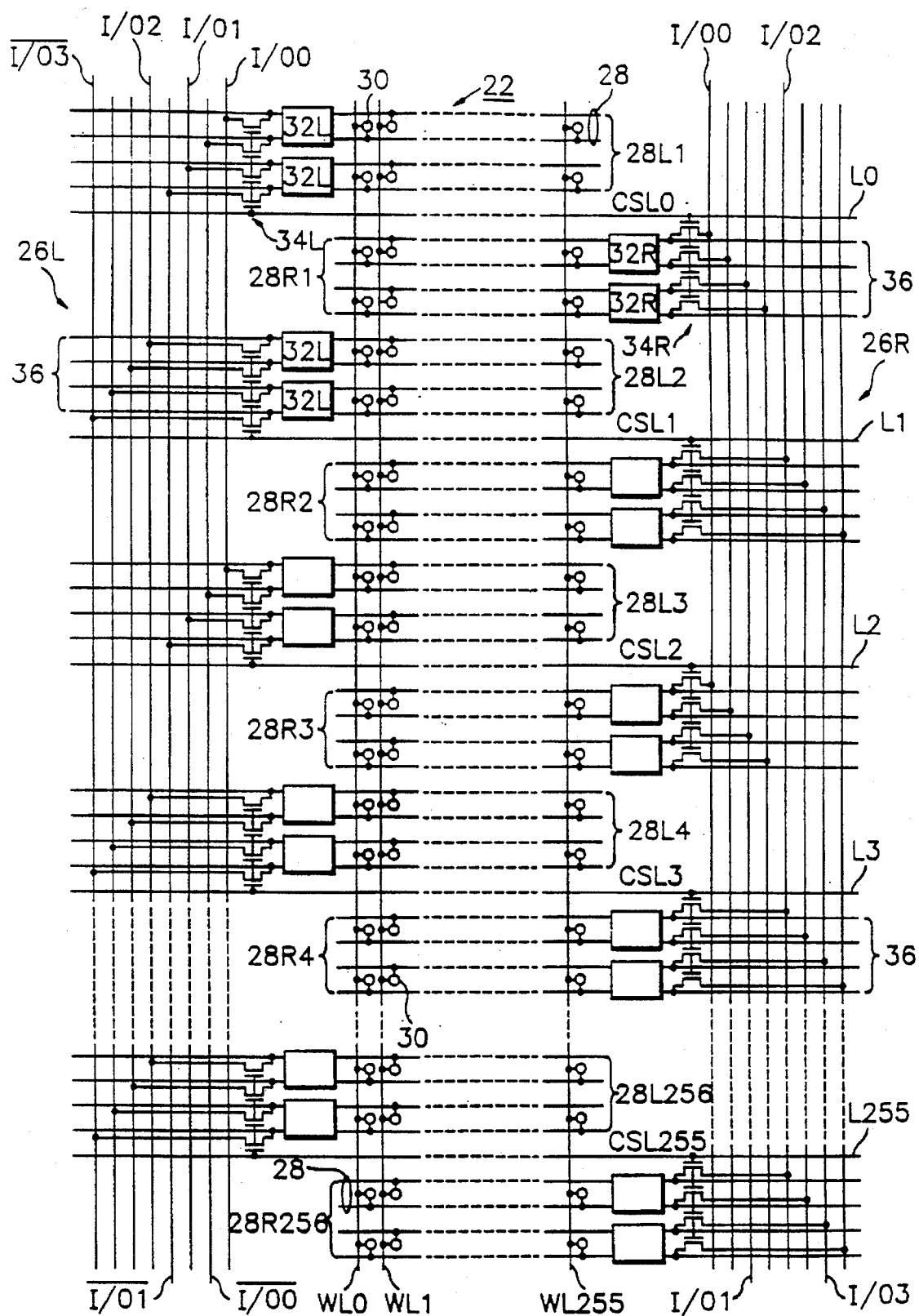
FIG. 2 is a diagram showing an arrangement relationship with one of sub-arrays in FIG. 1 and input/output line pairs coupled thereto.

Referring now to FIG. 2, for purposes of simplicity, the drawing is represented which illustrates the arrangement of an odd numbered one of sub-arrays 22TL1 to 22TR8 in the upper memory cell array 16T and that of I/O buses associated therewith. A first or left I/O bus 26L and a second or right I/O bus 26R respectively run in parallel with wordlines WL0–WL255 at left and right ends of the sub-array 22. Each of the first and the second I/O buses 26L and 26R consists of first I/O line pairs which are composed of I/O line pairs I/O0, $\overline{I/O0}$ and I/O1, $\overline{I/O1}$, and second I/o line pairs which are composed of I/O line pairs I/O2, $\overline{I/O2}$ and I/O3, $\overline{I/O3}$. The sub-array 22 contains 1,024 bit line pairs 28 perpendicular to the word lines WL0–WL255 which are arranged in a folded bit line fashion. Memory cells 30 are located at crosspoints of word lines and bit lines. The bit line pairs 28 constituting the sub-array 22 are divided into a plurality of first bit line groups 28L1 to 28L256 arranged at odd locations and a plurality of second bit line groups 28R1 to 28R256 arranged at even locations. Each of the bit line groups has a given number of bit line pairs (2 bit line pairs in the present embodiment). The first bit line groups 28L are arranged to alternate with the second bit line groups 28R. Odd numbered bit line pairs (or first sub-groups) 28L1, 28L3, ..., 28L255 and even numbered bit line pairs (or second sub-groups) 28L2, 28L4, ..., 28L256 of the first bit line groups 28L are respectively connected with the first I/O line pairs and the second I/O line pairs of the first I/O bus 26L via corresponding sense amplifiers 32L and column selection switches 34L. In the same manner, odd numbered bit line pairs (or first sub-groups) 28R1, 28R3, ..., 28R255 and even numbered bit line pairs (or second sub-groups) 28R2, 28R4, ..., 28R256 of the second bit line groups 28R are respectively connected with the first I/O line pairs and the second I/O line pairs of the second I/O bus 28R via corresponding amplifiers 32R and column selection switches 34R. First column selection lines L0, L2, ... and L254, which are connected with column selection switches associated with the first I/O line pairs 1/O0, $\overline{I/O0}$ and 1/O1, $\overline{I/O1}$ in left and right I/O buses 26L and 26R, are arranged in parallel to alternate with second column selection lines L1, L3, ... and L255 which are connected to column selection switches associated with the second I/O line pairs I/O2, $\overline{I/O2}$ and I/O3, $\overline{I/O3}$ therein. Thus, in a read operation, after the selection of one word line, i.e., one page with row addresses, the first and the second I/O line pairs in the left and right I/o buses 26L and 26R provide continuous data, alternating data of two bits each by sequentially selecting column selection lines L0 to L255. Line pairs 36, which are connected with corresponding sense amplifiers 32L and 32R and are alternately running in opposite directions, are respectively connected with corresponding bit line groups 28L and 28R via corresponding sense amplifiers within sub-arrays adjacent to the first and second I/O buses 26L and 26R. That is, the first I/O line pairs and the second I/O line pairs of the first I/O bus 26L are respectively connected with odd numbered bit line pairs (or first sub-groups) and even numbered bit line pairs (or second sub-groups) of the first bit line groups of a left adjacent sub-array (not shown) via corresponding column selection switches 32L and corresponding sense amplifiers. In the same manner, the first I/O line pairs and the second I/O line pairs of the second I/O bus 26R are respectively connected with odd numbered bit line pairs (or first sub-groups) and even numbered bit line pairs (or second sub-groups) of the second bit line groups of a right adjacent sub-array (not shown) via corresponding column selection switches 32R and corresponding sense amplifiers. Thus, since bit line pairs of the respective sub-arrays are divided in the same manner as the first and second bit line groups of the sub-array 22 as shown in FIG. 2, I/O buses associated with the first bit line groups are alternately arranged with I/O buses associated with the second bit line groups. That is, each of first I/O buses positioned at odd locations is associated with the first bit line groups in two sub-arrays adjacent thereto while each of second I/O buses positioned at even locations is associated with the second bit line groups in two sub-arrays adjacent thereto. Regarding to the respective ones of the sub-arrays of FIG. 1, the connection relationship with the first and second I/O line pairs of the first and second I/O buses will be incorporated by the explanation made in connection with FIG. 2. The sense amplifier 32L and 32R may be of a known circuit which is composed of a P-channel sense amplifier, transfer transistors for isolation, an N-channel sense amplifier and an equalizing and precharging circuit. Thus, I/O buses 26 between adjacent two sub-arrays are common I/O buses for reading or writing data from/to the sub-array which is selected by the control of the isolation transfer transistors.

Returning to FIG. 1, in each bank, at the upper portion of the first and the third memory cell arrays 20TL and 20TR are respectively located I/O line selection and precharge circuits 38TL and 38TR and I/O sense amplifiers and line drivers 40TL and 40TR correspondingly connected, thereto, and likewise, at the lower portion of the second and the fourth memory cell arrays 20BL and 20BR are respectively located I/O line selection and precharge circuits 38BL and 38BR and I/O sense amplifiers and line drivers 40BL and 40BR correspondingly connected thereto. I/O line selection and precharge circuits 38TL, 38TR, 38BL and 38BR are respectively connected to alternating I/O buses 26 in corresponding memory cell arrays 20TL, 20TR, 20BL and 20BR. That is, I/O line selection and precharge circuits positioned at odd locations are respectively connected with I/O bus pairs of I/O buses disposed at odd locations in corresponding memory cell arrays, and I/O line selection and precharge circuits positioned at even locations are respectively connected with I/O bus pairs of even located I/O buses in corresponding memory cell arrays. Therefore, in each bank, each of circuits at the outer most side of the I/O line selection and precharge circuits may access data to/from memory cells which are connected with first bit line groups in three sub-arrays, and odd positioned I/O line selection and precharge circuits and even positioned I/O line selection and precharge circuits, which are excluding the outer most I/O line selection and precharge circuits, are respectively associated with the first bit line groups and the second bit line groups. Each I/O line selection and precharge circuit 38 comprises an I/O bus selection circuit for selecting one of a pair of I/O buses connected thereto and an I/O line precharge circuit for precharging, when any one of first I/O line pairs I/O0, $\overline{I/O0}$ and I/O1, $\overline{I/O1}$ and second I/O line pairs I/O2, $\overline{I/O2}$ and I/O3, $\overline{I/O3}$ which constitute the selected I/O bus is transferring data, the other I/O line pairs.

I/o line selection and precharge circuits 38 are respectively connected to corresponding I/O sense amplifiers and line drivers 40 via PIO buses 44. Each PIO bus 44 is connected with an I/O bus selected by corresponding I/O bus selection circuit. Thus, PIO buses 44 comprise four pairs of PIO lines like I/O buses 26. Each I/O sense amplifier and line driver 40 comprises an I/O sense amplifier for amplifying data inputting via corresponding I/O bus selection circuit and PIO bus in a read operation, and a line driver for driving to an I/O bus selected by the I/O bus selection circuit data inputting via corresponding I/O bus selection circuit and PIO bus in a write operation. Thus, as discussed above, if data on any ones of the first and the second I/O line pairs inputs to the sense amplifier via corresponding PIO line pairs, PIO line pairs connected to the other I/O line pairs are precharged together with the I/O line pairs. Also, in the writing operation, when the driver 40 drives data to corresponding I/O line pairs via selected PIO line pairs, unselected PIO line pairs and their corresponding I/O line pairs start precharging.

At the upper most and the lower most ends of the synchronous DRAM chip, upper data buses 42T and lower data buses 42B are respectively running in parallel with the horizontal direction. Each of upper data buses 42T and lower data buses 42B consist of four data buses, each of which comprises four pairs of data lines which are the same number as above mentioned I/O bus and PIO bus. One side ends of four data buses DB0-DB3 constituting upper data buses 42T and four data buses DB4-DB7 constituting lower data buses are respectively connected to data input/output multiplexers 46 coupled to input/output pads (not shown in the drawing) via input/output lines 47 and data input/output buffers 48.

In each bank, I/O sense amplifiers and line drivers 40TL associated with the first memory cell array 20TL are alternately connected to first and second data buses DB0 and DB1, and I/O sense amplifiers and line drivers 40TR associated with the third memory cell array 20TR are interleavely connected to third and fourth data buses DB2 and DB3. Likewise, I/O sense amplifiers and line drivers 40BL associated with the second memory cell array 20BL are interleavely connected to fifth and sixth data buses DB 4 and DB5, and I/O sense amplifiers and line drivers 40BR associated with the fourth memory cell array 20BR are interleavely connected to seventh and eighth data buses. Center I/O sense amplifiers and line drivers 43T and 43B are respectively connected to I/O buses between the first memory cell array 20TL and the third memory cell array 20TR and between the second memory cell array 20BL and the fourth memory cell array 20BR in each bank. In each bank, center I/O sense amplifier and line driver 43T at the upper portion comprises an I/O sense amplifier for amplifying data on corresponding I/O bus to couple to the data bus DB1 or DB3 in response to a control signal in a write operation. Likely, center I/O sense amplifier and line driver 43 at the lower portion is connected to the fourth and the eighth data buses DB5 and DB7.

Now, assuming that sub-arrays 22TL3, 22BL3, 22TR3 and 22BR3 in the first bank 12 and one word line in their respective sub-arrays would be selected by the row decoder 18 responded by a row address, the row decoder 18 provides block information signals designating respective sub-arrays 22TL3, 22BL3, 22TR3 and 22BR3. Then, in a read operation, a control circuit, as will be discussed hereinbelow, generates sequential column addresses in response to an external column address and the column decoder 24 generates sequential column selection signals in response to this column address stream. Assuming that the first column selection signal is to select a column selection line L0, corresponding column selection switch 34 shown in FIG. 2 is turned on and data developed on corresponding bit line pairs is transferred to first I/O line pairs I/O0, $\overline{I/O0}$ and I/O1, $\overline{I/O1}$ of left and right I/O buses arranged at both ends of the respective selected sub-arrays. I/O line selection and precharge circuits 38TL, 38BL, 38TR and 38BR respond to the block information signals, and I/O line selection and precharge circuits associated with the selected sub-arrays 22TL3, 22B13, 22TR3 and 22BR3 thereby select the left and the right I/O buses associated therewith. Data on the first I/O line pairs in the left and the right I/O buses is transferred to corresponding data line pairs in corresponding data buses DB0-DB7 via corresponding PIO line pairs and corresponding sense amplifiers turned on by a control signal which is generated in response to the block information signals. However, at this time, I/O line pairs not transferring data, i.e., the second I/O line pairs and PIO line pairs connected thereto are all held in a precharging state by the I/O precharge circuits. Also, data line pairs not transferring data are being precharged by data input/output multiplexers 46 as will be explained hereinbelow. Then, if by the second column selection signal CSL1 on the column line L1 of the column address stream are turned on corresponding column selection switches, in the same manner as preciously discussed, data on corresponding bit lies is transferred via the second I/O line pairs in the left and the right I/O buses and corresponding PIO line pairs to data line pairs, whereas the first I/O line pairs, PIO line pairs and data line pairs connected thereto are precharged to transfer data from now on. If column selection signals CSL2 to CSL255 on column lines L2 to L255 following the column selection signal CSL1 on the column line L1 are sequentially received, the same operations as data transfer operations in case of the column selection signals CSL0 and CSL1 are performed repetitively. Thus, all data on bit line pairs which is developed from all memory cells coupled to selected word lines can be read out. That is, full page read-out is available. In the read operation, the first I/O line pairs and the second I/O line pairs transfer a plurality of data, alternating data transfer and precharge, and the first and the second data line pairs associated with the first and the second I/O line pairs, also, repeat data transfer and precharge periodically. The data output multiplexer connected to each data bus not only stores a plurality of data transferred in parallel via any one of the first and the second data line pairs, but also precharges the other data line pairs. Thus, each data output multiplexer provides continuous serial data in response to data selection signals, prefetching a plurality of data on the first and the second data line pairs with a predetermined period. The serial data outputs via corresponding data output buffer to data input/output pads in synchronism with a system clock. Therefore, 8-bit parallel data continuously outputs every clock cycle thereof.

Write operation is performed in the inverse order of the read operation as discussed above. As will be explained in brief, serial input data outputs in synchronism with the system clock from data input buffers via data interleavely pads. The serial data from the data input buffers is interleavely transferred to the first and the second data line pairs of corresponding data buses in a plurality of parallel data every clock cycles of the system clock by means of respective data input demultiplexers. Data on the first and the second data line pairs is sequentially written into selected memory cells via corresponding line drivers, I/O buses selected by the I/O line selection circuits and corresponding bit line pairs. Data transfer and precharge of the first and the second line pairs are alternately effected every clock cycles in the same manner as those in the read operation.

Between the first and the second banks is arranged the control circuit 50 for controlling operations of the synchronous DRAM according to the present invention. The control circuit 50 serves to generate control clocks or signals for controlling the row and the column decoders 18 and 24, I/O line selection and precharge circuits 38, I/O sense amplifiers and line drivers 40 and 43, data input/output multiplexers 46 and data input/output buffers 48. The control circuit 50 may be classified into a row control circuit and a column control circuit. The row control circuit, the data path and the column control circuit will be separately discussed hereinbelow.

ROW CONTROL CIRCUIT

Conventional DRAMs are activated to perform the operation of read, write or the like by a logic level of $\overline{RAS}$, for example, a low level. This will be referred to as a level $\overline{RAS}$. The level $\overline{RAS}$ gives a certain information, for example, such information as the transition of $\overline{RAS}$ from high to low level indicates the activation thereof and the transition of $\overline{RAS}$ from low to high level indicates precharging. However, since the synchronous DRAM has to operate in synchronism with the system clock, above-mentioned commands using in the conventional DRAM cannot be employed in the synchronous DRAM. That is, since the synchronous DRAM needs to sample a command information at the leading edge or the falling edge of the system clock (sampling the command information in this embodiment is accomplished at the leading edge thereof), even if the level $\overline{RAS}$ is applied in the synchronous DRAM, commands of the conventional level $\overline{RAS}$ cannot be used therein.

Figure 5A:
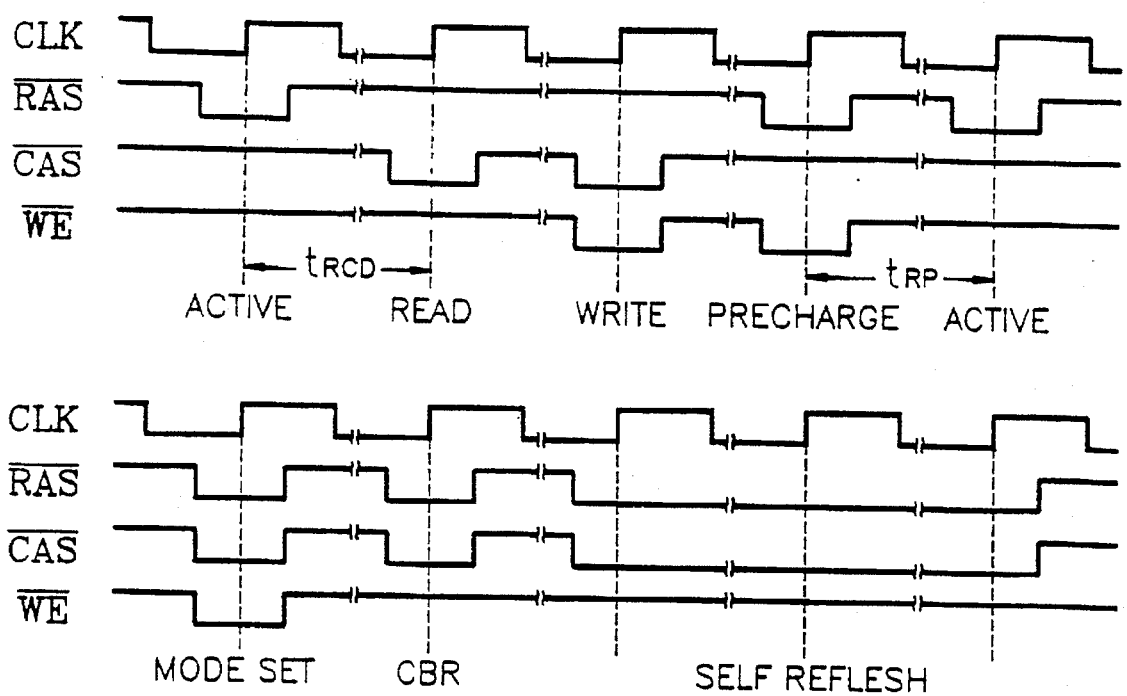
FIG. 5a and FIG. 5b are diagrams showing various commands used in operations of a pulse $\overline{RAS}$ and a level $\overline{RAS}$, respectively.
Figure 5B:
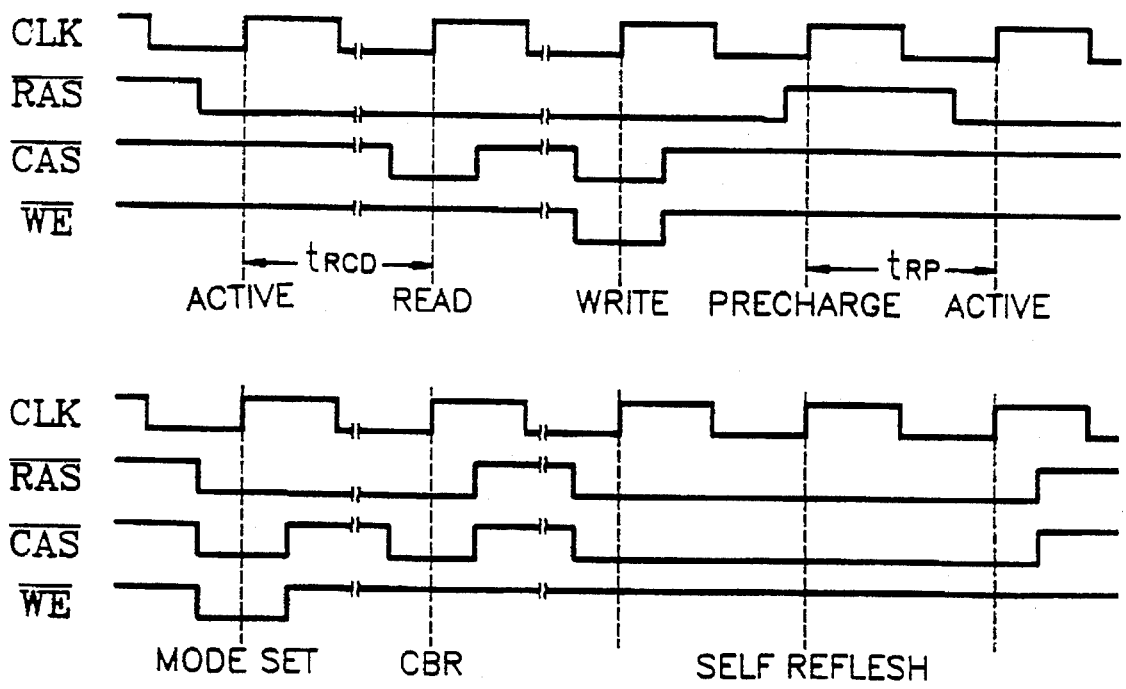

FIG. 5a and FIG. 5b are timing diagrams representative of commands used in the synchronous DRAM of the present invention. FIG. 5a represents various commands in case that $\overline{RAS}$ signal of pulse (hereinafter referred to as a pulse $\overline{RAS}$) is used, and FIG. 5b various commands in case of the use of level $\overline{RAS}$. As can be seen in the drawings, when $\overline{RAS}$ is low and $\overline{CAS}$ signal and write enable signal $\overline{WE}$ are high at the leading edge of the system clock CLK, this means an activation. After the activation, at the leading edge of the system clock, the high level $\overline{RAS}$, the low level $\overline{CAS}$ and the high level $\overline{WE}$ indicate a read command. Also, after activation, at the leading edge of the system clock CLK, the high level $\overline{RAS}$, the low level $\overline{CAS}$ and low level $\overline{WE}$ represent a write command. When the low level $\overline{RAS}$, the high level $\overline{CAS}$ CAS and the low level $\overline{WE}$ have been sampled at the leading edge of the clock CLK, a precharging operation is performed. An establishment of operation mode set command according to the feature of the present invention is accomplished at low levels of $\overline{RAS}$, $\overline{CAS}$ and $\overline{WE}$ at the leading edge of the clock CLK. A $\overline{CAS}$-before-$\overline{RAS}$ (CBR) refresh command inputs when $\overline{RAS}$ and $\overline{CAS}$ hold at low levels and $\overline{WE}$ holds at a high level at the leading edge of the clock CLK. A self refresh command, which is a variation of the CBR refresh, inputs when $\overline{RAS}$ and $\overline{CAS}$ line at low levels and $\overline{WE}$ stays at a high level at successive three leading edges of the clock CLK.

In the same manner as conventional DRAM, the synchronous DRAM, also, inherently has the time period from the activation of $\overline{RAS}$ until the activation of $\overline{CAS}$, i.e. $\overline{RAS}$-$\overline{CAS}$ delay time $t_{RCD}$ and the precharging time period prior to the activation of $\overline{RAS}$, i.e. $\overline{RAS}$ precharge time $t_{RP}$. To guarantee the read-out and the write-in of valid data, minimum values of tRCD and $t_{RP}$ (respectively 20 ns and 30 ns in the synchronous DRAM of the present invention) are very important to memory system designers. To promote the convenience for system designers, it may be more preferred that the minimum values of $t_{RCD}$ and $t_{RP}$ are provided in the number of system clock cycle. For example, in case that the system clock frequency is 100 MHZ and the minimum values of $t_{RCD}$ and $t_{RP}$ are respectively 20 ns and 30 ns, clock cycles of $t_{RCD}$ and $t_{RP}$ respectively become 2 and 3. The row control circuit is means for generating signals or clocks for selecting word lines during the time period of $t_{RCD}$, developing to bit lines information data from memory cells in a read operation and precharging during the time period of $t_{RP}$.

Figure 3:
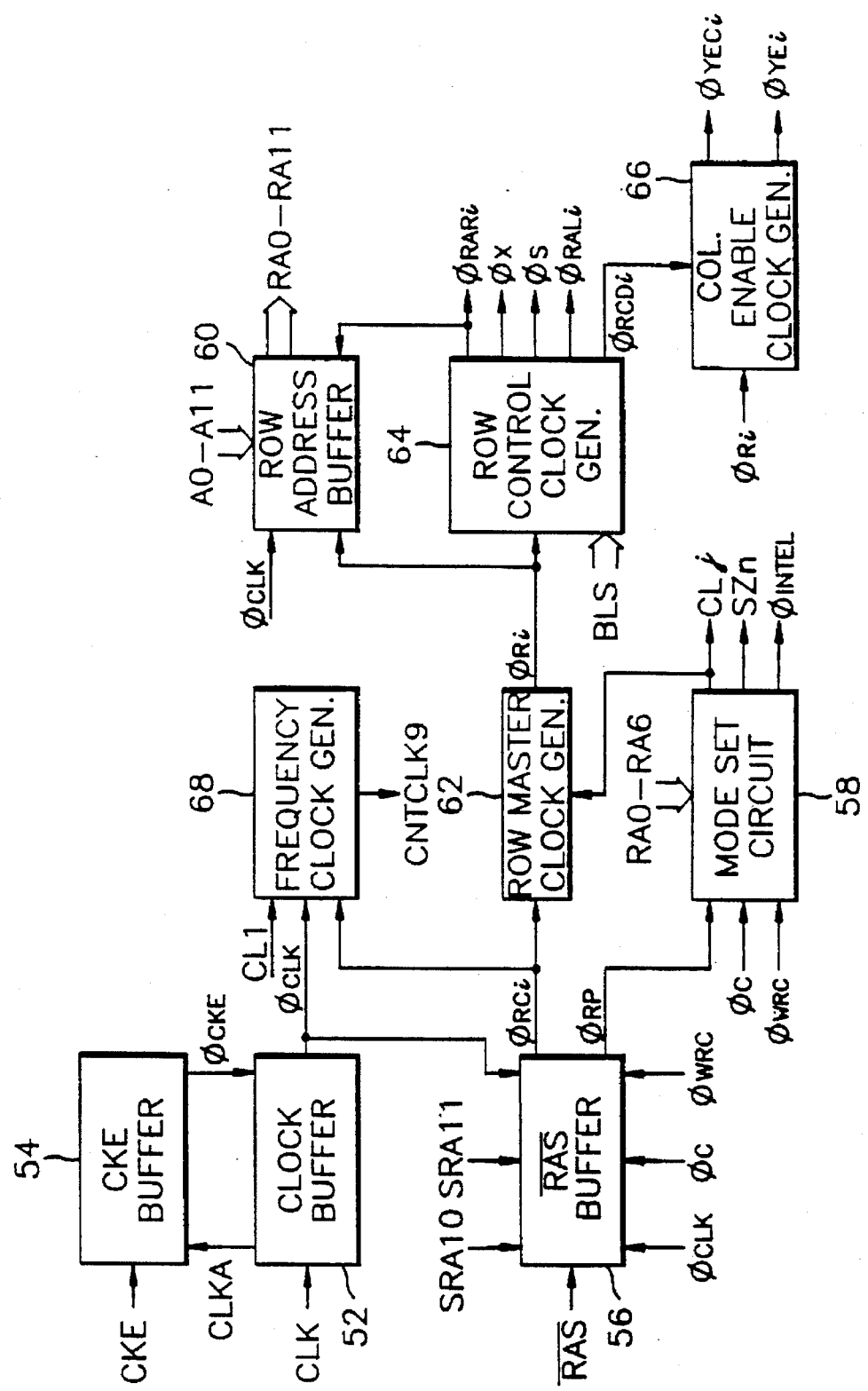
FIG. 3 is a schematic block diagram showing a row control circuit according to the present invention.

FIG. 3 is a diagram representing a schematic block diagram for generating row control clocks or signals. Referring to the drawing, a clock buffer (hereinafter referred to a CLK buffer) 52 is a buffer for converting into an internal system clock $\phi_{CLK}$ of CMOS level in response to an external system clock CLK of TTL level. The synchronous DRAM executes various internal operations which are sampling signals from the external chip or data to the external chip at the leading edge of the clock CLK. The CLK buffer 52 generates a clock CLK faster than the phase of the clock CLK in response to CLK.

A clock enable (CKE) buffer 54 is a circuit for generating a clock masking signal $\phi_{CKE}$ in order to make the generation of the clock $\phi_{CKE}$ in response to an external clock enable signal CKE and the clock CLK. As will be discussed hereinbelow, the internal system clock $\phi_{CKE}$ disabled by the signal $\phi_{CKE}$ causes the internal operation of the chip to be frozen and input and output of data is thereby blocked.

$\overline{RAS}$ buffer 56 receives the external signal $\overline{RAS}$, address signals SRA10 and SRA11, a signal $\phi_C$ from a $\overline{CAS}$ buffer and a signal $\phi_{WRC}$ from a $\overline{WE}$ buffer, thereby generating $\overline{RAS}$ clock $\phi_{RCI}$ for selectively activating bands in synchronous with the clock $\phi_{CLK}$, selectively or totally precharging the banks and automatically precharging after refreshing or operation mode programming. Wherein i is a symbol for representing bank. Also, the $\overline{RAS}$ buffer 56 generates signal $\phi_{RP}$ which represents the activation of $\overline{RAS}$ with the clock $\phi_{CKE}$.

An operation mode set circuit 58 is responsive to the operation mode set command, signals $\phi_{RP}$, $\phi_C$ and $\phi_{WRC}$ and address signals RA0–RA6f so as to set various operation modes, for example, operation modes for establishing a $\overline{CAS}$ latency, a burst length representing the number of continuous output data and an address mode $\phi_{INTEL}$ representing a scrambling way of internal column address. The operation mode set circuit 58 sets a default operation mode in which predetermined $\overline{CAS}$ latency, burst length and address mode are automatically selected upon the absence of the operation mode set command.

A row master clock generator 62 is responsive to the control signal $\phi_{RCI}$ and a latency signal CLj and generates a row master clock $\phi_{Ri}$ which is based on the generation of clocks or signals associated with $\overline{RAS}$ chain in a selected bank. According to the characteristics of the present invention, the row master clock $\phi_{Ri}$ has time a delay depending on a designated $\overline{CAS}$ latency and such a time delay guarantees 2-bit data output synchronous to the system clock after the precharge command.

A row address buffer 60 receives the row master clock $\phi_{Ri}$, external address signals A0–A11 and a row address reset signal $\phi_{RARi}$ to generate row address signals RA0–RA11 in synchronism with the clock $\phi_{CLK}$. The buffer 60 receive a count signal from a refresh counter in a refresh operation to provide row address signals RA0–RA11 for refreshing.

A row control signal generator 64 receives the row master clock $\phi_{Ri}$ and a block information signal BLS from the row decoder 18 to generate a boosted word line driving signal $\phi_x$, a sensing start signal $\phi_s$ for activating the selected sense amplifier, a row address reset signal $\phi_{RARi}$ for resetting the column address buffer, a signal $\phi_{RARi}$ for powering on the row address buffer 60 and a signal $\phi_{RCDi}$ for informing the completion of clocks or signals associated with rows.

A column enable clock generator 66 receives the signal $\phi_{RCDi}$ and the row master clock $\phi_{Ri}$ to generate signals $\phi_{YECi}$ and $\phi_{YEi}$ for enabling column related circuits.

A high frequency clock generator 68 generates, in case that the frequency of the external system clock CLK is low and the 2-bit data output is also required in a read operation after a precharge command, a clock CNTCLK9 with a higher frequency than the clock CLK to prevent the reduction of precharge period. As will be discussed hereinbelow, since the column address generator generates column addresses with the clock CNTCLK9, the reduction of precharge period is prevented.

Hereinbelow, explanation will be made in detail on preferred embodiments of elements constituting the $\overline{RAS}$ chain clock generator.

1. CLK Buffer & CKE Buffer

Figure 6:
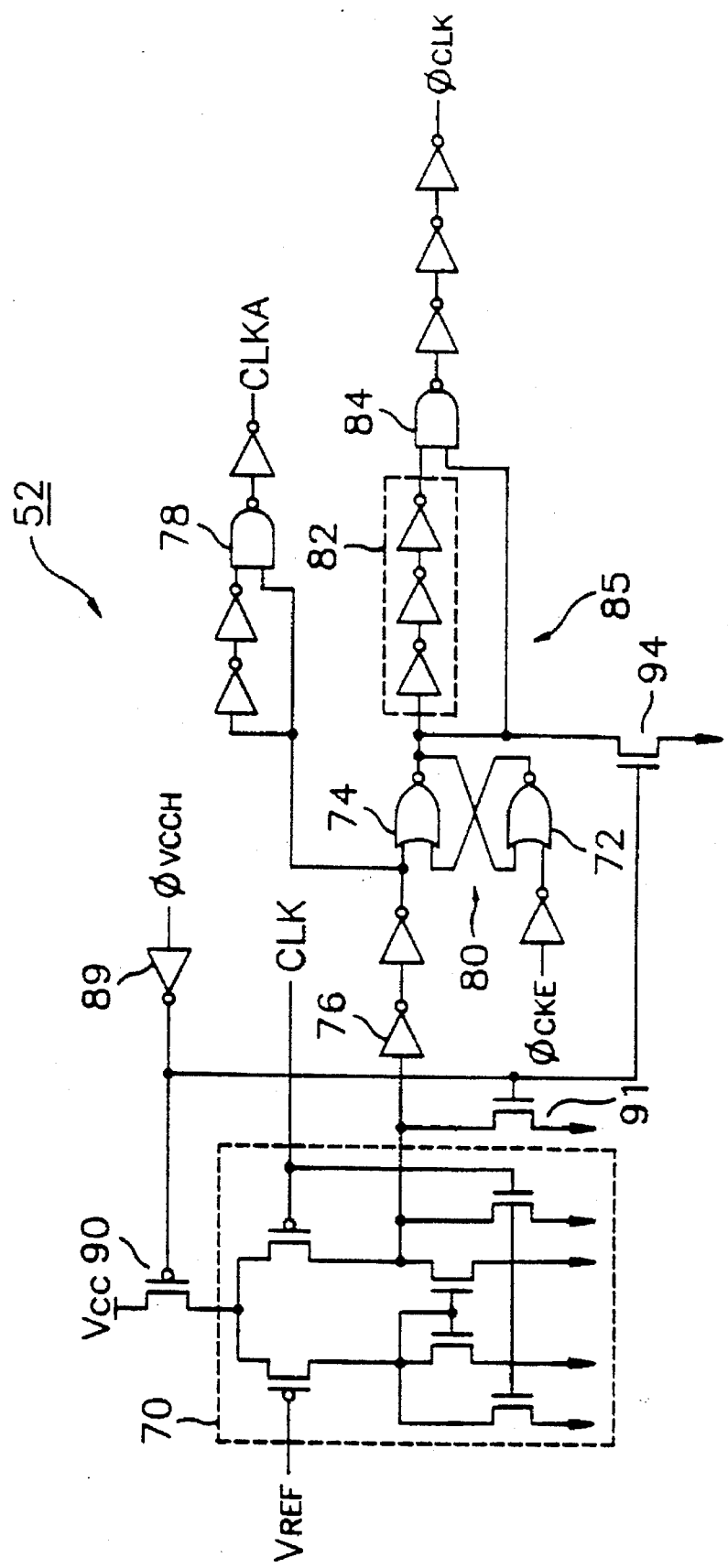
FIG. 6 is a schematic circuit diagram showing a clock (CLK) buffer according to the present invention.
Figure 7:
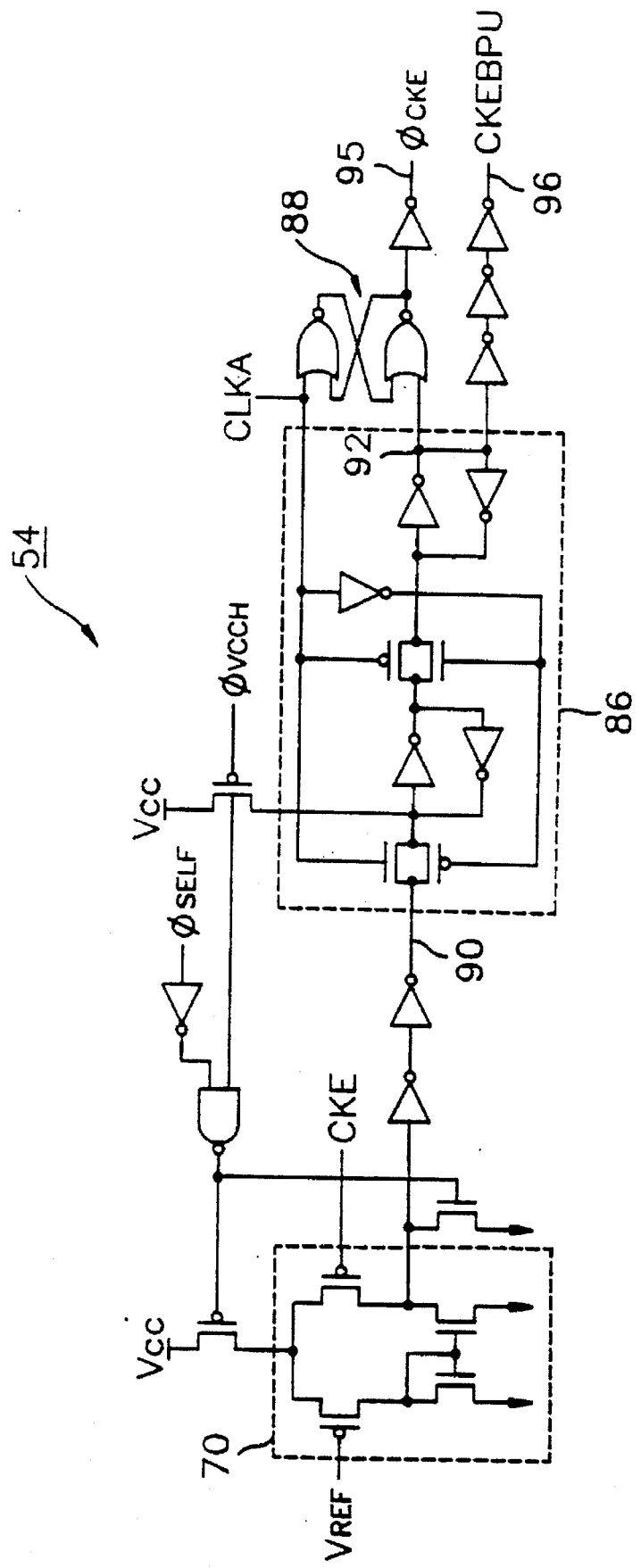
FIG. 7 is a schematic circuit diagram showing a clock enable (CKE) buffer according to the present invention.
Figure 8:
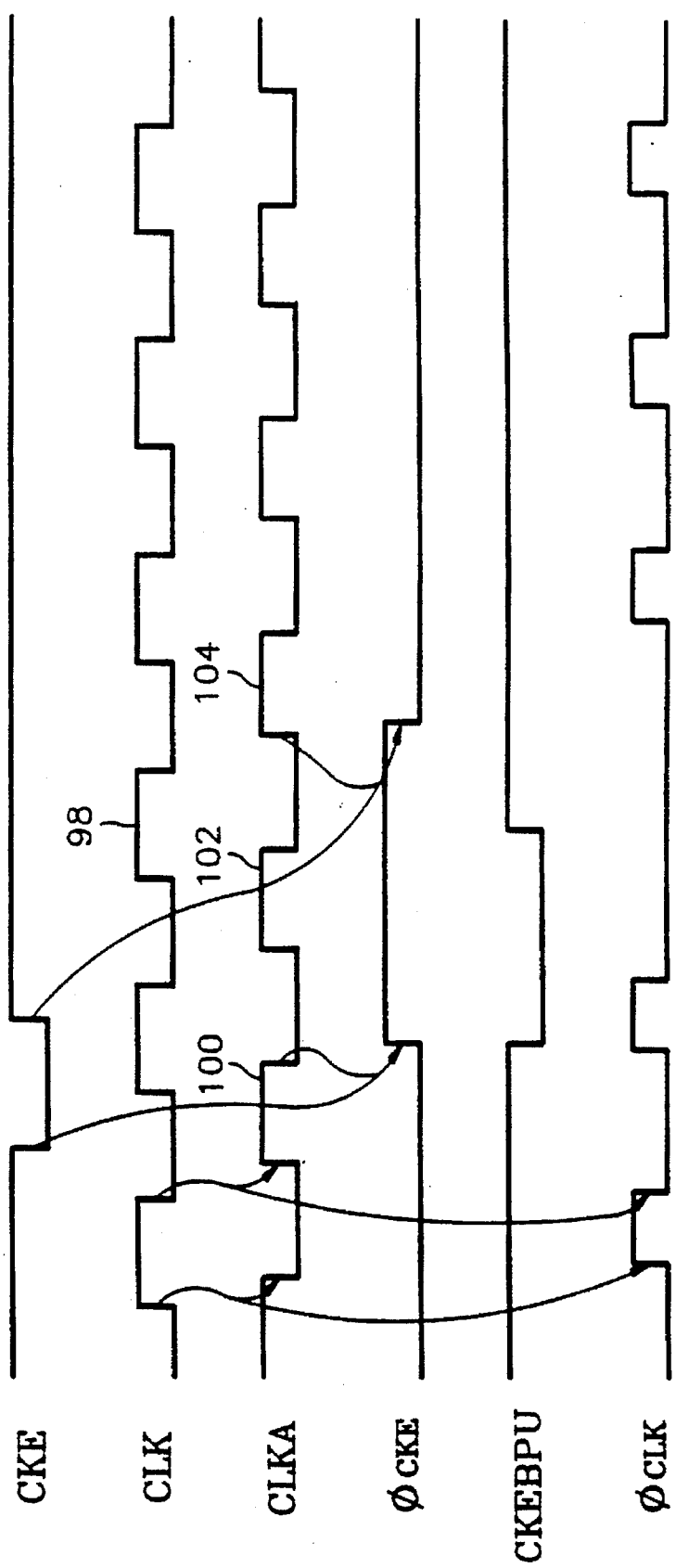
FIG. 8 is an operation timing diagram for the CLK buffer and the CKE buffer respectively showing in FIG. 6 and FIG. 7.

FIG. 6 is a diagram representing a schematic circuit diagram for the CLK buffer 52 according to the present invention, and FIG. 7 is a schematic circuit diagram for CKE buffer 54 according to the present invention. FIG. 8 depicts an operation timing diagram for the CLK buffer 52 and the CKE buffer 54.

Referring to FIG. 6, a differential amplifier 70 compares the external system clock CLK with a reference potential $V_{REF}$ (=1.8 volts) and thereby converts the external signal CLK of TTL level into an internal signal of CMOS level, for example, a high level of 3 volts or a low level of 0 volt. Instead of the differential amplifier 70, another input buffers can be used which can level shift from the TTL to the CMOS signal. As can be seen in FIG. 8, the clock CLKA is of the signal inverted to the system clock CLK via the input buffer 70, such as the differential amplifier, and gates, i.e., inverters 76 and NAND gate 78. A flip-flop or a latch 80 which is composed of NOR gates 72 and 74 outputs a system clock of CMOS level when a clock masking signal $\phi_{CKE}$ is low. The output clock from the flip-flop 80 is supplied to a pulse width adjusting circuit 85 which is composed of a delay circuit 82 and a NAND gate 84. Although the delay circuit 82 illustrates only inverters for the purpose of simplicity, a circuit comprising inverter and capacitor or other delay circuits may be used. Thus, when the signal $\phi_{CKE}$ is low, the internal system clock $\phi_{CKE}$ as shown in FIG. 8 outputs from the CLK buffer. However, when the signal $\phi_{CKE}$ is high, the output of the flip-flop 80 becomes low thereby to stop the generation of the clock $\phi_{CKE}$. In FIG. 6, inverter 89, p-channel MOS transistor 90 and n-channel MOS transistors 91 and 94 are elements for providing an initial condition to proper nodes in response to a power-on (or power-up) signal $\phi_{VCCH}$ from a known power-on circuit. The power-on signal $\phi_{VCCH}$ maintains a low level until the power supply voltage Vcc reaches a sufficient level after the application of the supply voltage.

Referring to FIG. 7, input buffer 70 converts the external clock enable signal CKE into a CMOS level signal. To prevent power consumption, operation of the input buffer 70 is inhibited by a self-refresh operation. The input buffer 70 provides an inverted CMOS level signal of the signal CKE on a line 90. The inverted CKE signal is coupled to a shift register 86 for shifting with an inverted clock CLKA of the clock CLK. The output of the shift register 86 is coupled to the output terminal of the signal $\phi_{CKE}$ via a flip-flop 88 of NOR type and an inverter. The output terminal of the shift register 86 is coupled to the output terminal of a signal CKEBPU via inverters.

The clock enable signal CKE is of inhibiting the generation of the system clock $\phi_{CLK}$ with a low level of CKE, thereby to freeze the internal operation of the chip. Referring again to FIG. 8, illustration is made on the signal CKE with a low level pulse for masking the CLK clock 98. By the low level of CKE, the input line 90 of the shift register 86 maintains a high level. After a CLKA clock 100 goes to a low level, the output of the shift register 86 goes to a high level. Thus, $\phi_{CKE}$ and CKEBPU become a high level and a low level, respectively. Then, after a next CLKA clock 102 goes to a low level, the output of the shift register 86 changes to a low level, thereby causing the signal CKEBPU to go high. At this time, since the output of the flip-flop 88 is keeping a low level, $\phi_{CKE}$ maintains a high level. However, after a next CLKA clock 104 goes to a high level, $\phi_{CKE}$ goes to a low level. Thus, as discussed with FIG. 6, $\phi_{CLK}$ clock corresponding to the clock 98 is masked with the high level of $\phi_{CKE}$.

Since the internal operation of the synchronous DRAM operates in synchronism with the clock $\phi_{CLK}$, the masking of $\phi_{CLK}$ causes the internal operation to be in a standby state. Thus, to prevent power consumption in the standby state, the signal CKEBPU is used to disable input buffers synchronous to $\phi_{CLK}$. Accordingly, it should be appreciated that the signal CKE needs to be applied prior to at least one cycle of the masked clock CLK in order to mask it and has to hold a high level in order to carry out a normal operation.

2. $\overline{RAS}$ Buffer

The synchronous DRAM includes two memory banks 12 and 14 on the same chip to achieve a high speed data transfer rate. To achieve a high performance of the synchronous DRAM, control circuits need which is selectively controlling various operations for each bank. Accordingly, the $\overline{RAS}$ buffer is an input buffer combined with multifunctions according to a feature of the present invention.

Figure 9:
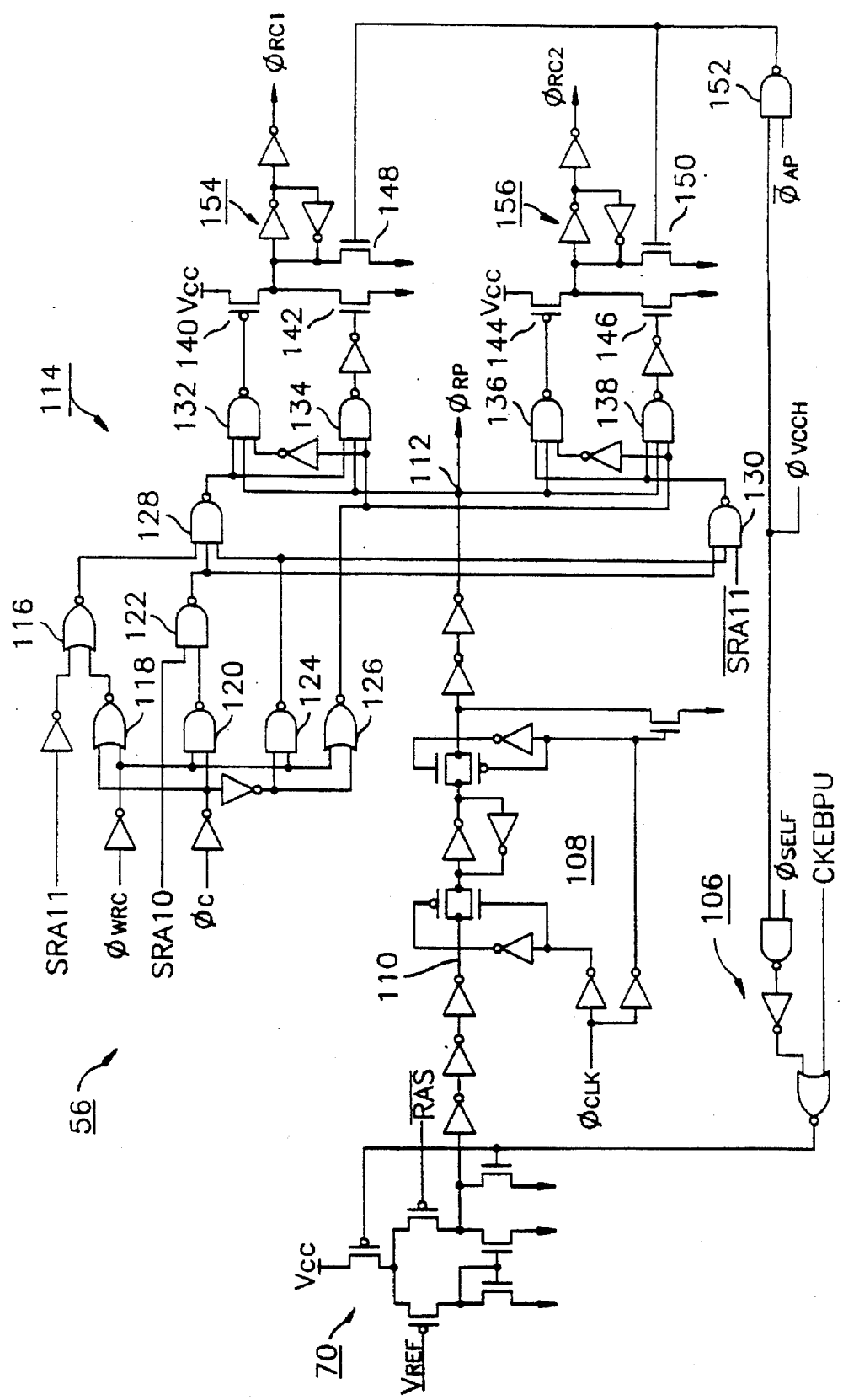
FIG. 9 is a schematic circuit diagram showing a multifunction pulse $\overline{RAS}$ input buffer according to the present invention.

FIG. 9 is a schematic circuit diagram showing the multifunction pulse $\overline{RAS}$ input buffer according to the present invention. Referring to FIG. 9, in the same manner as above discussed input buffers, input buffer 70 converts an external row address strobe signal $\overline{RAS}$ into an internal CMOS level signal. The input buffer 70 is disabled by a gate circuit 106 for gating system clock masking, self-refresh and power-on signals CKEBPU, $\phi_{VCCH}$ and $\phi_{SELF}$. The CMOS level signal from the input buffer 70 is supplied to an input terminal 110 of a synchronization circuit 108 for providing to an output terminal 112 the $\overline{RAS}$ pulse $\phi_{RP}$ which synchronizes the CMOS level signal to the internal system clock $\phi_{CLK}$. Thus, as shown in FIG. 10, at times $t_1$ and $t_3$, $\overline{RAS}$ being at low levels generates a $\overline{RAS}$ pulse $\phi_{RP}$ with high levels after a predetermined delay at the output terminal 112.

In FIG. 9, the remaining circuit excluding the input buffer 70, the synchronization circuit 109 and the gate circuit 106 is a multifunction control circuit 114 combined therewith to control the respective banks. Since n-channel transistors 148 and 150 are all turned on by $\phi_{VCCH}$ being at a low level during the power-on operation, the first $\overline{RAS}$ clock $\phi_{RC1}$ for the first bank 12 and the second $\overline{RAS}$ clock $\phi_{RC2}$ for the second bank 14 are all latched in initial conditions, i.e., low levels by means of latches 154 and 156.

Figure 10:
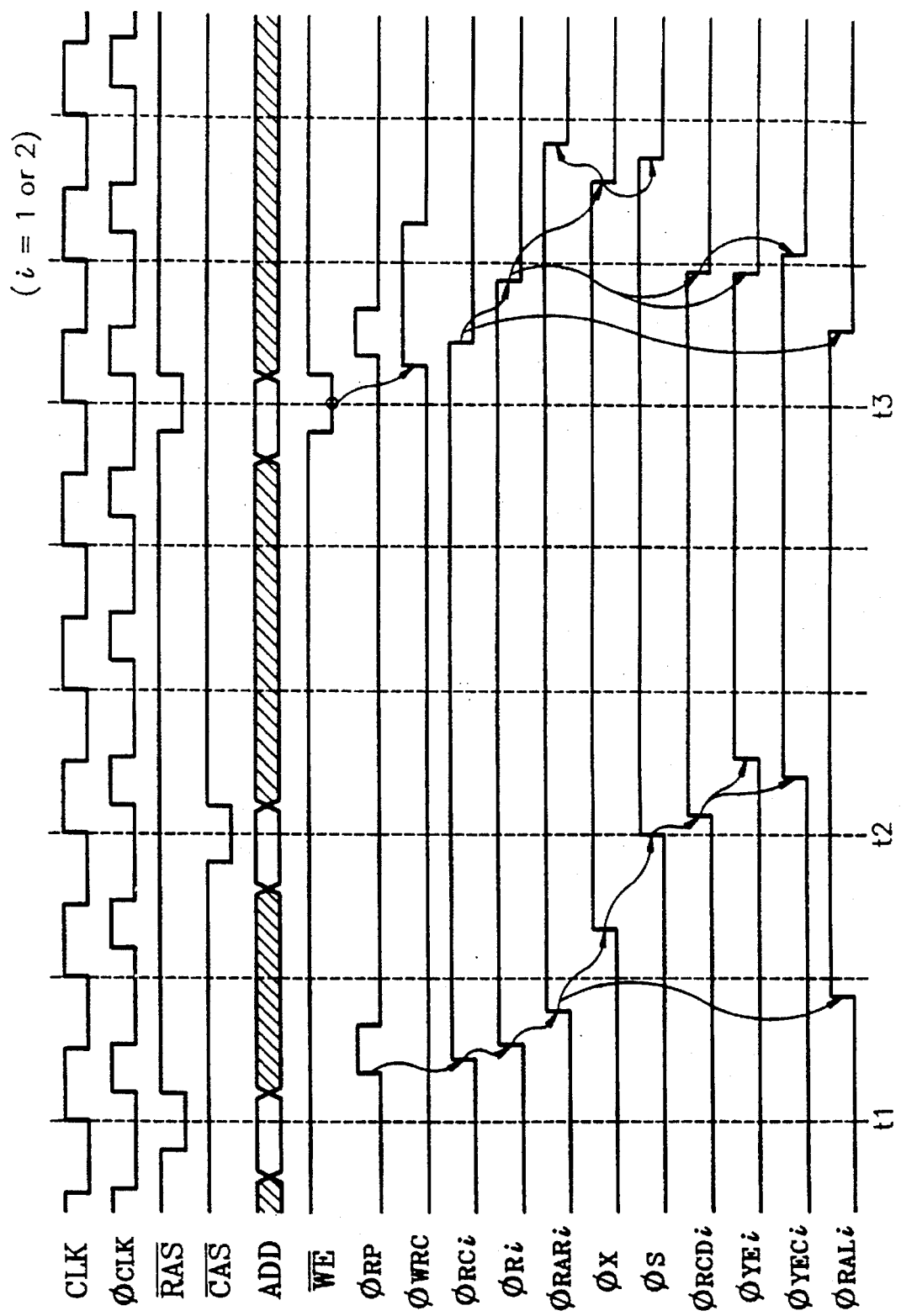
FIG. 10 is a timing diagram for column control signals or clocks used in the present invention.

To activate the first bank 12 and at the same time, to inactivate the second bank 14, at a time $t_1$ as shown in FIG. 10, external address signal ADD with address $A_{11}$ being at a low level is supplied to the chip. Then, an address buffer, as will be discussed hereinbelow, generates an address signal SRA11 of a low level ($\overline{SRA11}$ of a high level) with the address signal ADD. On the other hand, at the time $t_1$, since both $\overline{CAS}$ and $\overline{WE}$ keep high levels, $\phi_C$ and $\phi_{WRC}$ hold low levels as will be discussed hereinbelow. Thus, NOR gates 116 and 126 output low levels and NAND gates 122 and 124 output high levels. Then, NAND gates 128 and 130 output a high level and a low level, respectively. When the pulse $\phi_{RP}$ goes to a high level, NAND gate 132 goes to a low level and NAND gates 134 to 138 go to high levels. Then, p-channel transistor 140 is turned on and p-channel transistor 144 and n-channel transistors 142 and 146 keep off states. Thus, latch 54 stores a low level. On the other hand, when $\phi_{RP}$ goes to a low level, all of NAND gates 132 to 138 go to high levels, thereby turning off transistors 140 to 146. As a result, the first $\overline{RAS}$ clock $\phi_{RC2}$ maintains a low level by means of the latch 156 which had been initially storing the high level. Thus, the first bank 12 is activated by the clock $\phi_{RC1}$, thereby performing a normal operation such as a read or a write operation. However, the second bank 14 is not activated by the low level clock $\phi_{RC2}$.

On the other hand, to access the synchronous DRAM at a high transfer rate, the second bank can be activated during the activation of the first bank. It can be accomplished by activating the second bank, applying the address $A_{11}$ being at a high level after the activation of the first bank. Then, the address signal SRA11 becomes a high level ($\overline{SRA11}$ becomes a low level). In the same manner as discussed above, NAND gate 136 outputs a low level and all of NAND gates 132, 134 and 138 output high levels. Thus, $\phi_{RC1}$ is maintaining the previous state, i.e., the high level and $\phi_{RC2}$ goes to a high level. As a result, all of the first and the second banks stay in activation states.

During the read or the write operation of the second banks, the first bank may also be precharged. When or before the precharge command is issued at time $t_3$ as shown in FIG. 10, external address signal $A_{10}$ and $A_{11}$, which are all low levels, are applied to corresponding address pins of the chip. Then, address signals SRA10 and SRA11 become low levels ($\overline{SRA11}$ becomes a high level). After the command, $\phi_{RP}$ and $\phi_{WRC}$ go to high levels and $\phi_C$ is at a low level. Consequently, when $\phi_{RP}$ goes high, NAND gate 134 goes to a low level and all of NAND gates 132, 136 and 138 maintain high levels. Thus, the transistor 142 is turned on an transistors 140, 144 and 146 maintain off states. The latch 154 stores a high level and $\phi_{RC1}$ becomes a low level. However, $\phi_{RC2}$ maintains the previous state of the high level by means of the latch 156. As a result, $\phi_{RC1}$ of the low level causes the first bank to be precharged during performing data access from the second bank 14. Likewise, a precharge operation of the second bank may be accomplished by applying the precharge command, address signal $A_{10}$ being at a low level and address signal $A_{11}$ being at a high level.

On the other hand, a simultaneous precharge operation of both the first and the second bank 12 and 14 may be accomplished by applying the precharge command and an address $A_{10}$ being at a high irrespective of a logic level of the address $A_{11}$. Then, in the same manner as discussed above, NAND gates 134 and 138 output low levels and NAND gates 132 and 136 output high levels. Thus, transistors 142 and 146 are turned on and transistors 140 and 144 maintain off states. As a result, latches 154 and 156 store precharge information being at high levels, respectively and both $\phi_{RC1}$ and $\phi_{RC2}$ become low levels.

A CBR refresh command is issued by $\overline{RAS}$ being at the low level and $\overline{CAS}$ being at the high level as shown in FIG. 5a. Thus, the high level signal $\phi_C$ and the low level signal $\phi_{WRC}$ input to the multifunction control circuit 114. In this case, NAND gate 124 and NOR gate 126 output low levels irrespective of logic levels of the address $A_{10}$ and $A_{11}$. Consequently, NAND gates 132 and 136 output low levels and NAND gates 134 and 138 output high levels. Thus, transistors 140 and 144 are turned on and transistors 142 and 146 are turned off. Then, $\phi_{RC1}$ and $\phi_{RC2}$ become high levels and both banks thereby perform the CBR refresh operation. On the other hand, a selective CBR refresh operation for both banks can be accomplished by grounding one of two input terminals of NAND gate 124. Then, in the same manner as discussed above, $\phi_{RC1}$ and $\phi_{RC2}$ can be selectively enabled according to a logic state of the address $A_{11}$. That is, a low level address $A_{11}$ under the CBR refresh command causes only the first bank to be refreshed.

3. Row Address Buffer

Figure 12:
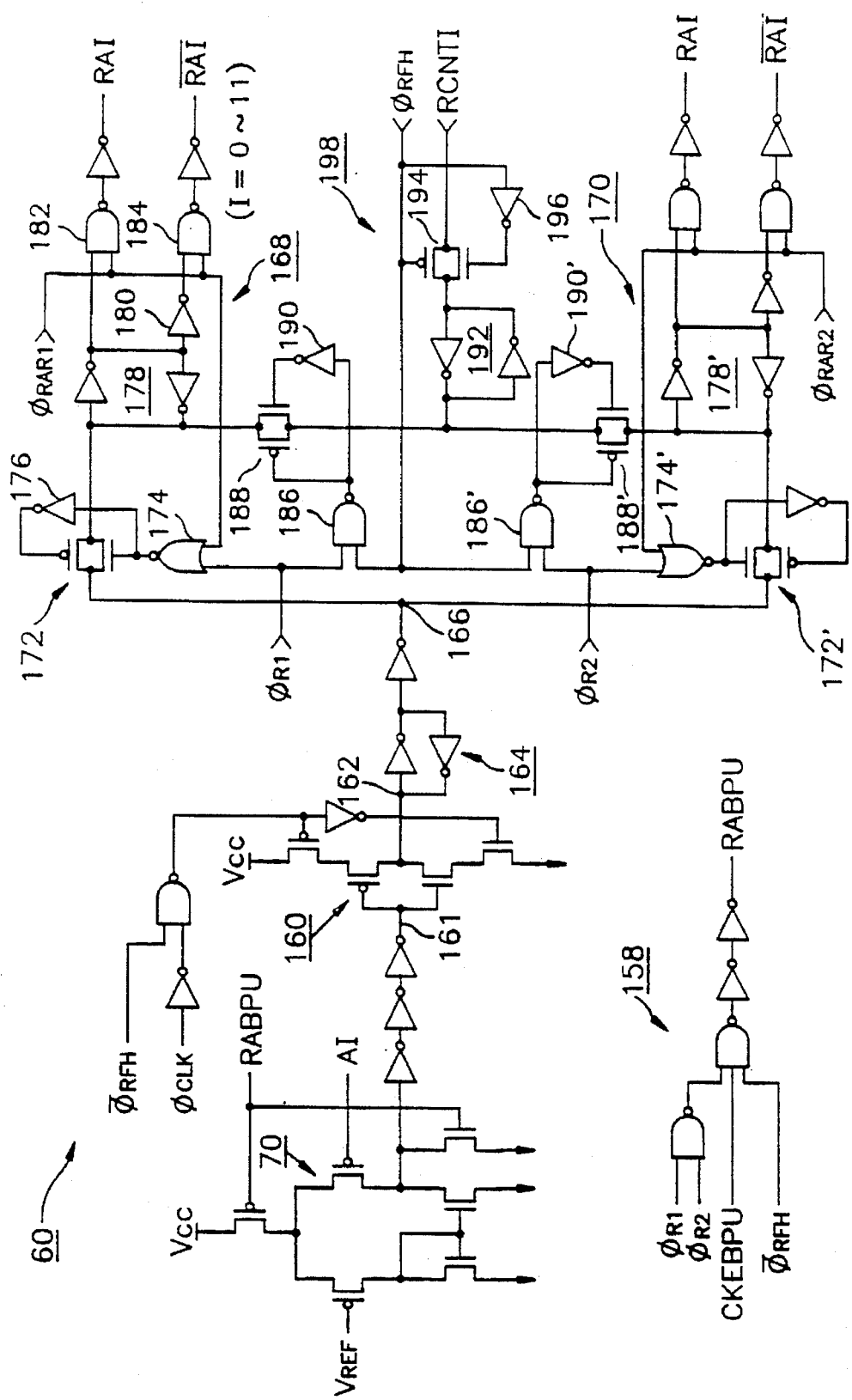
FIG. 12 is a schematic circuit diagram for a column address buffer according to the present invention.

FIG. 12 is a diagram showing a schematic circuit diagram from the row address buffer 60 according to the present invention. In the drawing, an input buffer 70 converts input address signal AI (I=0, 1, 2, . . . , 11) to address signal of CMOS level in the same way as discussed in connection with above-mentioned input buffers. A logic circuit 158 for generating a control signal RABPU to enable or disable the input buffer 70 is also illustrated in FIG. 12. The control signal RABPU becomes a high level when both banks have activated or the system lock masking operation as enabled or the refresh operation has initiated, and the input buffer 70 is thereby disabled to prevent power consumption. Between the output terminal 161 of the input buffer 70 and a node 162 is connected a tristate inverter 160. The inverter 160 lies in an off state by the refresh signal $O_{RFH}$ being at a low level during the refresh operation. In a normal operation such as a read or a write operation, the inverter 160 outputs a row address signal synchronized with the internal system clock $\phi_{CLK}$. The row address signal is stored in a latch 164. A plurality of row address providing circuits, the number of which is determined by that of banks, are connected to a node 166. Since two banks is used in the embodiment of the present invention, it should be appreciated that two row address providing circuits 168 and 170 are connected in parallel to the node 166. The row address providing circuit 168 for the first bank 12 is comprised of a NOR gate 174, inverters 176 and 180, a transmission gate 172, a latch 178 and NAND gates 182 and 184. The row address providing circuit 170 for the second bank 14 has the same construction as the row address providing circuit 168. A refresh address providing circuit 198 is connected to the circuits 168 and 170 and serves to supply to the row address providing circuits 168 and 170 a count value RCNTI from a refresh counter (not shown) in the refresh operation.

It is assumed that the first bank 12 was in inactive state while the second bank 14 was in normal state such as a read or a write operation. In this case, a first bank row master clock $\phi_{R1}$ and a first bank row address reset signal $\phi_{RAR1}$ would be at low levels, and a second bank row master clock $\phi_{R2}$ and a second bank row address reset signal $\phi_{RAR2}$ would be at high levels. It is now further assumed that the first bank 12 is activated at a time $t_1$ as illustrated in FIG. 10. Then before the clock $\phi_{R1}$ goes to a high level, a row address from the external pin AI is stored in the latch 164 as previously described and the stored row address is then stored into the latch 178 via the transmission gate 172 turned on by low level signals of $\phi_{R1}$ and $\phi_{RAR1}$. However, in this case, since the clock $\phi_{R2}$ continuously remains at the high level, the transmission gate 172' maintains the previous off state, thereby preventing from transferring the stored row address therethrough. When the clock $\phi_{R1}$ is then at the high level, the row address providing circuit 168 is isolated with the output of the latch 164 by means of the gate 172. When the first bank row address reset signal $\phi_{RAR1}$ then goes to a high level, NAND Gates 182 and 184 output the row address data stored in the latch 178 and its complementary data therein, respectively. Consequently, a row address RAI and its inverted row address $\overline{RAI}$ from the circuit 172 are fed to the row decoder in the first bank 12. It will be noted that, when $\phi_{R1}$ and $\phi_{R2}$ are both at high levels, the control signal RABPU becomes high by means of the logic circuit 158, thereby disabling the input buffer 70 in order to prevent the power consumption due to the active or normal operations of all banks.

On the other hand, in the refresh operation such as a CBR or a self refresh operation, the refresh signal $O_{RHF}$ is at a low level and $\phi_{RFH}$ is at a high level. In case of 2-bank refresh operation, and $\phi_{R1}$ and $\phi_{R2}$ are also at high levels, as will be discussed in detail hereinbelow in connection with FIG. 19. Signals $\phi_{RAR1}$ and $\phi_{RAR2}$ are also at high levels. Thus, the input buffer 70 and tristate inverter 160 are both in off states and at the same time, transmission gates 172, 172' and 194 are in off states while transmission gates 188 and 188' are in on states. Thus, a count address signal RCNTI from a known address counter (not shown), which was stored into a latch 192 via the transmission gate 194 turned on by $\phi_{RFH}$ being at a low level prior to the refresh operation, are fed to the row decoder corresponding to each bank via transmission gates 188 and 188', latches 178 and 178' and NAND gates 182, 184, 182' and 184'. After that time, operations of selecting word lines of each row decoder and then refreshing memory cells thereon are of the same manners as conventional DRAMs.

Addresses SRA10 and SRA11 for use in the multifunction $\overline{RAS}$ buffer may use row addresses RA10 and RA11 from the row address buffer 60. However, since the addresses RA10 and RA11 are generated with some time delays, separated row address buffers which may operate in faster speed may be provided on the same chip for independently generating the addresses SRA10 and SRA11.

4. Operation Mode Set Circuit

The synchronous DRAM of the present invention is designed so that system designers choose desired ones of various operation modes in order to amplify the Convenience of use and enlarge the range of applications.

Figure 13:
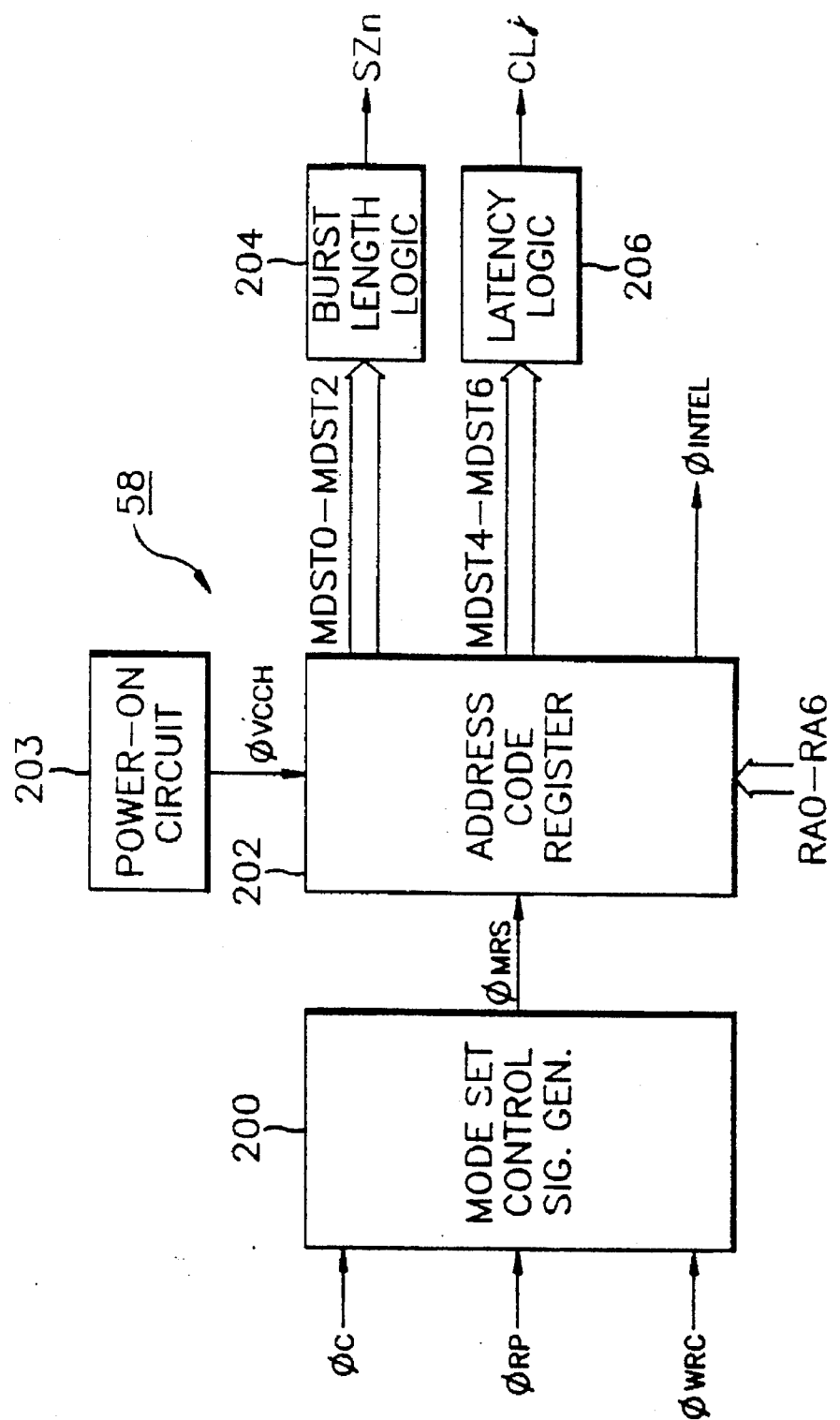
FIG. 13 is a schematic block diagram for an operation mode setting circuit according to the present invention.

FIG. 13 is a block diagram for the operation mode set circuit 58. A mode set control signal generator 200 generates a mode set signal $\phi_{MRS}$ in response to signals $\phi_C$, $\phi_{RP}$ and $\phi_{WRC}$ generated upon the issuance of the operation mode set command. An address code register 202, in response to the power-on signal $\phi_{VCCH}$ from the power-on circuit 203 and the mode set signal $\phi_{MRS}$, stores address codes MDST0 to MDST6 depending on addresses from the row address buffer and produces the codes MDST0 to MDST2 and MDST4 to MDST6 and a column addressing mode signal $\phi_{INTEL}$. A burst length logic circuit 204 produces a burst length signal SZn generated with logic combination of the codes MDST0 to MDST2. Wherein n represents a burst length indicated as the number of system clock cycles. A latency logic circuit 206 produces a $\overline{CAS}$ latency signal CLj generated with logic combinations of the codes MDST4 to MDST6. Wherein J represents a $\overline{CAS}$ latency (or $\overline{CAS}$ latency value) indicated as the number of system clock cycles.

Figure 14:
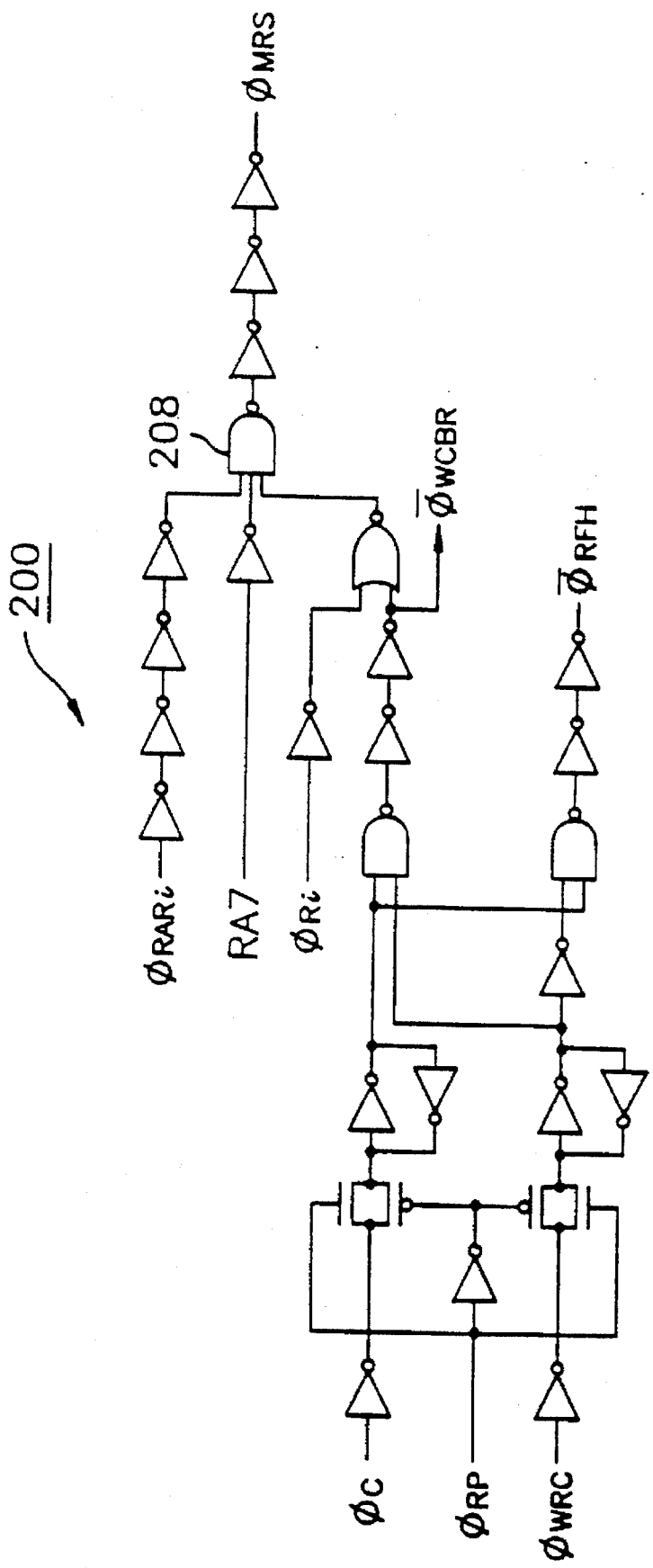
FIG. 14 is a schematic circuit diagram for a mode set control signal generating circuit in FIG. 13.
Figure 20:
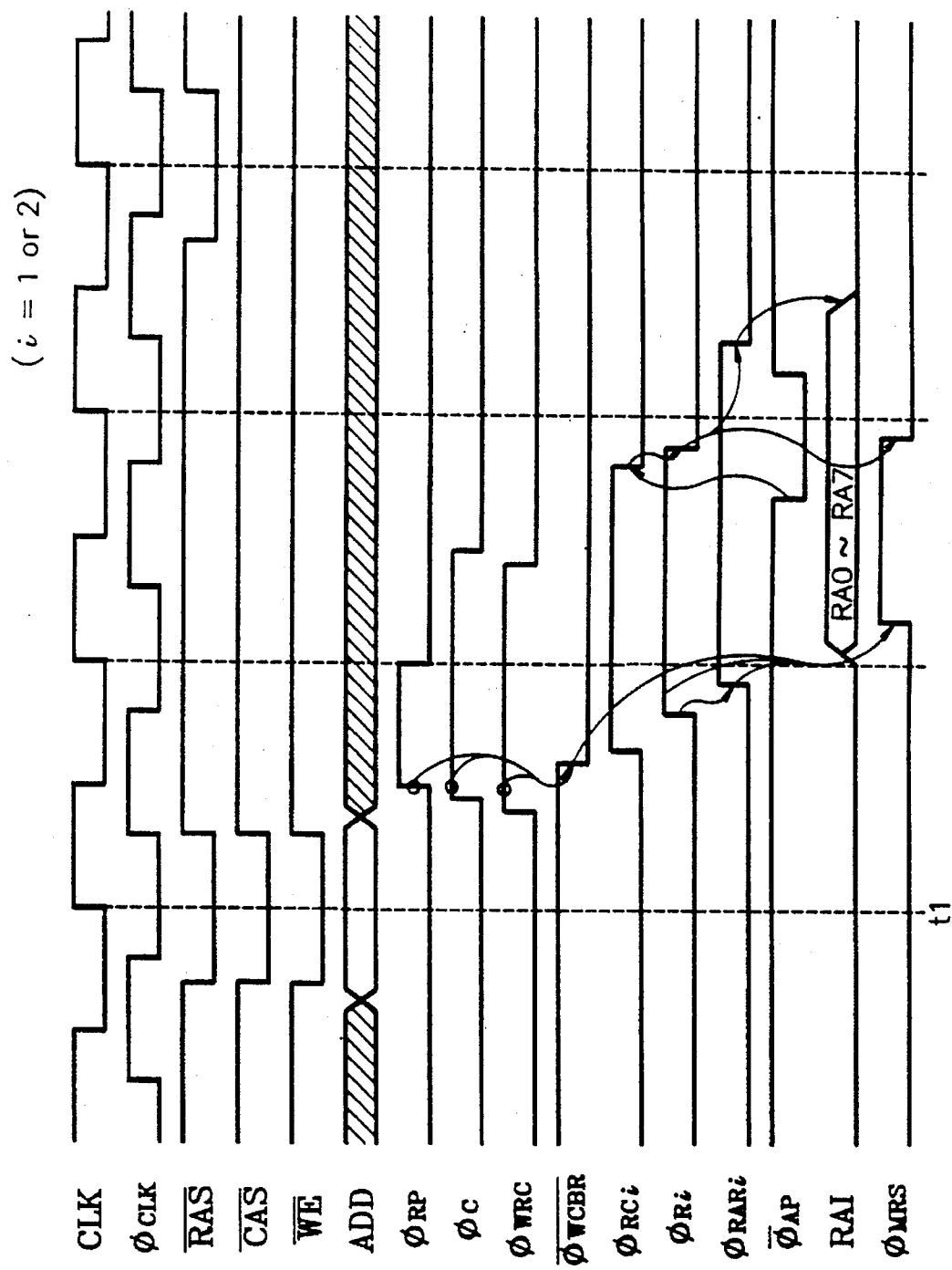
FIG. 20 is a timing diagram showing timing relationship for a mode set and an auto-precharge according to the present invention.

FIG. 14 is a diagram showing a schematic circuit diagram for the mode set control signal generator 200 and FIG. 20 is a timing diagram associated with the operation mode set or program.

In the present embodiment, programming the operation modes is accomplished by applying the operation mode set command and at the same time, addresses $A_0$ to $A_7$ to address input pins according to the following Table 1.

TABLE 1

| $\overline{CAS}$ latency j | | | | Column Addressing Way | | Burst Length | | | |
|---|---|---|---|---|---|---|---|---|---|
| A6 | A5 | A4 | j | A3 | Way | A2 | A1 | A0 | n |
| 0 | 0 | 1 | 1 | | | 0 | 0 | 1 | 2 |
| 0 | 1 | 0 | 2 | 0 | Binary | 0 | 1 | 0 | 4 |
| 0 | 1 | 1 | 3 | | | 0 | 1 | 1 | 8 |
| 1 | 0 | 0 | 4 | 1 | Interleave | 1 | 1 | 1 | 512 |

The $\overline{CAS}$ latency j related with a maximum system clock frequency is represented as the following Table 2.

TABLE 2

| Maximum System Clock Frequency (MHz) | $\overline{CAS}$ Latency j |
|---|---|
| 33 | 1 |
| 66 | 2 |
| 100 | 3 |

It will be noted that values of $\overline{CAS}$ latency J in the above Tables represent the number of system clock cycles and $\overline{CAS}$ latency values related to maximum clock frequencies may be changed according to the operation speed of a synchronous DRAM.

For example, if a system designer want to design a memory system with a binary column addressing way and a continuous 8-word data access at 100 MHZ, the minimum selection value of the $\overline{CAS}$ latency j is 3. If the $\overline{CAS}$ latency value of 3 has been chosen, addresses $A_0$ to $A_7$ for setting the operation modes is 1, 1, 0, 0, 1, 1, 0 and 0, respectively. It has been already discussed that selecting one of both banks was address $A_{11}$. Remaining addresses thereof are irrelevant to logic levels.

After the selection of operation modes suitable for a data transfer system and then the determination of addresses for setting the operation modes, mode set programming of the synchronous DRAM is performed, applying the mode set command and the predetermined addresses to corresponding pins of the chip. Referring to FIG. 20, the mode set command and the addresses ADD is applied thereto at a time $t_1$. Then, $\phi_{RF}$ from the $\overline{RAS}$ buffer and signals $\phi_C$ and $\phi_{WRC}$ from a $\overline{CAS}$ buffer and a $\overline{WE}$ buffer as will be discussed later go to high levels. In the mode set control signal generator 200 as shown in FIG. 14, the signals $\phi_C$, $\phi_{RP}$ and $\phi_{WRC}$ which are all high render a signal $\phi_{WCBR}$ to go low. When the row address reset signal $\phi_{RARi}$ is then at a high level, the row address buffer of NAND gate 208 are all at high levels, thereby causing the mode set signal $\phi_{MRS}$ to go high.

Figure 15C:
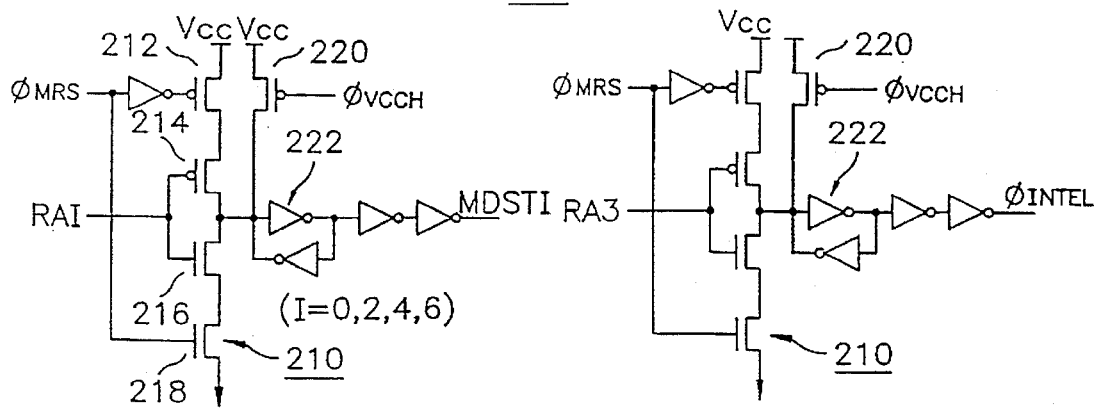
Figure 15C:
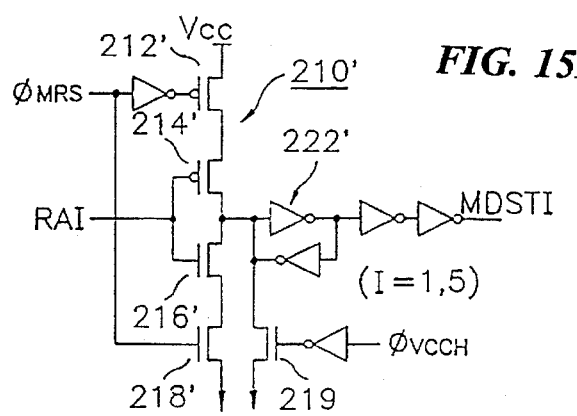

FIG. 15 is a diagram showing a schematic circuit diagram for the address code register 202. The address code register 202 comprises first register units for storing second logic levels (low levels) upon the power-on and address signals $RA_0$, $RA_2$ to $RA_4$ and $RA_6$ in the mode set operation after the power-up in response to the node set signal $\phi_{MRS}$, and second register units for storing first logic levels (high levels) upon the power-on and address signals $RA_1$ and $RA_5$ in the mode set operation after the power-up in response to the mode set signal $\phi_{MRS}$. Each of the first register units is comprised of a tristate inverter 210 including p-channel MOS transistors 212 and 214 and n-channel MOS transistors 216 and 218, a latch 222 connected to an output terminal of the inverter 210 and p-channel MOS transistor 220 whose channel is connected between the power supply voltage Vcc and the output terminal and whose gate is coupled to the power-on signal $\phi_{VCCH}$. Since the power-on signal $\phi_{VCCH}$ is low until the supply voltage Vcc reaches minimum voltages to carry on internal normal operation after the application thereof, i.e., on the power-on, each first register unit makes corresponding address code MDSTI or addressing mode signal $\phi_{INTEL}$ set at a low level on power-on by the conduction of p-channel MOS transistor 220. Each second register unit comprises a tristate inverter 210' including p-channel MOS transistors 212' and 214' and n-channel MOS transistors 216' and 218', an n-channel MOS transistor 219 whose channel is connected between an output terminal of the inverter 210' and the reference potential (ground potential) and whose gate is coupled to an inverted signal of $\phi_{VCCH}$, and a latch 222' connected to the output terminal of the inverter 210'. Each second register unit makes the address code MDST1 or MDST5 latched high upon the power-on. However, in the mode set operation after the power-up, i.e., after the supply potential Vcc reaches at least the minimum operating voltages, since $\phi_{VCCH}$ is high, inverters 210 and 210' are turned on in response to the high level signal $\phi_{MRS}$ and latches 222 and 222' then store row addresses RAI from the row address buffer 60, thereby outputting address codes MDSTI having the same address values as the row addresses RAI. Thus, if the mode set program is performed, each address code of MDSTI is the same value as the corresponding address: MDST3 corresponding to the address signal $RA_3$ is the signal $\phi_{INTEL}$ which represents column addressing way. If $A_3=0$ (low level), the signal $\phi_{INTEL}$ becomes low and a column address counter as discussed hereinbelow counts in a binary increasing manner. If $A_3=1$ (high level), the signal $\phi_{INTEL}$ becomes high representing an interleave mode.

Figure 16:
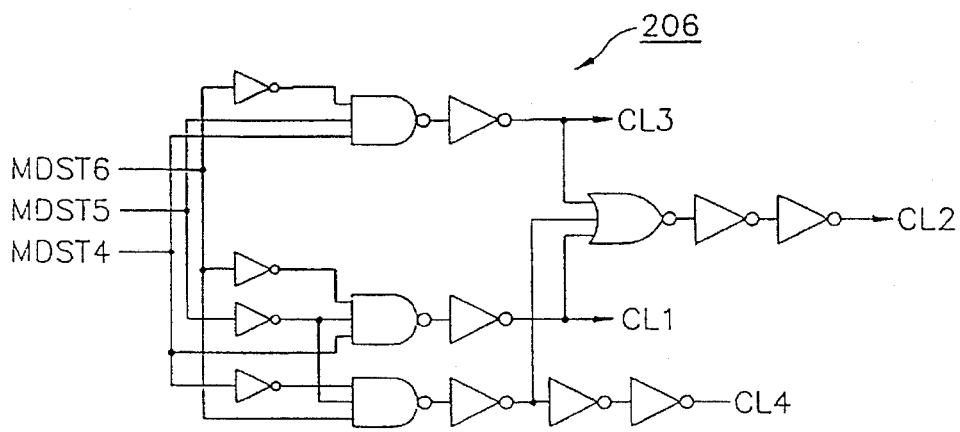
FIG. 16 is a schematic circuit diagram for a latency logic circuit in FIG. 13.

FIG. 16 is a diagram showing a schematic circuit diagram for the latency logic circuit 206 which selects to send to a high level only one of latency signals CL1 to CL4 with the logic combination of address codes MDST4 to MDST6 associated with the $\overline{CAS}$ latency. Upon the power-on, since MDST5 is high and MDST4 and MDST6 are low, only CL2 becomes high.

Figure 17:
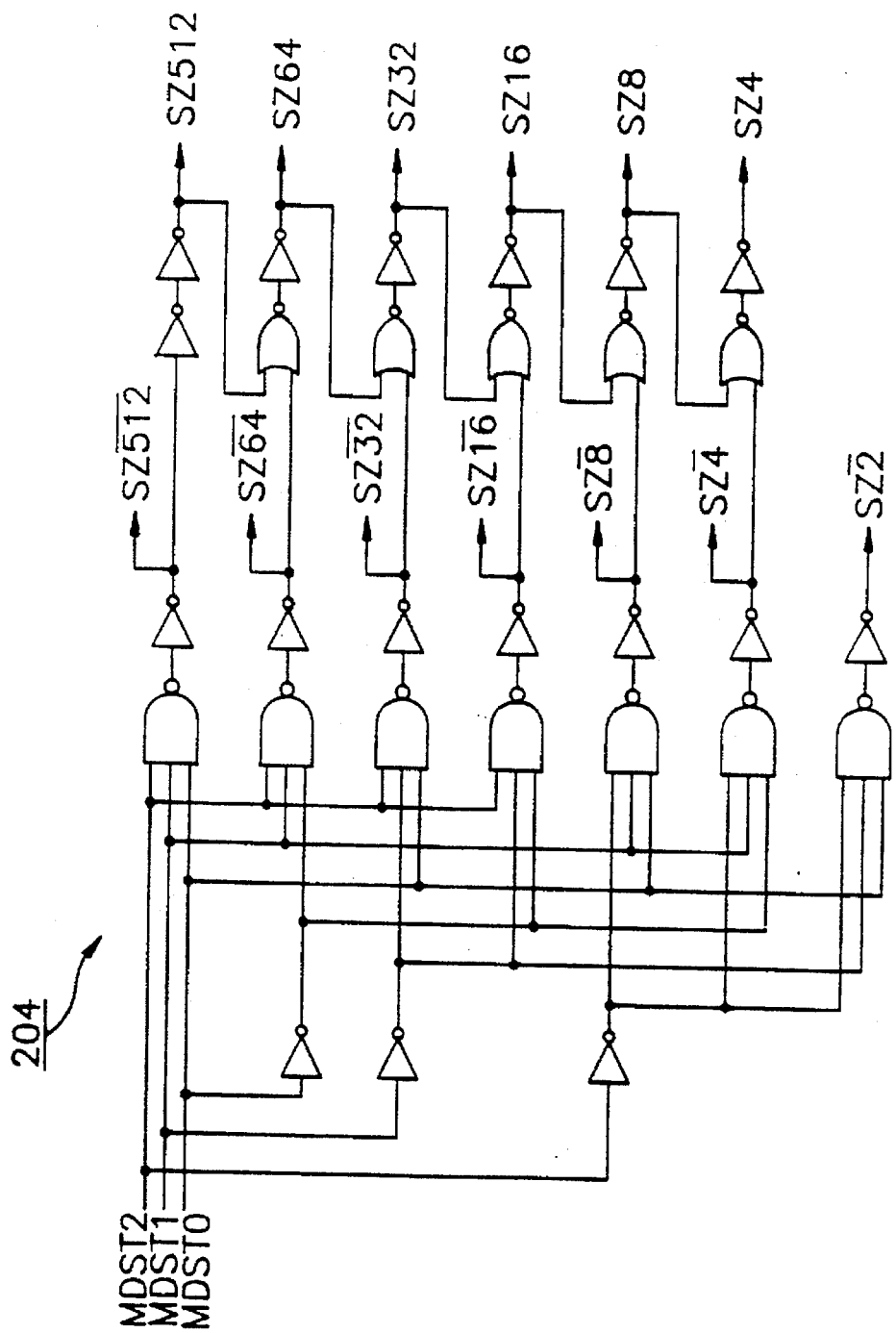
FIG. 17 is a schematic circuit diagram for a burst length logic circuit in FIG. 13.

FIG. 17 is a diagram showing a schematic circuit diagram for the burst length logic circuit 204 for selecting one of signals $SZ\overline{2}$ to $SZ\overline{512}$, each of which represents a burst length, with the logic combination of address codes MDST0 to MDST2 associated with the burst length. For example, if address codes MDST0 to MDST2 are all at high levels, only the signal $SZ\overline{512}$ of $SZ\overline{2}$ to $SZ\overline{512}$ is high and signals SZ4 to $SZ\overline{512}$ are all high. Thus, as will be discussed hereinbelow, continuous 512-word (full page) outputs via data output buffer in response to the signals. Upon the power-on, since MDST1 is high and MDST0 and MDST2 are low, only the signals SZ4 and $SZ\overline{4}$ are high.

Consequently, selected operation modes are determined by the storage of corresponding addresses to latches 222 and 222' when the mode set signal $\phi_{MRS}$ is at the high level. After the address codes have been stored to corresponding latches 222 and 222' an auto-charge operation is performed according to one characteristic feature of the present invention. By performing a high speed precharge without any separate precharge commands, precharging time is reduced and next operation such as the active operation is also performed immediately without a standby state.

Figure 18:
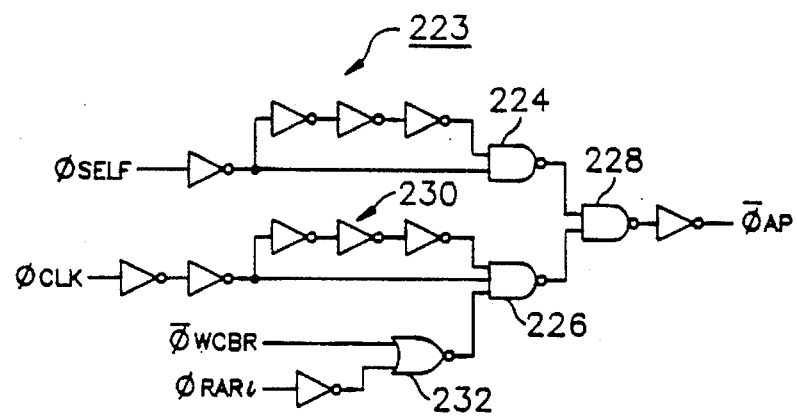
FIG. 18 is a circuit diagram showing an auto-precharge control signal generating circuit according to the present invention.

FIG. 18 is a circuit diagram showing an auto-precharge control signal generator 223 for performing the auto-precharge upon the exit of self refresh or in the mode set program. The self refresh signal $\phi_{SELF}$ is at a high level in the self refresh operation and at a low level in remaining time excluding the self refresh operation. Thus, the output of NAND gate 224 is at a high level in the mode set program. When $\phi_{RARi}$ reaches to a high level as seen in FIG. 20, the output of NOR gate 232 goes to a high level. At this time, $\phi_{CLK}$ is at a low level. When $\phi_{CLK}$ then goes to a high level, the output of NAND gate 226 goes from a low level to a high level after a time delay determined by a delay circuit 230. Consequently, the auto-precharge control signal generator 223 produces an auto-precharge signal $O_{AP}$ having a short low pulse after $O_{MRS}$ have gone high. Likewise, upon completion of the self refresh operation, $O_{SELF}$ goes from high to low and the circuit 223 then generates the auto-precharge signal $O_{AP}$ having the short low pulse. Returning to FIG. 9, the signal $O_{AP}$ inputs to a NAND gate 152. Thus, the NAND gate 152 produces a short high pulse with the short low pulse $O_{AP}$, thereby turning on n-channel transistors 148 and 150. The latches 154 and 156 then store high levels, thereby causing $\phi_{SC1}$ and $\phi_{RC2}$ to go to low levels. Once either $\phi_{RC1}$ or $\phi_{RC2}$ goes to low levels, $\phi_{Ri}$ and $\phi_{RARi}$ goes to low levels in sequence and then the precharge operation is performed.

On the other hand, if the synchronous DRAM of the present invention is used without the mode set programming, i.e., in a default mode, p-channel transistors 220 and n-channel transistors 219 as shown in FIG. 15 are all turned on by the power-on signal $\phi_{VCCH}$ which is low upon the power-on. Thus, latches 222 store low levels and latches 222' store high levels. Address codes MDST0, MDST2, MDST4 and MDST6 and $\phi_{INTEL}$ then become low levels and the codes MDST1 and MDST5 also become high levels. Consequently, in the default mode, $\overline{CAS}$ latency of 2, binary address mode and burst length of 4 are selected automatically.

5. Column Control Signal Generator

Figure 19:
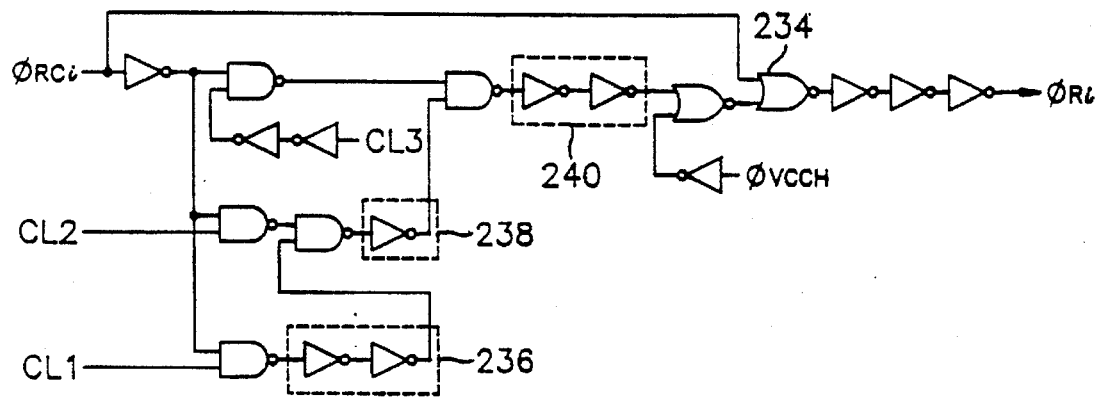
FIG. 19 is a schematic circuit diagram for a row master clock generating circuit for generating a row master clock $\phi_{Ri}$ according to the present invention.

FIG. 19 is a diagram showing a schematic circuit diagram for a row master clock generator 62 for generating the row master clock $\phi_{Ri}$ in response to the $\overline{RAS}$ clock $\phi_{RCi}$ from the $\overline{RAS}$ buffer 56. As shown in FIG. 10, if the i-th bank is activated, $\phi_{RCi}$ goes to a high level and the i-th bank row master clock $\phi_{Ri}$ then goes to a high level via NOR gate 234 and inverters. However, if $\phi_{RCi}$ goes to a low level to precharge, $\phi_{Ri}$ goes to a low level after a different time delay according to each $\overline{CAS}$ latency. That is, when the value of the CAS latency J is 1, i.e., CL1=high and CL2=CL3=low, $\phi_{Ri}$ goes to the low level after a time delay passing delay circuits 236, 238 and 240 mainly. When the value the $\overline{CAS}$ latency j was set to 2, $\phi_{Ri}$ goes to the low level after a time delay passing delay circuits 238 and 240 mainly. When the value of the $\overline{CAS}$ latency j was programmed to 3, $\phi_{Ri}$ goes to the low level after a time delay passing the delay circuit 240 mainly. Thus, the higher the frequency of system clock CLK, the shorter the time delay causing $\phi_{Ri}$ to go low. Such time delays allow column selection signals to have a sufficient time margin before the beginning of precharge cycle in a write operation, thus correctly writing data into cells and also ensuring that continuous 2-bit data outputs via output pin after precharge command in a read operation. In the present embodiment, the time delay in case of j=1 is about 19 ns and the time delays in case of j=2 and j=3 are respectively about 6 ns and 3 ns.

The row control clock generator 62 as shown in FIG. 3 is a conventional logic circuit for generating clocks showing in the timing diagram of FIG. 10. The row address reset signal $\phi_{RARi}$ rises to a high level after the rising edge of $\phi_{Ri}$ and falls to a low level after the falling edge of $\phi_X$. The word line driving signal $\phi_X$ rises to a high level after the rising edge of $\phi_{RARi}$ and falls to a low level after the falling edge of $\phi_{Ri}$. The signal $\phi_S$ generated by the signal $\phi_X$ activates sense amplifiers selected with the block information signal BLS which is produced by decoding row addresses. Signal $\phi_{RARi}$ for enabling the column decoder goes to a high level after the rising edge of $\phi_{RARi}$ and goes to a low level after the falling edge of $\phi_{RCi}$. Signal $\phi_{RCDi}$ for guaranteeing $t_{RCD}$ goes to a high level after the rising edge of $\phi_S$ and goes to a low level after the falling edge of $\phi_{Ri}$.

Figure 21:
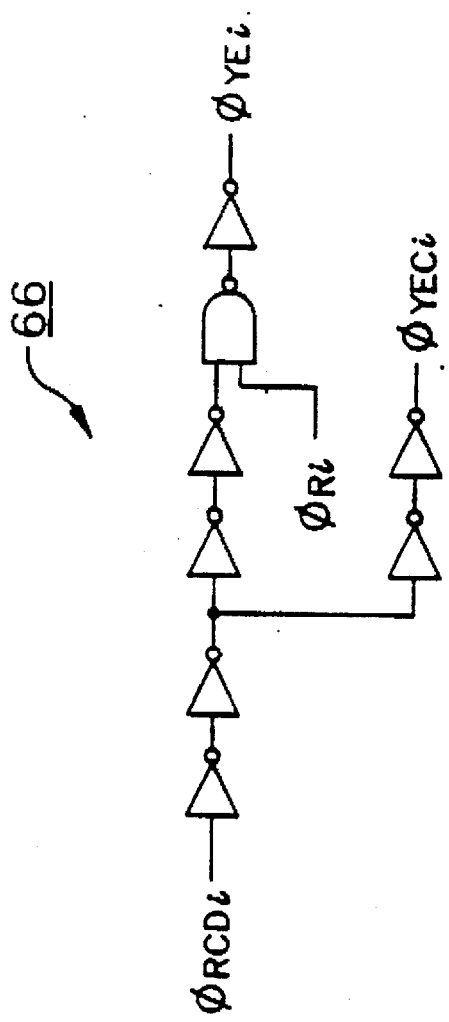
FIG. 21 is a circuit diagram showing a circuit for producing signals to enable the generation of column control signals.

FIG. 21 is a schematic circuit diagram showing a logic circuit for generating signals $\phi_{YEi}$ and $\phi_{RECi}$ which enable $\overline{CAS}$ chain circuits. The signal $\phi_{YECi}$ is a delayed signal of $\phi_{RCDi}$. Column enable signal $\phi_{YEi}$ is a signal having a timing as shown in FIG. 10 by gating of $\phi_{RCDi}$ and $\phi_{Ri}$.

Figure 11:
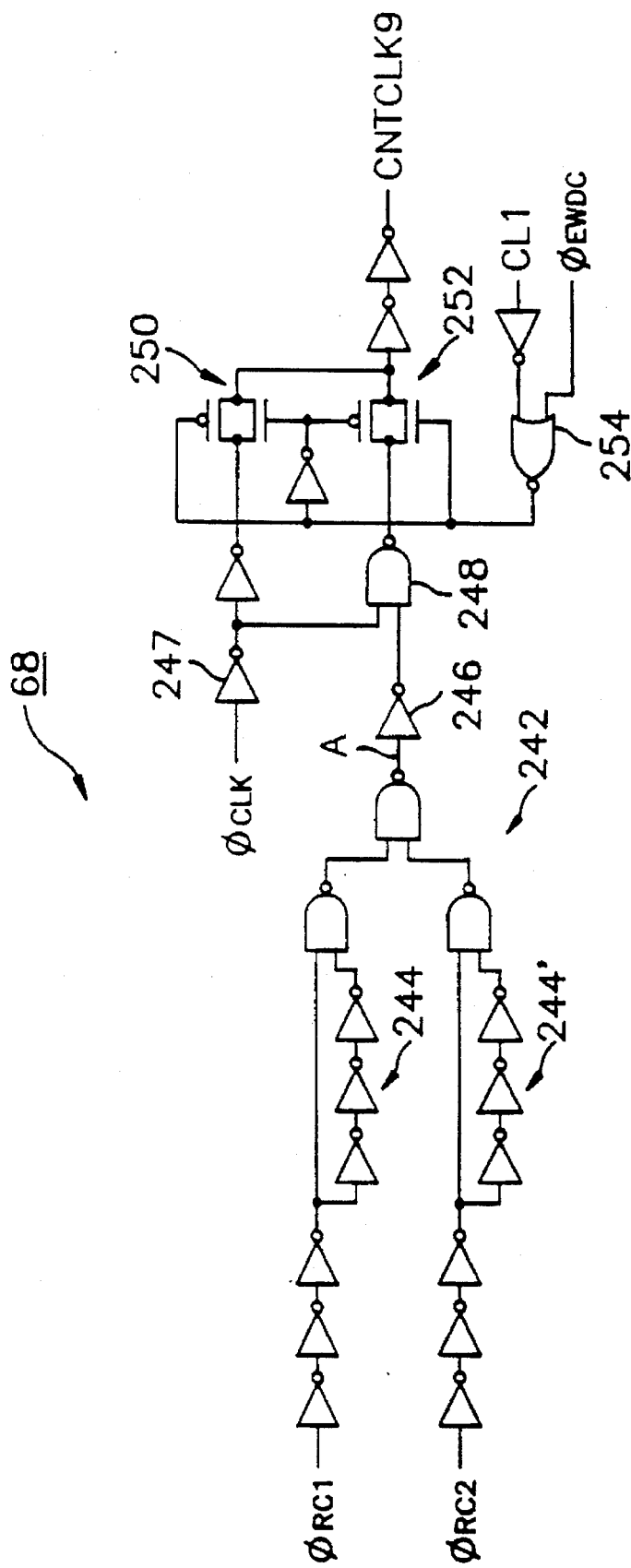
FIG. 11 is a schematic circuit diagram for a high frequency clock generator for generating multiplied clocks upon precharging according to the present invention.

FIG. 11 is a schematic circuit diagram showing the high frequency clock generator according to the present invention which serves to multiply the frequency of the internal system clock upon the occurrence of precharge command where a low frequency external system clock such as an external system clock CLK of 33 MHZ or less in the present embodiment is used. The high frequency clock generator 68 comprises a circuit means 242 for generating a pulse depending on the precharge command, a gate 248 for logically summing the generated pulse with the internal system clock $\phi_{CLK}$ to generate a multiplied system clock and a transmission gate 252 for transferring the multiplied system clock in response to a predetermined latency.

Figure 22:
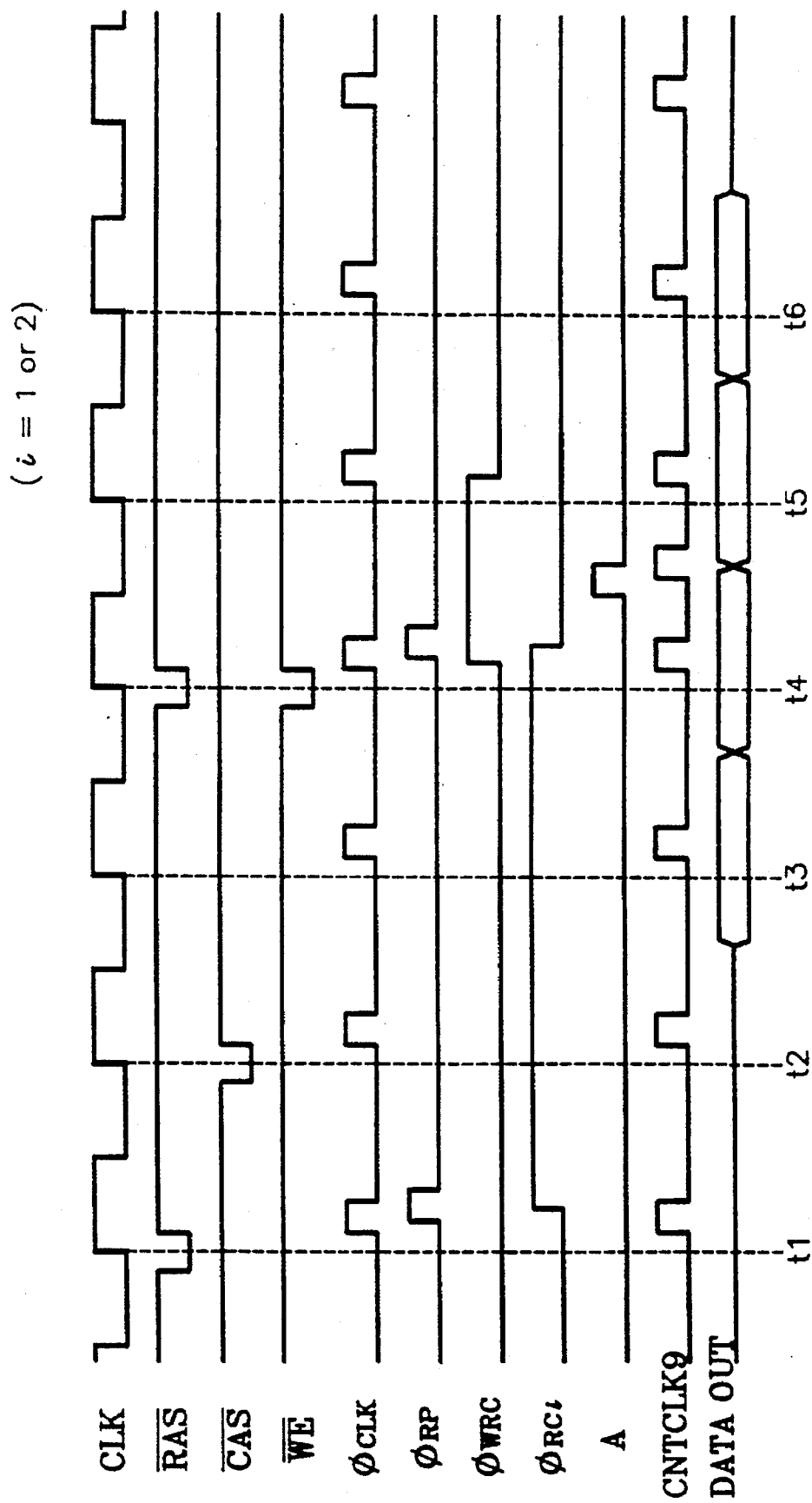
FIG. 22 is an operation timing diagram for the high frequency clock generator of FIG. 11.

Referring to FIG. 22 showing a timing diagram for read and precharge operations at a system clock CLK of 33 MHZ and a burst length of SZ4, precharge command for read-out bank is issued at time $t_4$. $\phi_{RCi}$ then goes from a high level to a low level and the output terminal A of the pulse generator 242 thereby outputs the pulse having a pulse width depending on a given time delay of a delay circuit 244 or 244'. This pulse is summed with the internal system clock $\phi_{CLK}$ by means of gates 246 to 248, thereby resulting in outputting a multiplied system clock via NAND gate 248. NOR gate 254 outputs a high level since CL1 is high and $\phi_{EWDC}$ is high only in a write operation. Thus, the output of the gate 248 outputs via turned-on transmission gate 252. At this time, a transmission gate 250 is off. Thus, since internal circuits operate with an internal system clock CNTCLK9 having the multiplied operation frequency after the precharge command, data output can be accomplished at a high speed and the precharge operation can be completed within a shorter time period after the precharge command. When the system clock CLK is above 33 MHZ, CL1 is at a low level. Thus, NOR gate 254 outputs a low level and the transmission gate 252 is off. Thus, the transmission gate 250 is turned off and CNTCLK9 is equal to the clock $\phi_{CLK}$.

DATA PATHS

Figure 23:
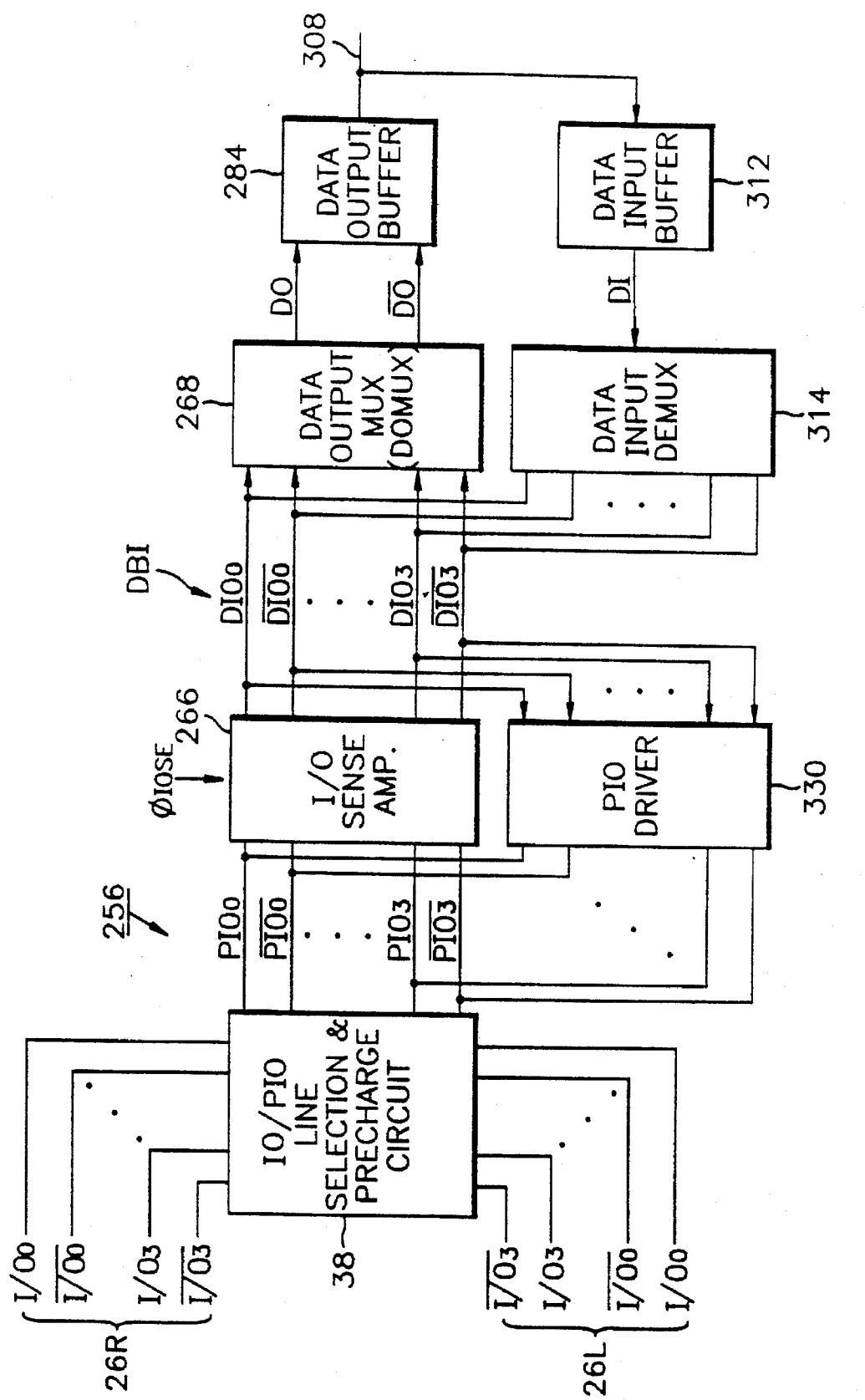
FIG. 23 is a diagram showing a circuit block diagram on a data path associated with one of data buses according to the present invention.

Data paths mean paths for outputting the developed data on bit lines via data output buffers in a read operation and feeding data being inputting via data input buffer to bit lines in a write operation. FIG. 23 shows circuit blocks associated with the data paths. For purposes of simplicity, it will be noted that the drawing shows circuit blocks on data paths associated with two sub-arrays.

Referring to FIG. 23, an I/O line selection and precharge circuit 38 is connected to the first I/O bus 26R associated with one of sub-arrays in one of memory cell arrays 20TL, 20BL, 20TR and 20BR and to the second I/O bus 26L associated with another sub-array therein as discussed along with FIG. 1. The circuit 38 receives the block information signal BLS for designating a sub-array including a word line selected by the row decoder 18 and in response to this information signal, serves to couple an I/O bus associated with the sub-array to PIO bus 256. Also, in a reading operation, since data presents on two pairs of four pairs of I/O lines in a selected I/O bus, the circuit 38 precharges remaining two pairs of the four pairs and PIO line pairs corresponding thereto.

Figure 24:
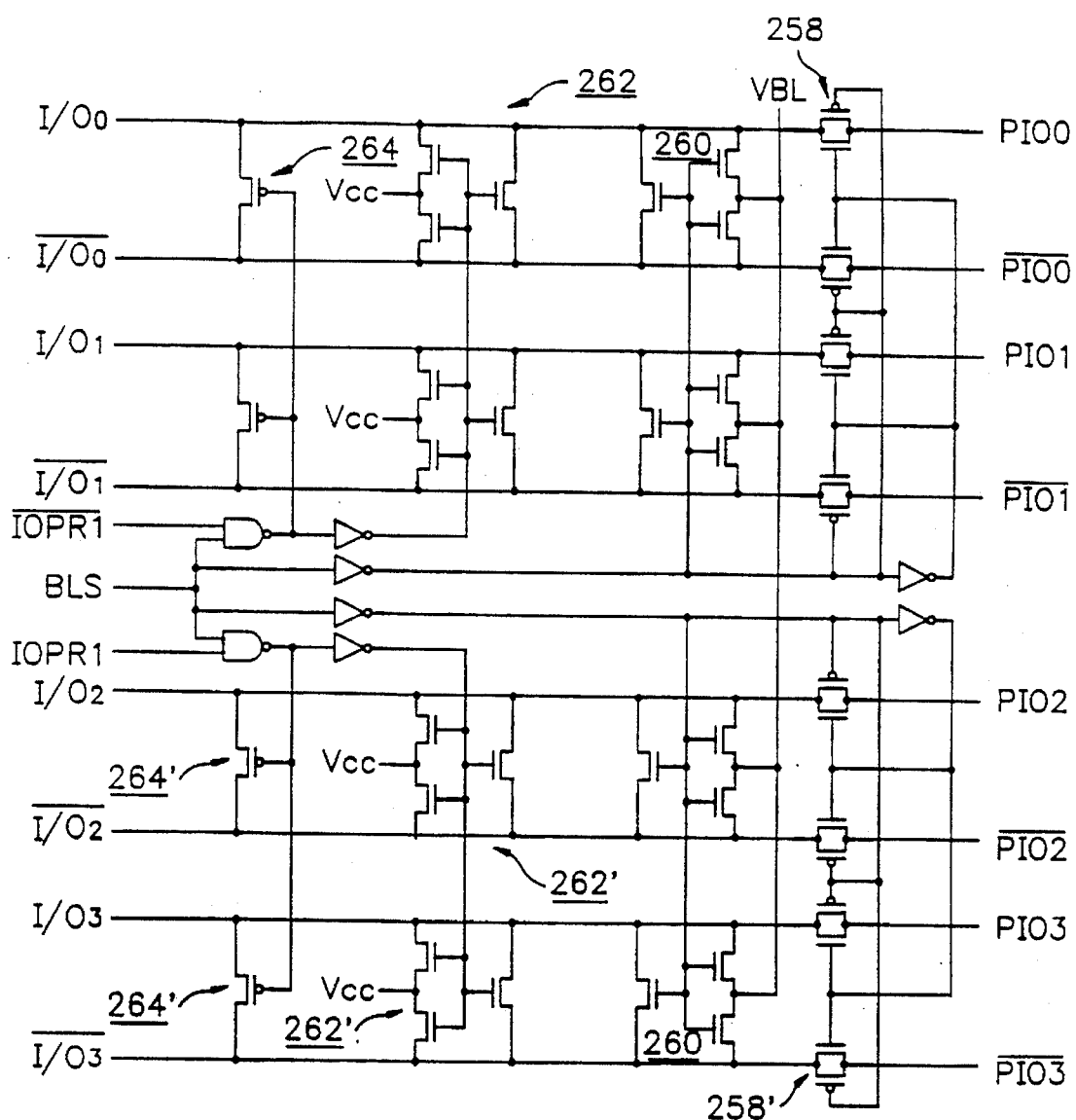
FIG. 24 is a schematic circuit diagram for an I/O precharge and selection circuit according to the present invention.

FIGS. 24 is a diagram showing a schematic circuit diagram for the I/O precharge and selection circuit 38. When the block information signal BLS from the row decoder 18 is at a low level, transfer switches 258 and 258' are all in off states and precharge circuits 260 are all turned on, thereby precharging I/O line pairs I/O$_0$, $\overline{I/O_0}$ to I/O$_3$ $\overline{I/O_3}$ to VBL (=½ Vcc). When the block information signal BLS is at a high level to transfer data, the switches 258 and 258' are in on states while the precharge circuits 260 are in off states. Now assume that I/O line pairs being to transfer data is the second I/O line pairs I/O$_2$, $\overline{I/O_2}$ and I/O$_3$, $\overline{I/O_3}$. Then, an I/O line precharge signal IOPR1 goes to a low level and its complement signal $\overline{IOPR1}$ goes to a high level. Thus, precharge circuits 262 and equalizing circuits 264 are turned on and the I/O line pairs I/O$_0$, $\overline{I/O_0}$, and I/O$_1$, $\overline{I/O_1}$ are then subsequently precharged and equalized to one threshold voltage below the supply voltage (Vcc-V$_t$). Wherein V$_t$ is a threshold voltage of n-channel MOS transistor. However, since the precharge circuits 262' and equalizing circuits 264' associated with the I/O line pairs transferring data are all in off states, the data thereon is transferred to corresponding second PIO line pairs PIO$_2$, $\overline{PIO_2}$ and PIO$_3$, $\overline{PIO_3}$ via transfer switches 258' in the reading operation. In the same manner, data on PIO line pairs can transferred to corresponding I/O line pairs in write operations.

Returning to FIG. 23, an I/O sense amplifier 266 is activated to amplify data On the PIO bus 256 with a control signal $\phi_{IOSE}$ which is generated in response to the block information signal in a read operation. The I/O sense amplifier 266 is a know circuit which may be further including a latch for storing data at its output terminal.

The output of the I/O sense amplifier 266 is coupled to the data output multiplexer via the data bus DBI. It will be noted that the data bus DBI is one of data buses DB0 to DB7, as shown in FIG. 1. Data line pairs DIO$_0$, $\overline{DIO_0}$ to DIO$_3$, $\overline{DIO_3}$ constituting the data bus DBI are correspondingly connected to PIO line pairs PIO$_0$, $\overline{PIO_0}$ to PIO$_3$, $\overline{PIO_3}$ constituting the PIO bus 256 via the sense amplifier 266.

Figure 25:
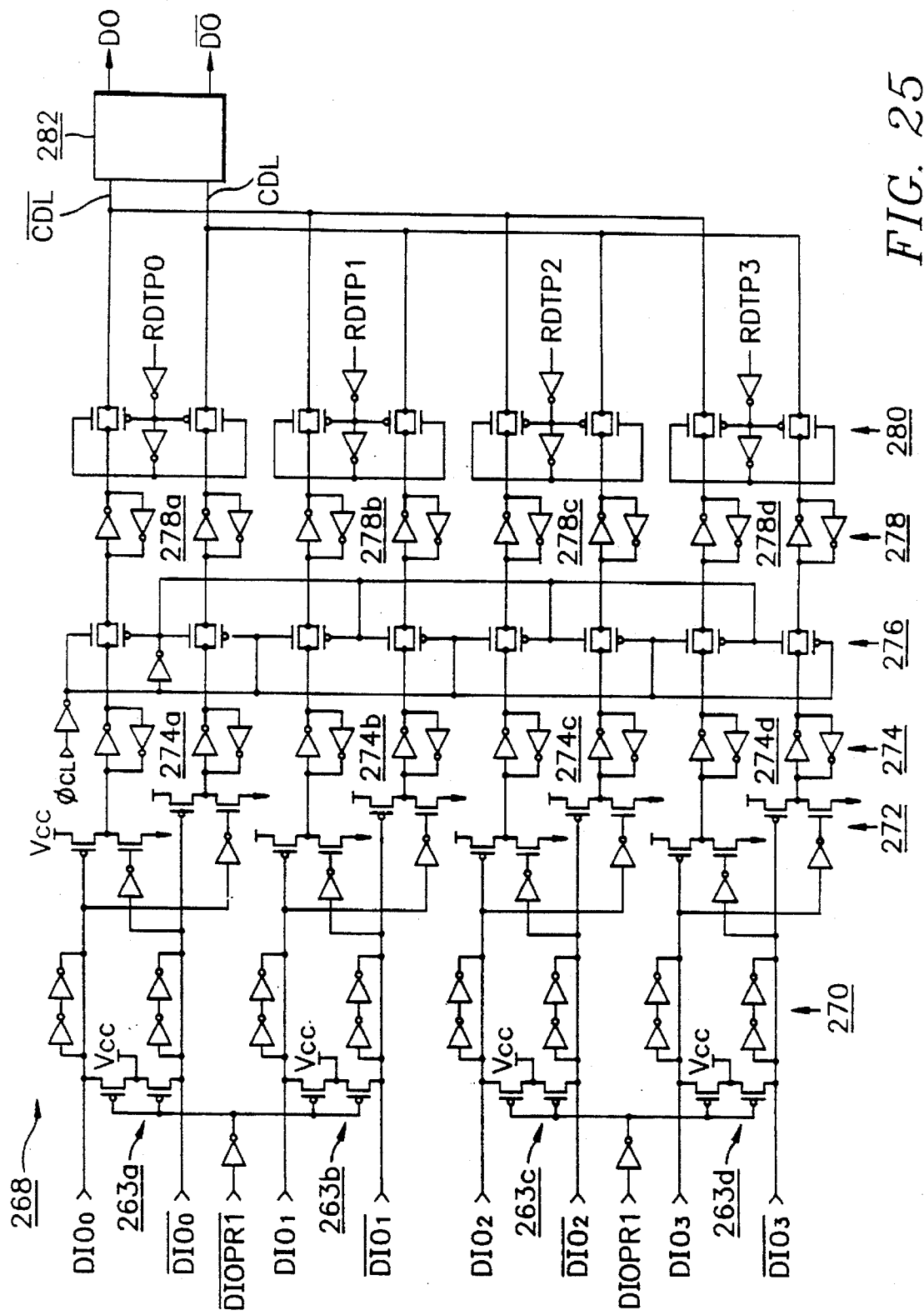
FIG. 25 is a schematic circuit diagram for a data output multiplexer according to the present invention.

FIG. 25 is a diagram showing a schematic circuit diagram for the data output multiplexer 268 which are comprised of precharge circuits 263a and 263d, latches 270, tristate buffers 272, first latches 274a to 274d, isolation switches 276, second latches 278a to 278d and data transfer switches 280, all of which are connected in series between the respective data line pairs and a common data line pair CDL and $\overline{CDL}$. In the same manner as previously discussed about precharging of I/O line pairs I/O$_0$, $\overline{I/O_0}$ to I/O$_3$, $\overline{I/O_3}$, the precharge circuits 263a to 263d respond to a DIO line precharge signal DIOPR1 and its complement $\overline{DIOPR1}$ in a read operation, thereby causing two data line pairs transferring data to be prevented from precharging and the remaining data line pairs to be precharged. Latches 270 are respectively connected to the data lines DIO$_3$, $\overline{DIO_0}$ to DIO$_3$, $\overline{DIO_3}$ for storing data thereon. Tristate buffers 272 are respectively connected between the data lines DIO$_0$, $\overline{DIO_0}$ to DIO$_3$, $\overline{DIO_3}$ and first latches 274a to 274d for outputting inverted data thereon. However, tristate buffers connected with data lines being precharged are turned off. First latches 274a–274d are respectively connected to output terminals of the tristate buffers 272 for storing data transferred via the data lines and the tristate buffers. Each of second latches 278a to 278d is connected in series with corresponding first latch via corresponding isolation switch. The second latches 278a–278d are connected to a pair of common data lines $\overline{CDL}$ and CDL via corresponding data transfer switches 280. The data transfer switches 280 are sequentially turned on in response to data transfer signals RDTP0 to RDTP3 which are high level pulses generated in sequence by column address signals, thereby sequentially outputting data stored in the second latches to the common data lines $\overline{CDL}$ and CDL via the first latches. Thus, as will be discussed in more detail hereinafter, data stored in serial registers 274 and 278 which are comprised of the first and the second latches 274a to 274d and 278a to 278d outputs in sequence on the common data lines $\overline{CDL}$ and CDL in response to the data transfer signals RDTP0 to RDTP3. In precharge operations of the data line pairs DIO$_3$, $\overline{DIO_0}$ to DIO$_3$, $\overline{DIO_0}$, since the tristate buffers 272 are held in off states, there is no destruction 6f data stored in the first and second registers 274 and 278. However, where data stored in the second register 278 waits a long time before transmission via transfer switches 280, i.e., in case of a long latency, if new data is transferred from data line pairs, the previous data stored in the second register 278 will be destroyed. Also, in case of use of a low frequency system clock, since the data transfer signals RDTP0 to RDTP3 are generated in synchronism with the system clock, such destruction of data may be occurred. Such data destruction due to data contention may substantially occur in a $\overline{CAS}$ interrupt read operation, i.e., such operation that before the completion of burst operation during a sequential data read operation based on the established burst length, an interrupt request is issued and a next sequential data read operation of the burst length is then carried out with no break or no wait, depending on the column address signals. Thus, to prevent an erred operation due to such data collection, the isolation switches 276 are connected between the first and the second latches. A control signal $\phi_{CL}$ for controlling the isolation switches is a high level pulse signal upon the $\overline{CAS}$ interrupt request in case of long $\overline{CAS}$ latency values of 3 and 4. The data lines $\overline{CDL}$ and CDL are connected to a known data output latch 282.

Returning to FIG. 23, the data output buffer 284 is connected with data output lines DO and $\overline{DO}$ from the data output multiplexer 268, serving to feed to an input/output pad (not shown) a sequential data synchronous to the system clock which is defined in dependence upon a burst length in a read operation. There is a circuit diagram for the data output buffer 284 in FIG. 26. In the drawing, transfer switches 286 and 286' respectively transfer data on the lines DO and $\overline{DO}$ to lines 288 and 290 in synchronism with a system clock $\phi_{CLK}$ of a given frequency (a frequency above 33 MHZ in the present embodiment), but in a synchronism with a system clock $\phi_{CLK}$ of the given frequency or below the given frequency. As will be explained hereinafter, a control signal $\phi_{YEP}$ is held high at a system clock of 33 MHZ or below 33 MHZ, i.e., at a $\overline{CAS}$ latency value of 1 and held low at a system clock of a frequency above 33 MH. Latches 92 are respectively connected to the lines 288 and 290 for storing data thereinto. A gate circuit 310 comprised of NAND gates 294 to 298 and transistors 300 and 302 is connected between the lines 288 and 290 and driving transistors 304 and 306. The source of a p-channel MOS transistor 300 is coupled to a boosted Voltage Vpp from a known boost circuit for driving the transistor 304 without loss of its threshold. The gate circuit 310 serves to inhibit the output of data on the data input/out line 308 in response to a control signal $\phi_{TRST}$ which goes to a low level upon either completion of a burst read operation or occurrence of a data output masking operation.

Returning again to FIG. 23, the data input buffer 312 is connected between a data line DI and the line 308 for converting external input data on the line 308 into CMOS level data and producing internal input data synchronous with the system clock $\phi_{CLK}$. The data input buffer 312 may be comprised of previously mentioned input buffer for being enabled by a signal $\phi_{EWDC}$ which is at a high level in a write operation, and converting an external input data into a CMOS level data; and previously mentioned synchronization circuit for receiving the converted input data from the input buffer and then producing an internal input data synchronous with the system clock $\phi_{CLK}$. Thus, whenever the clock $\phi_{CLK}$ goes to a high level in a write operation, the data input buffer 312 may be a buffer circuit for sequentially sampling a serially inputting data and then outputting a resulting serial data on the data line DI.

A data input demultiplexer 314 serves to sample the serial data on the output line DI of the data input buffer 312 with write data transfer signals being sequentially generated in synchronism with the system clock, thereby grouping into parallel data of predetermined bits (2-bit parallel data in the present embodiment) and supplying the grouping parallel data to corresponding data line pairs.

Figure 27:
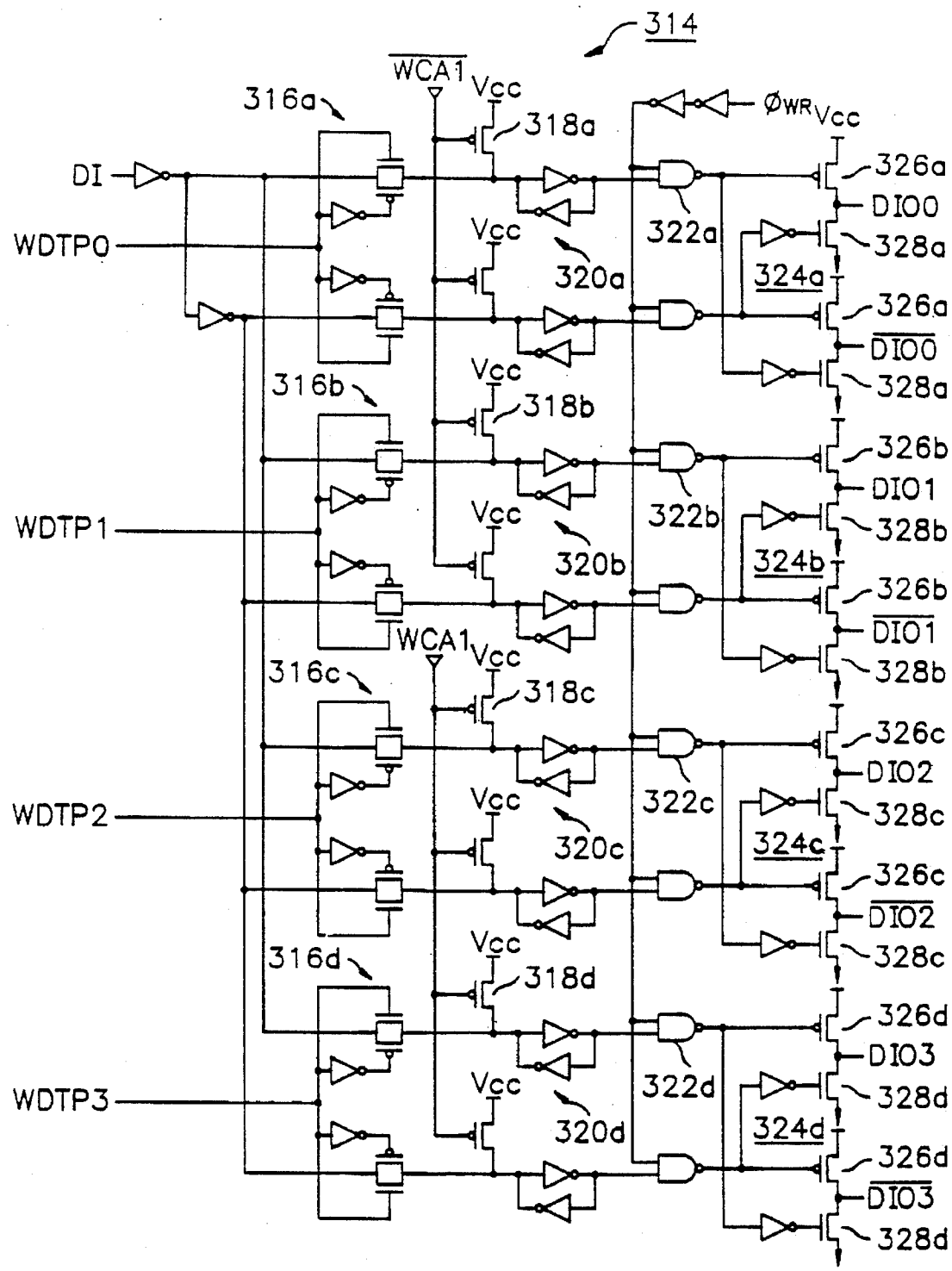
FIG. 27 is a detail circuit diagram for a data input demultiplexes according to the present invention.

FIG. 27 is a diagram showing a schematic circuit diagram for the data input demultiplexer 314. The demultiplexer 314 comprises selection switches 316a to 316d connected to the data line DI for sampling to transform the serial data on the data line DI into the parallel data in response to write data transfer signals WDTP0 to WDTP3. Each of latches 320a to 320d are connected to the corresponding selection switch for storing the sampled data. The outputs of the latches 320a to 320d are respectively connected to the data lines $DIO_0$, $\overline{DIO_0}$ to $DIO_3$, $\overline{DIO_3}$ via switches 322a to 322d, each of which is a NAND gate enabled in a write operation, and buffers 324a to 324d. The signal $\phi_{WR}$ gating NAND gates 322a to 322d is a signal being at a high level in a write operation. Each of the buffers 324a and 324d is a tristate inverter which is composed of a p-channel and an n-channel transistors 326 and 328. P-channel transistors 318a to 318d respectively connected between the selection switches 316a and 316d and the latches 320a and 320d allow to, in response to the control signal WCA1 and its complement $\overline{WCA1}$, transfer a 2-bit parallel data, alternating two groups of first data line pairs $DIO_0$, $\overline{DIO_0}$ and $DIO_1$, $\overline{DIO_1}$ and $DIO_3$, $\overline{DIO_3}$, and at the same time, precharge in such a manner as precharging one group thereof while the other group thereof is transferring the parallel data. That is, when the control signal WCA1 is at a high level in a write operation, transistors. 318c and 318d are in off states. Thus, data stored in latches 320c and 320d in response to the signals WDTP2 and WDTP3 is transferred to the second data line pairs $DIO_2$, $\overline{DIO_2}$ and $DIO_3$, $\overline{DIO_3}$ via switches 322c and 322d and buffers 324c and 324d. At this time, since $\overline{WCA1}$ is low, transistors 318a and 318b are in on states, and buffers 324a and 324b are thereby in off states. Thus, the first data line pairs $DIO_0$, $\overline{DIO_0}$ and $DIO_1$, $\overline{DIO_1}$ are precharged to the supply potential Vcc by precharge circuits 263a and 263b shown in FIG. 25. When WCA1 then goes to a low level, the transistors 318c and 318d goes to on states and the tristate buffers 324c and 324d then become off. Thus, likewise, the second data line pairs are precharged and the first data line pairs transfer a 2-bit parallel data.

Returning to FIG. 23, data transferred via the bidirectional data bus DBI from the data input demultiplexer 314 is transferred to PIO line pairs 256 via the PIO line driver 330.

Figure 28:
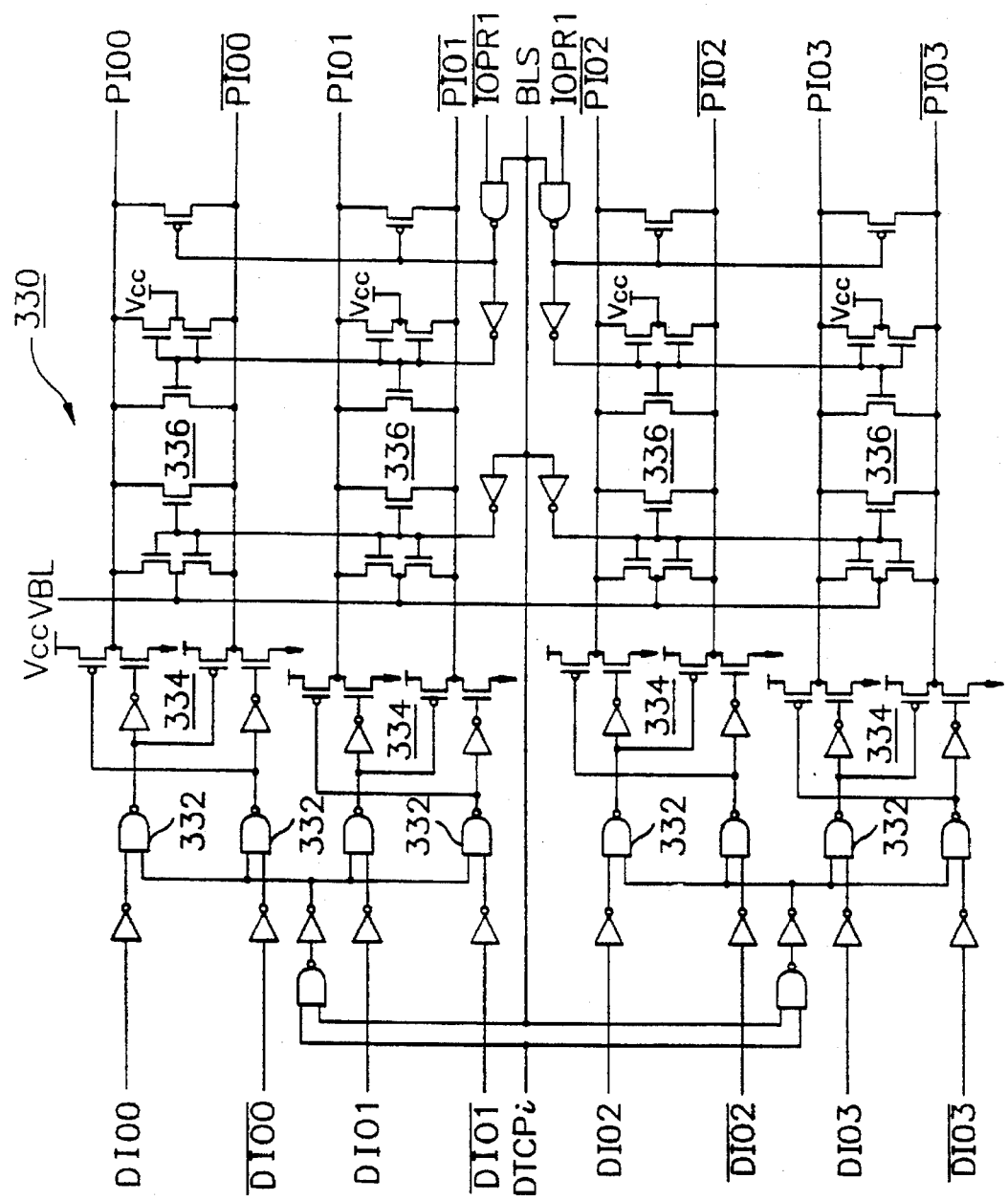
FIG. 28 is a schematic circuit diagram for a PIO line driver according to the present invention.

FIG. 28 is a drawing showing a schematic circuit diagram for the PIO line driver 330 which comprises switches 332 responsive to a bank selection signal DTCPi and the block selection signal BLS for passing data on the data line pairs $DIO_0$, $\overline{DIO_0}$ to $DIO_3$, $\overline{DIO_3}$, buffers 334 connected between the switches 332 and the PIO line pairs $PIO_0$, $\overline{PIO_0}$ to $PIO_3$, $\overline{PIO_0}$ for amplifying data inputting via the switches 332 to supply to corresponding PIO line pairs, and precharge and equalizing circuits 336 each connected between two lines constructing each PIO line pair for precharging and equalizing the PIO line. It should be noted that the buffers 334 and the precharge and equalizing circuits 336 are the same constructions as the buffers 324a to 324d in FIG. 27 and the precharge and equalizing circuits 260, 262, 262', 264 and 264' in FIG. 24, and their operations are also associated with each other in a write operation. The PIO line driver 330 isolates between the data bus DBI and the PIO line pairs 256 with the signal DTCPi being at a low level in a read operation. However, in a write operation, data on the PIO line pairs 256, which is transferred from the data bus DBI by means of the driver 330, is transferred to corresponding I/O line pairs selected by the I/O precharge and selection circuit 38. Since the data transmission is alternately accomplished every two pairs, if first I/O line pairs $I/O_0$, $\overline{I/O_0}$ and $I/O_1$, $\overline{I/O_1}$ of the left side I/O bus 26R, which are correspondingly connected with the first PIO line pairs $PIO_0$, $\overline{PIO_0}$ and $PIO_1$, $\overline{PIO_1}$, are transferring data thereon, second PIO line pairs $PI_2$, $\overline{PIO_2}$ and $PIO_3$, $\overline{PIO_3}$ and second I/O line pairs $I/O_2$, $\overline{I/O_2}$ and $I/O_3$, $\overline{I/O_3}$ of the left I/O bus 26R will be precharging.

COLUMN CONTROL CIRCUIT

Column control circuit is a circuit for generating control signals to control circuits related to the data paths.

Figure 4:
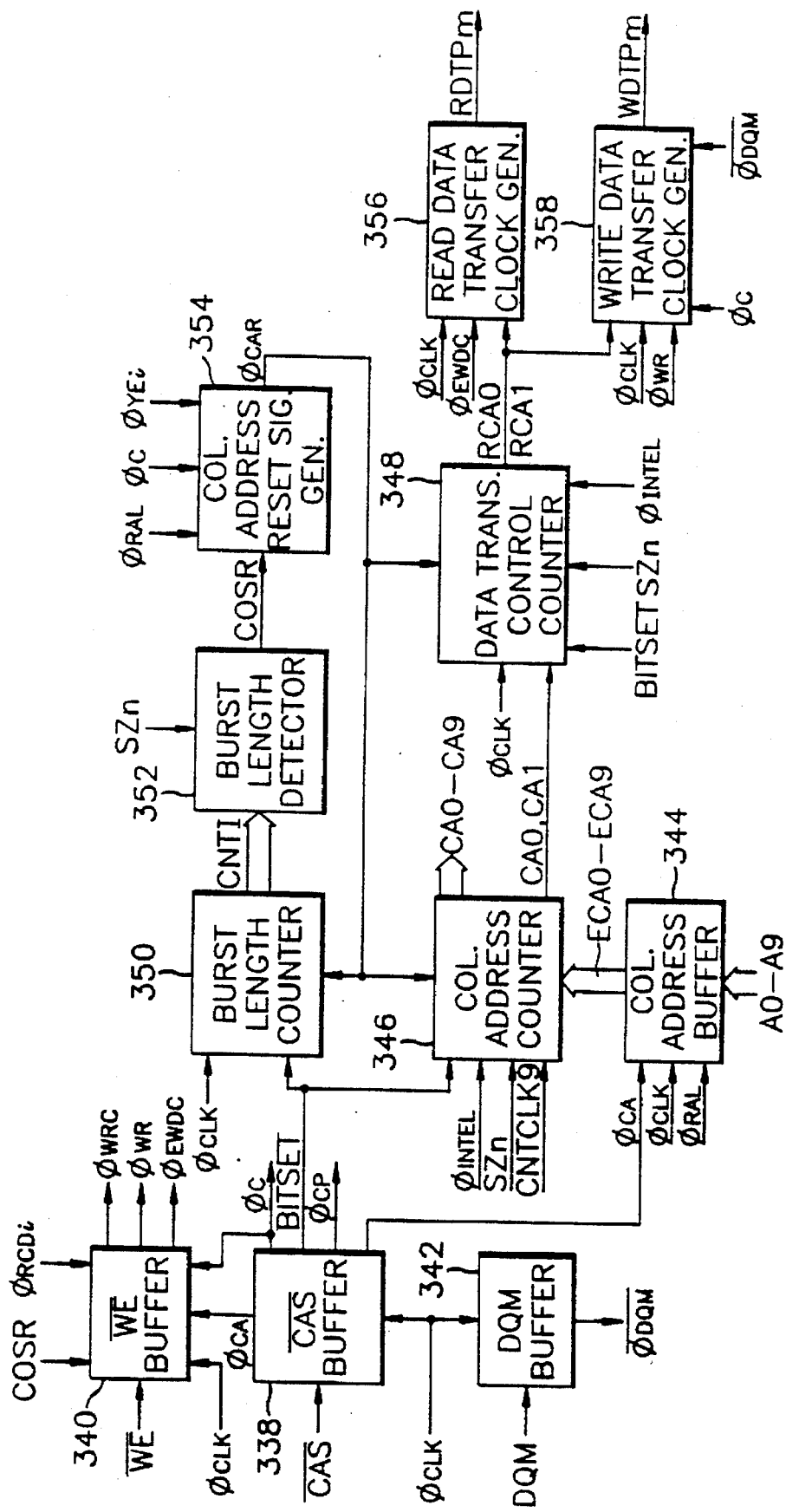
FIG. 4 is a schematic block diagram showing a column control circuit according to the present invention.

FIG. 4 is a schematic block diagram showing the column control circuit according to the present invention. In the drawing, a $\overline{CAS}$ buffer 338 receives the external column address strobe signal $\overline{CAS}$ and the internal system clock $\phi_{CLK}$ and then generates pulse signals $\phi_C$, $\phi_{CA}$, BITSET and $\phi_{CP}$.

A $\overline{WE}$ buffer 340 receives the external write enable signal $\overline{WE}$, the system clock $\phi_{CLK}$, the pulse signals $\phi_C$ and $\phi_{CA}$ from the $\overline{CAS}$ buffer 338 and various control signals for generating write control signals $\phi_{WR}$, $\phi_{EWDC}$ and $\phi_{WRC}$ in a write operation.

A DQM buffer 342 receives external signal DQM and the internal system clock $\phi_{CLK}$, and then generates a data input/output masking signal $O_{DQM}$ to inhibit the input and the output of data.

A column address buffer 344 receives external column addresses $A_0$ to $A_9$ in synchronism with the system clock $\phi_{CLK}$, thereby latching the column addresses in response to the pulse signal $\phi_{CA}$ from the $\overline{CAS}$ buffer 338, and then producing column address signals ECA0 to ECA9.

A column address generator 346 is a counter circuit which is composed of a predetermined number of stages or bits (nine bits in the present embodiment). The counter may carry out counting operation either in a sequential or binary address mode or in an interleave address mode according to the column addressing mode signal $\phi_{INTEL}$. Stages of the counter latch the column address signals from the column address buffer 344 in response to the pulse BITSET, and lower stages thereof associated with the burst length signal SZn perform the counting operation with the clock CNTCLK9, starting from the column address signals latched therein, and then produce successive column address signals according to a selected address mode. However, remaining stages produce initial column address signals latched therein. A column address, reset signal $\phi_{CAR}$ is a signal for resetting the counter at the end of the burst length, i.e., after completion of a valid data output.

A burst length counter 350 is a conventional 9-stage (or 9-bit) binary counter counting pulses of the clock $\phi_{CLK}$ after being reset by the pulse signal BITSET from the $\overline{CAS}$ buffer. The counter 350 may also be reset by the column address reset signal $\phi_{CAR}$. Since the BITSET signal is a pulse generated upon activation of $\overline{CAS}$, the counter 350 is re-count the number of pulses of the clock $\phi_{CLK}$ after the activation of $\overline{CAS}$. However, the signal $\phi_{CAR}$ is a signal stopping the counting operation of the counter 350. Thus, in a $\overline{CAS}$ interrupt operation, the activation of $\overline{CAS}$ during the output of valid data renders the counting operation of the counter to restart.

A burst length detector 352 receives the counting value from the counter 350 and the burst length signal SZn from previously mentioned mode set circuit 58, and then generates a signal COSR indicating of the end of the burst.

A column address reset signal generator 354 serves to generate the signal $\phi_{CAR}$ resetting the column address generator 346 in response to the burst end signal COSR.

A data transfer control counter 348 is a counter which receives address signals CA0, CA1, FCA0 and FCA1 and then generates column address signals RCA0 and RCA1 synchronous to the system clock $\phi_{CLK}$. The clock CNTCLK9 is a clock artificially generated to shorten the precharge time when the system clock CLK of 33 MHZ or less is employed as previously discussed. Thus, in this case, the column address signals CA0 and CA1 is not signals synchronized with the system clock $\phi_{CLK}$. Thus, the counter 348 exists in consideration of the reduction of the precharge time at the system clock of 33 MHZ or less. If unnecessary, the column address generator 346 receives $\phi_{CLK}$ in place of CNTCLK9, and a read and a write data transfer clock generators 356 and 358 may receive the column address signals CA0 and CA1 instead of the outputs of the counter 348, i.e., RCA0 and RCA1.

The read data transfer clock generator 356 receives the column address signals RCA0 and RCA1 synchronized with the system clock $\phi_{CLK}$ and then generates read data transfer pulses RDTPm to output a serial data from the data output multiplexer 268 in a read operation.

The write data transfer clock generator 358 receives the signals RCA0 and RCA1 and then generates write data transfer pulses WDTPm to output a time multiplexed parallel data from the data input demultiplexer 314 in a write operation.

The write data transfer clock generator 358 receives the signals RCA0 and RCA1 and then generates write data transfer pulses WDTPm to output a time multiplexed parallel data from the data input demultiplexer 314 in a write operation.

1. $\overline{CAS}$, $\overline{WE}$ and DQM Buffers

Figure 29:
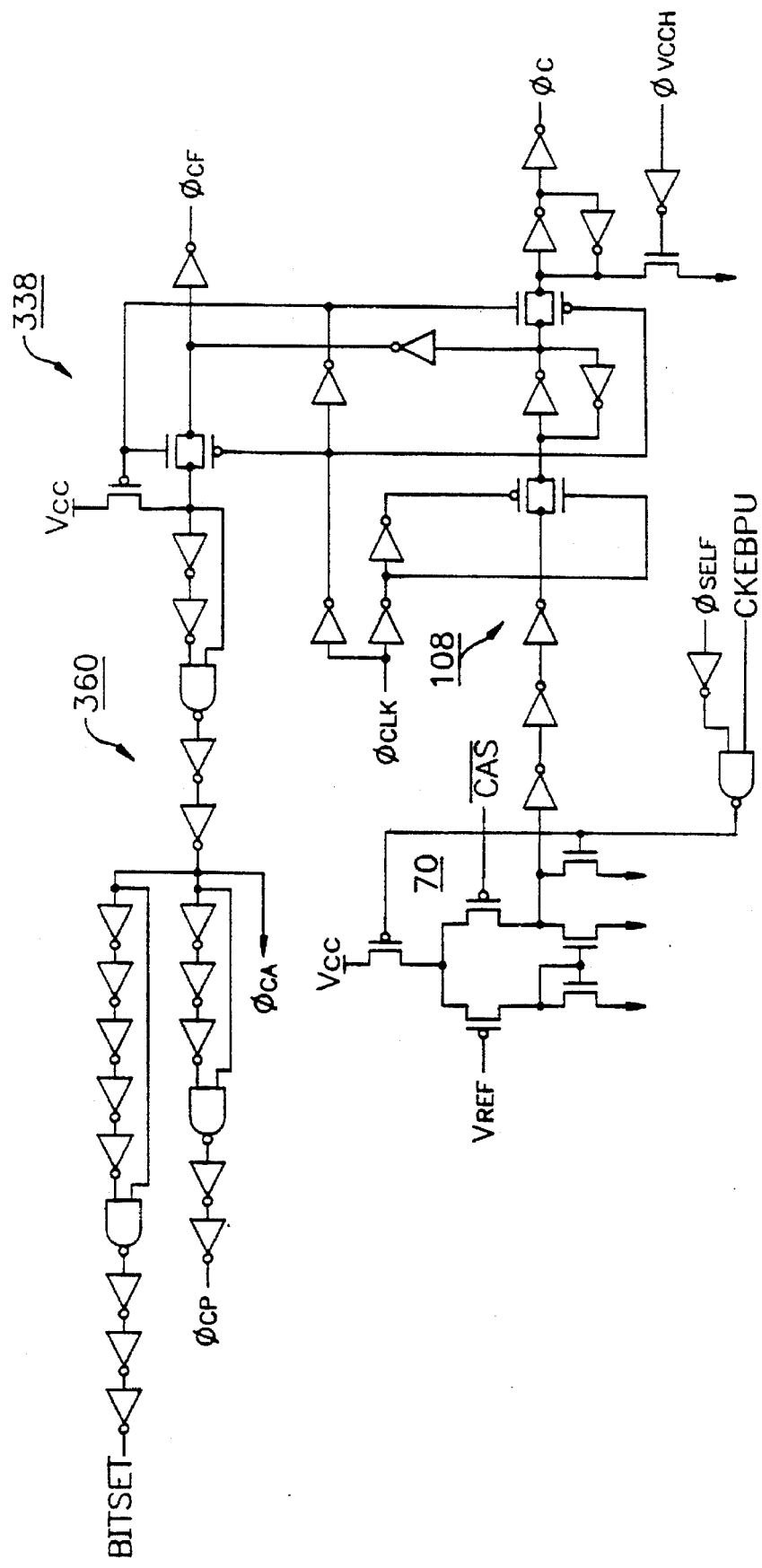
FIG. 29 is a schematic circuit diagram for a $\overline{CAS}$ buffer according to the present invention.
Figure 33A:
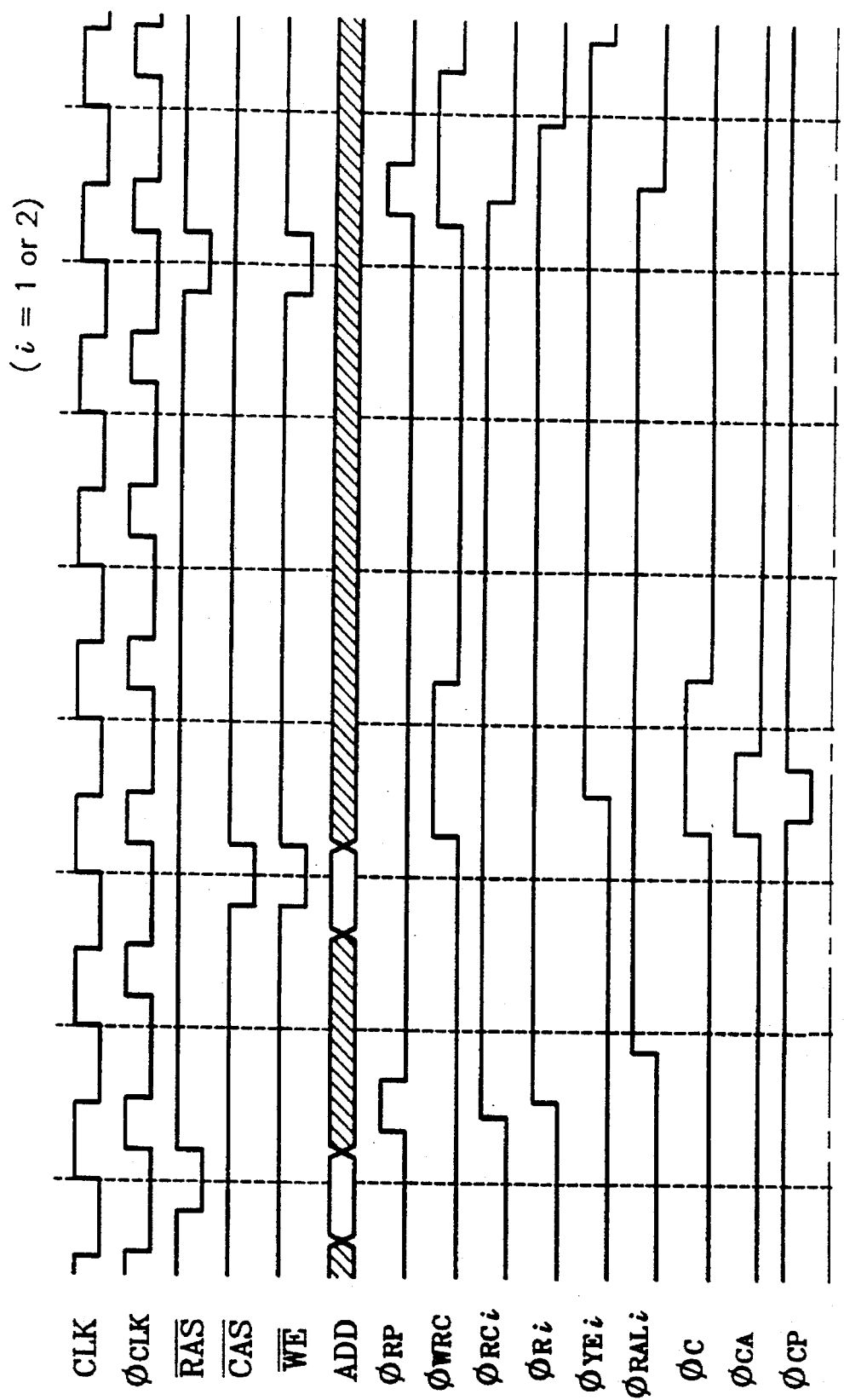
FIGS. 33a, 33b and 33c are a timing diagram showing a writing operation according to the present invention.
Figure 33B:
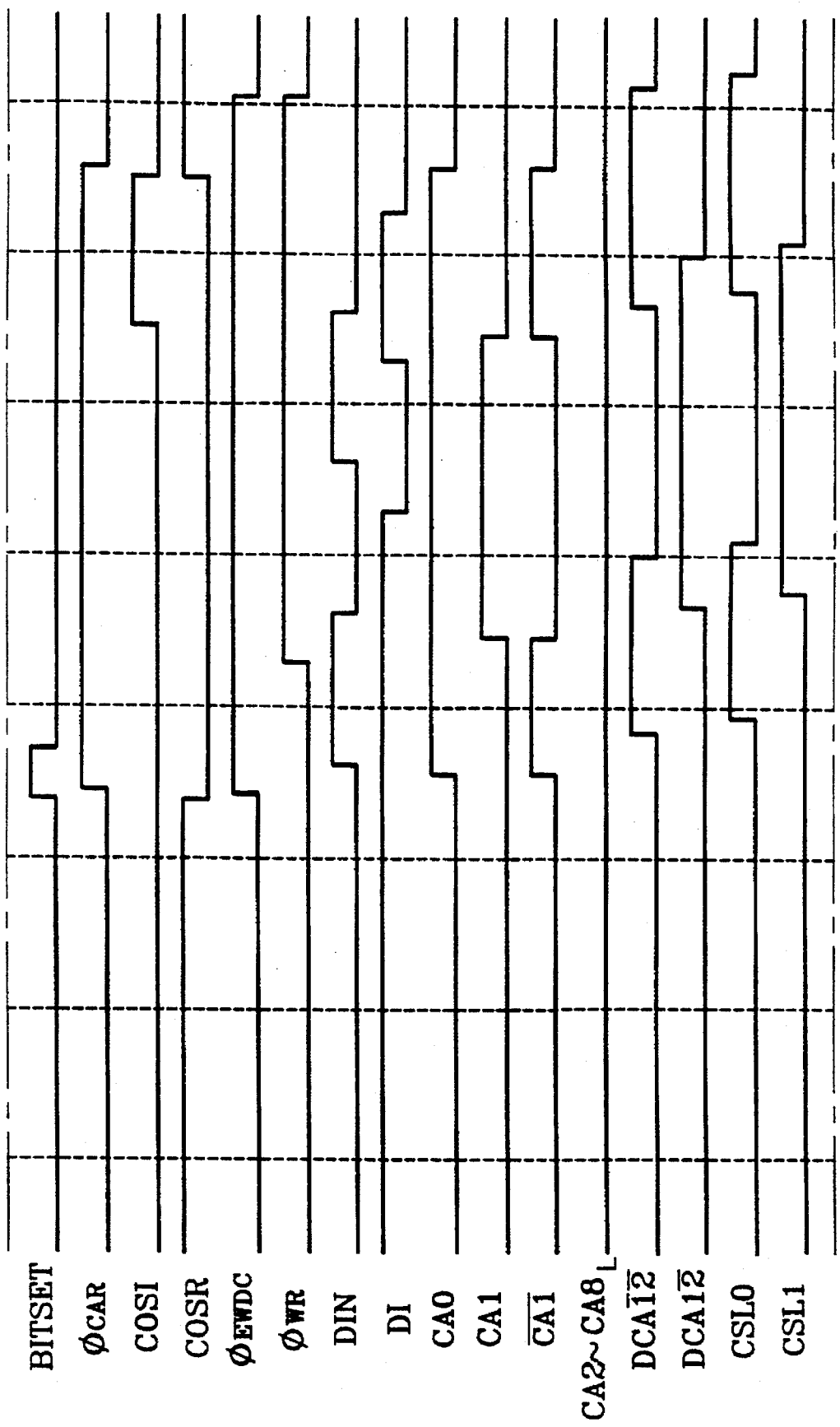
Figure 33C:
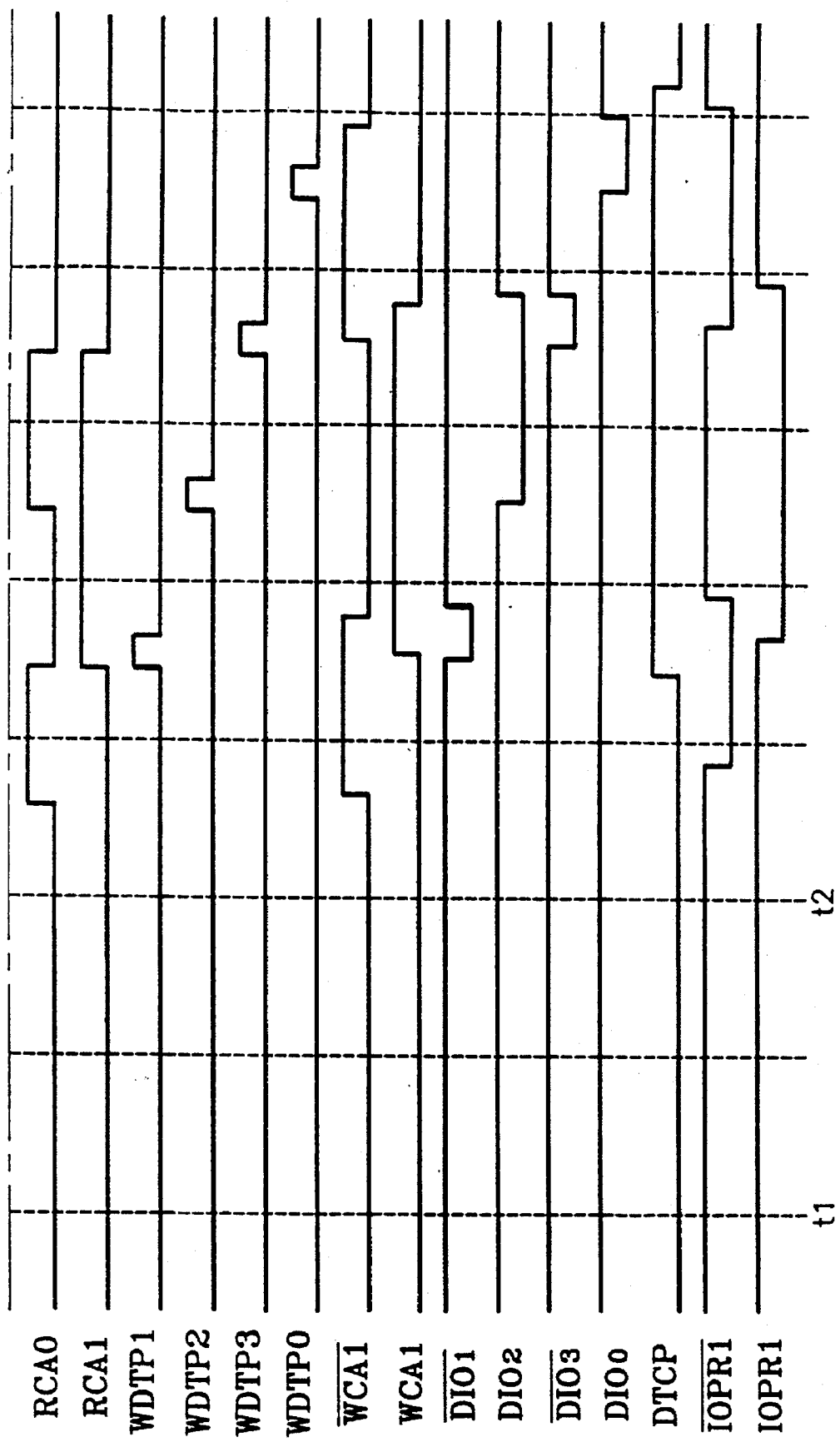

FIG. 29 is a drawing showing a schematic circuit diagram for the $\overline{CAS}$ buffer 338, and FIG. 33 is a drawing showing a timing diagram of a write operation employing system clock of 66 MHZ, burst length of 4 and $\overline{CAS}$ latency of 2.

In FIG. 29, an input buffer 70 is a circuit which is disabled in refresh and clock masking operations and converts input signals into internal CMOS level signals in read and write operations. A synchronization circuit 108 is connected to the input buffer 70 to synchronize the CMOS level $\overline{CAS}$ signal from the input buffer with the system clock $\phi_{CLK}$. A pulse generator 360 is connected to the synchronization circuit 108 to generated control pulses $\phi_{CA}$, $\phi_{CP}$ and BITSET. Referring to FIG. 33, the pulses $\phi_C$, $\phi_{CA}$, $\phi_{CP}$ and BITSET are generated by the $\overline{CAS}$ pulse being at a low level at time $t_3$. The high level pulse width of $\phi_C$ is about one cycle of the system clock CLK, and the pulse width of $\phi_{CA}$ is about one half cycle of the clock CLK while the pulse widths of $\phi_{CP}$ and BITSET are about 5 to 6 nsec.

Figure 30:
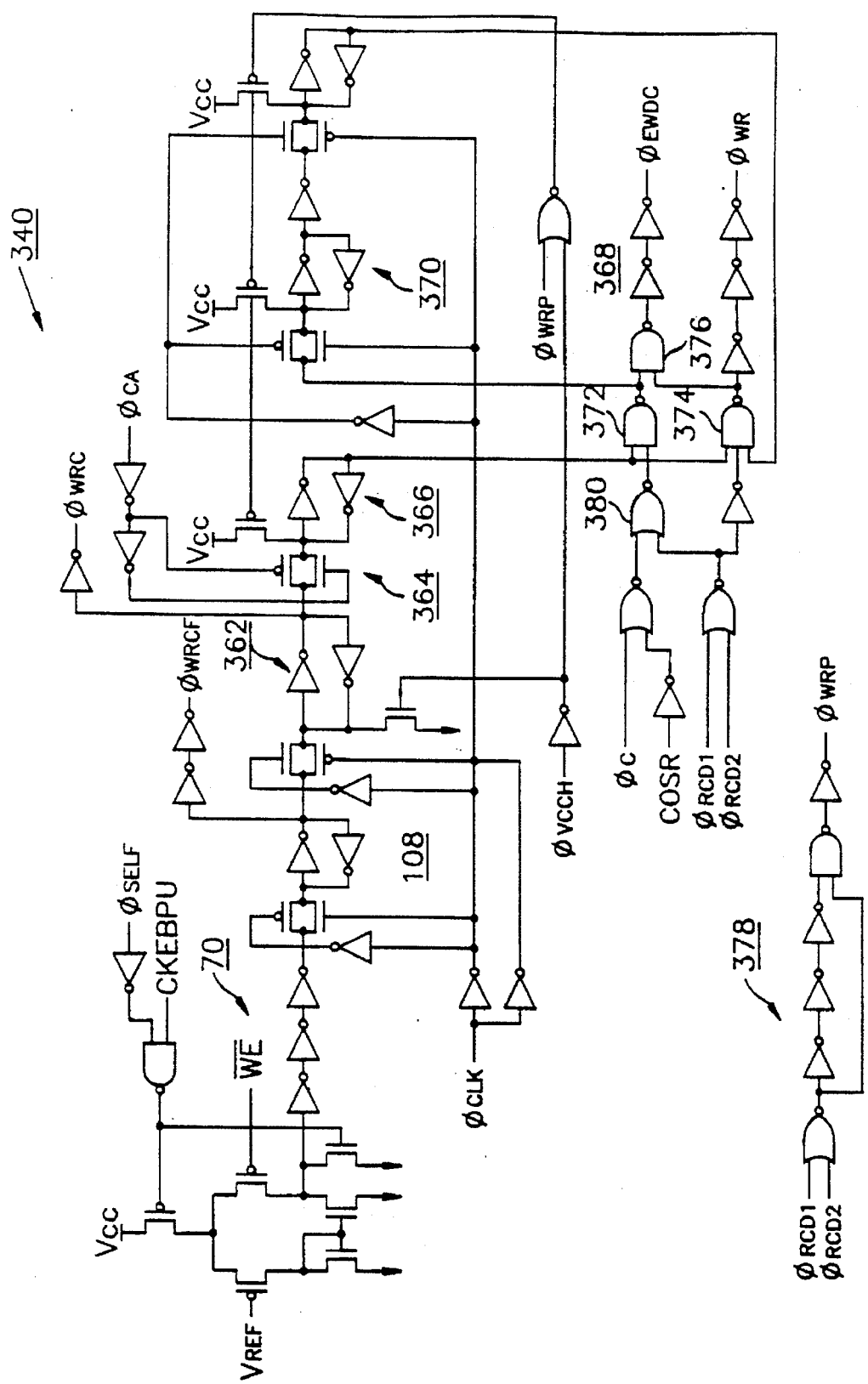
FIG. 30 is a schematic circuit diagram for a $\overline{WE}$ buffer according to the present invention.

FIG. 30 is a drawing showing a schematic circuit diagram for the $\overline{WE}$ buffer 340. In the drawing, an input buffer 70 is a circuit for converting the external write enable signal $\overline{WE}$ into and internal CMOS level signal. A synchronization circuit 108 stores the level shift signal from the input buffer 70 into a latch 362 in synchronism with the system clock $\phi_{CLK}$. The input of a latch 366 is coupled to the output of the latch 362 via a transfer switch 364 turned on by the activation of $\overline{CAS}$ for storing a high level thereinto in a write operation. A gate circuit 368 comprised of gates is connected to the output of the latch 366. A shift register 370 is connected to the gate circuit 368 for delaying one cycle of CLK after a write command. A pulse generator 378 generates a short high level pulse $\phi_{WRP}$ in a precharge cycle for resetting the shift register 370 and the latch 366. Referring to FIG. 33, when $\phi_{CA}$ is at a high level after issuance of a write command at time $t_3$, the latch 366 stores a high level. Since $\phi_C$ and at least one of $\phi_{RCD1}$ and $\phi_{RCD2}$ are also at high levels at that time as discussed hereinabove, a NAND gate 372 outputs a low level, thereby forcing a control signal $\phi_{EWDC}$ to go high. The low level output of the NAND gate 372 inputs to the shift register 370, thereby outputting low level therefrom after a delay of one cycle of $\phi_{CLK}$. Then, a NAND gate 374 outputs a high level, thereby causing the control signal $\phi_{WR}$ to go high. Generating the control signal $\phi_{WR}$ after a delay of one cycle of CLK is to accept an external input data at a next cycle of CLK after a write command. Thus, to accept an external input data at a write command cycle, it will be obvious to those skilled in the art that the shift register 370 may be omitted therefrom.

Figure 31:
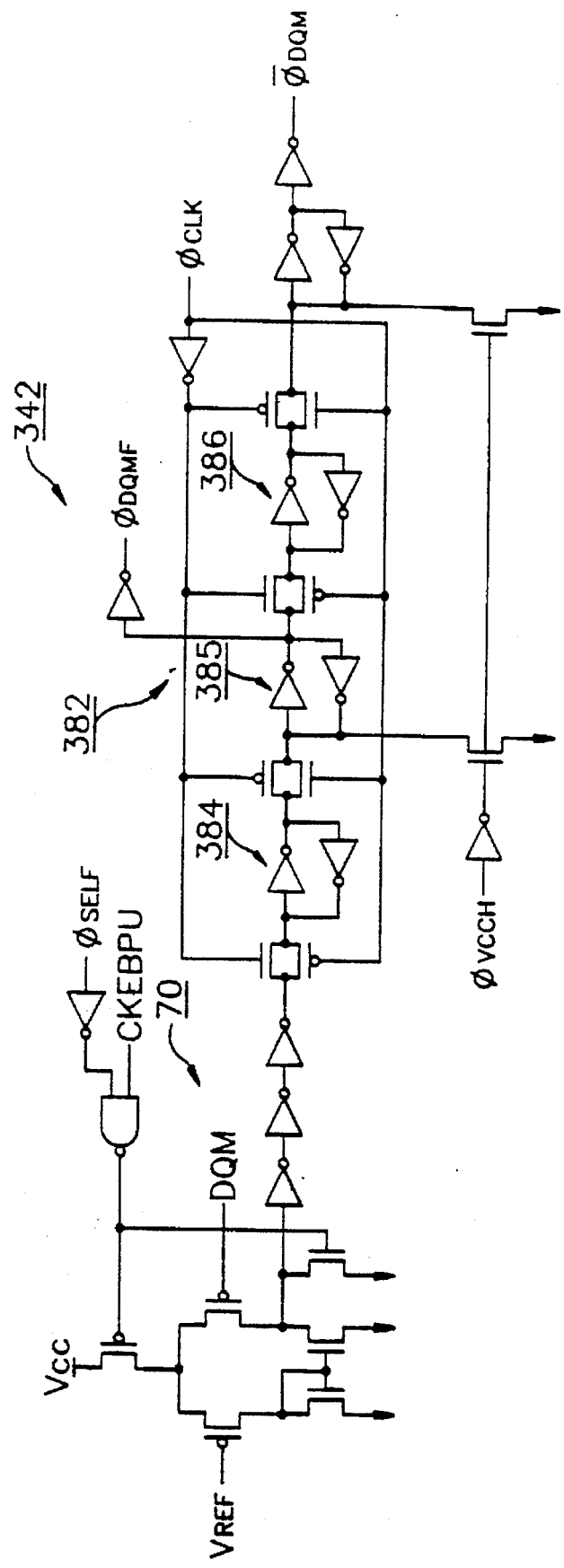
FIG. 31 is a schematic circuit diagram for a DQM buffer according to the present invention.
Figure 32:
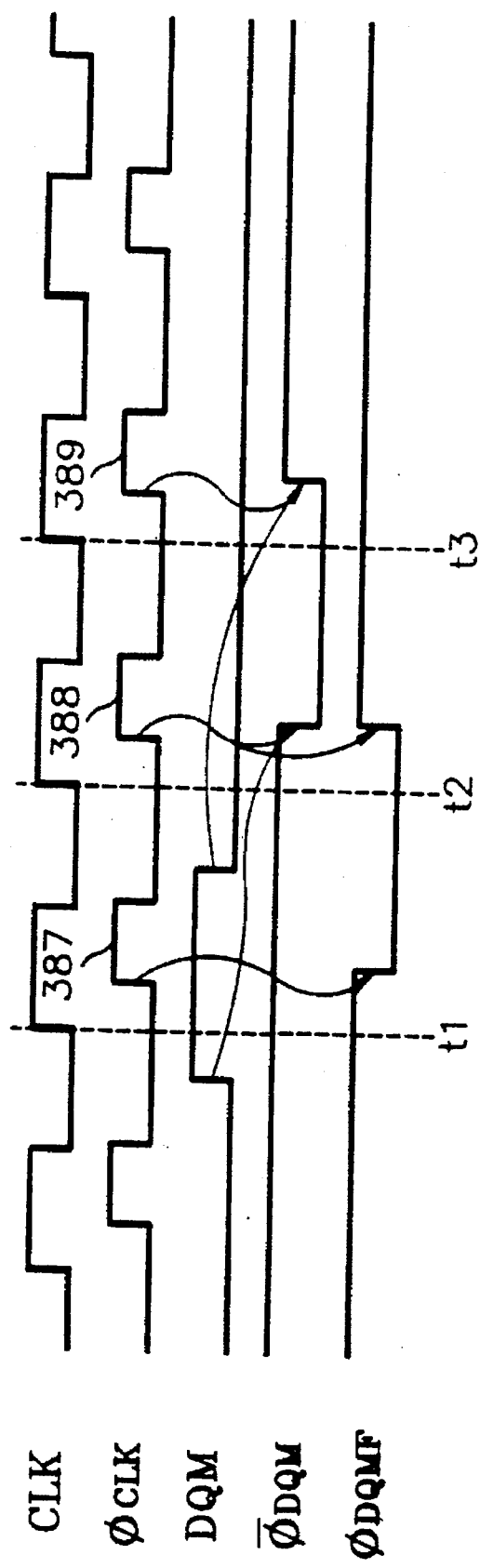
FIG. 32 is a timing diagram showing the operation of the DQM buffer if FIG. 31.

FIG. 31 is a drawing showing a schematic circuit diagram for the DQM buffer 342, and FIG. 32 is a drawing showing an operation timing diagram for the DQM buffer. Referring to FIG. 31, an input buffer 70 is a buffer for converting an external signal DQM into a CMOS level signal. A shift register 382 is connected to the input buffer 70 for generating a data output masking signal $O_{DQM}$ in synchronism with the system clock $\phi_{CLK}$. Referring to FIG. 32, a data output masking command is issued at time $t_1$. At this time, a latch 384 stores a low level. When $\phi_{CLK}$ 387 is then at a high level, a latch 385 stores a high level. When $\phi_{CLK}$ 387 is then at a low level, a latch 386 stores a high level. When $\phi_{CLK}$ 388 is then at a high level, the signal $\phi_{DQM}$ goes to a low level. Likewise, the signal $\phi_{DQM}$ goes to a high level when $\phi_{CLK}$ 389 is at a high level. Thus, inhibiting data output from the data output buffer with $O_{DQM}$ signal being at the low level is accomplished by responding to the rising edge of the second clock of $\phi_{CLK}$ after the issuance of the data output masking command. It will be obvious to those skilled in the art that the time adjustment of inhibiting data output therefrom may be accomplished by changing the number of shift stages.

2. Column Address Generator

The column address generator comprised of a column address buffer 214 and a column address counter 346.

Figure 34:
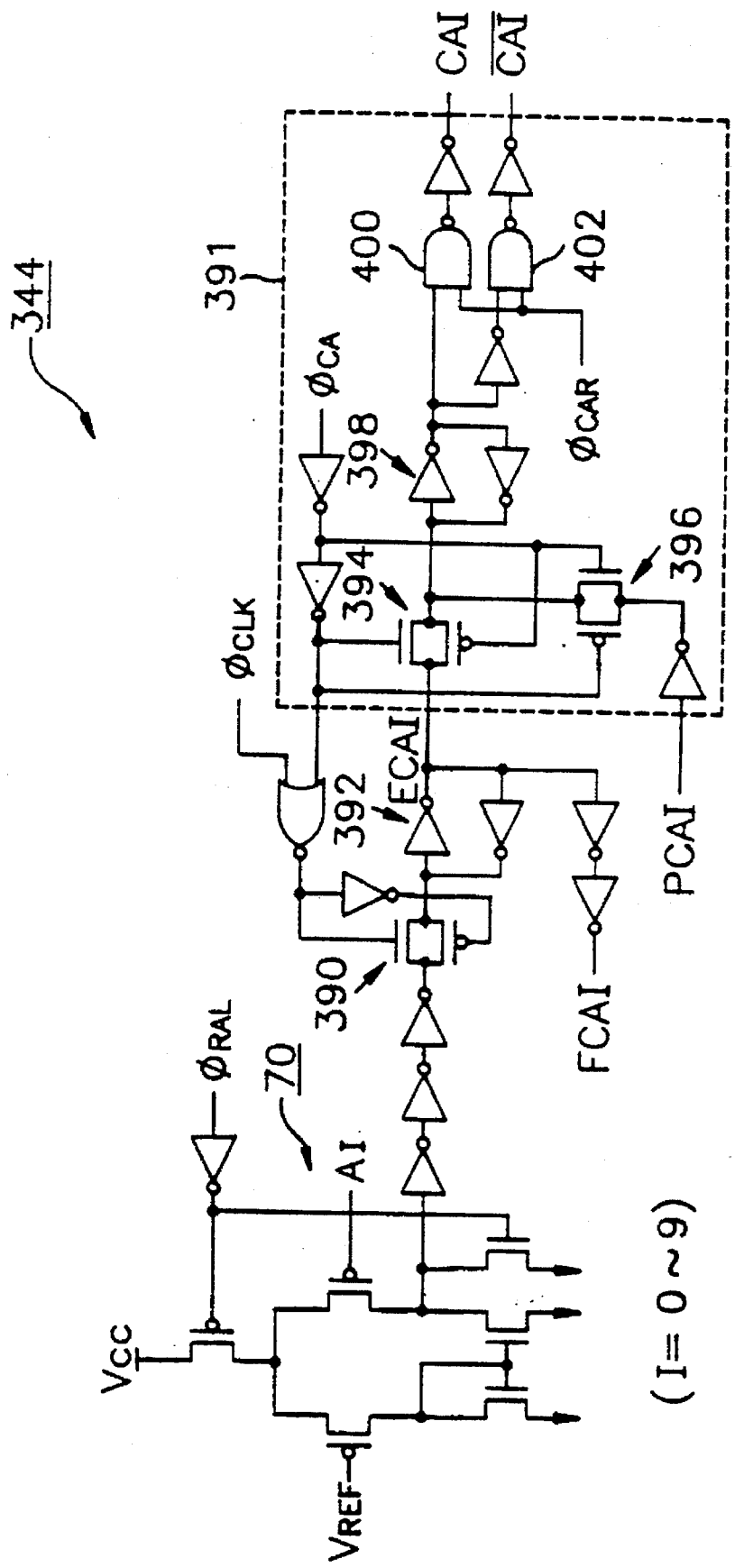
FIG. 34 is a schematic circuit diagram for a column address buffer according to the present invention.

FIG. 34 is a drawing showing a schematic circuit diagram for the column address buffer 344. The synchronous DRAM of the present embodiment uses ten column address buffers which receive external column addresses $A_0$ to $A_9$, respectively. In the drawing, an input buffer 70 is a buffer for converting the external column address signal $A_I$ into a CMOS level address signal. The input buffer 70 is enabled by the signal $\phi_{RAL}$ and its output is coupled to a latch 392 via a transfer switch 390. Before $\phi_{CA}$ goes to a high level, the latch 392 stores an input column address signal ECAI and then produces a column address signal FCAI via inverters. Only signals FCA0 and FCA1 are fed to the data transfer control counter 348. When $\phi_{CA}$ is at the high level due to the activation of $\overline{CAS}$, a transfer switch 394 is turned on, thereby storing complement of the column address signal ECAI into a latch 398. The output of the latch 398 is coupled to switch means comprised of NAND gates 400 and 402 which is enabled by $\phi_{CAR}$. The enabled NAND gates 400' and 402 provide column address signal CAI and its complement $\overline{CAI}$, respectively. The column address signals CAI are fed and loaded to the column address counter 346, thereby generating successive column address signals PCAI therefrom with counting operation starting from the loaded column address signal. The signals PCAI output as column address signals CAI and $\overline{CAI}$ via transfer switches 396, latches 398 and switches 400 and 402. Thus, transfer switches 394 and 396, latch 398 and switch 400 and 402 constitute means for providing a starting column address with $\phi_{CA}$ pulse generated by the activation of $\overline{CAS}$, and providing successive column address signals being counted from the starting column address when the pulse $\phi_{CA}$ is at a low level. Thus, after the activation of $\overline{CAS}$ the successive column addresses, i.e., serial steam of the external input column address and the internally generated column addresses can be generated at a high speed. It should be noted that in the present embodiment, column address buffers associated with column address signals CA0 and CA9 do not receive signals PCA0 and PCA9. The signals CA9 has no relationship with the column decoder because of using as a bank selection signal in case of executing a $\overline{CAS}$ interrupt operation. Signals CA0 and CA1 are also signals for generating read data transfer clocks RDTPm and write data transfer clocks WDTPm which are respectively used in the data output multiplexer 268 and the data output demultiplexer 314. Signals CA1 to CA8 are utilized for column decoding.

Figure 35:
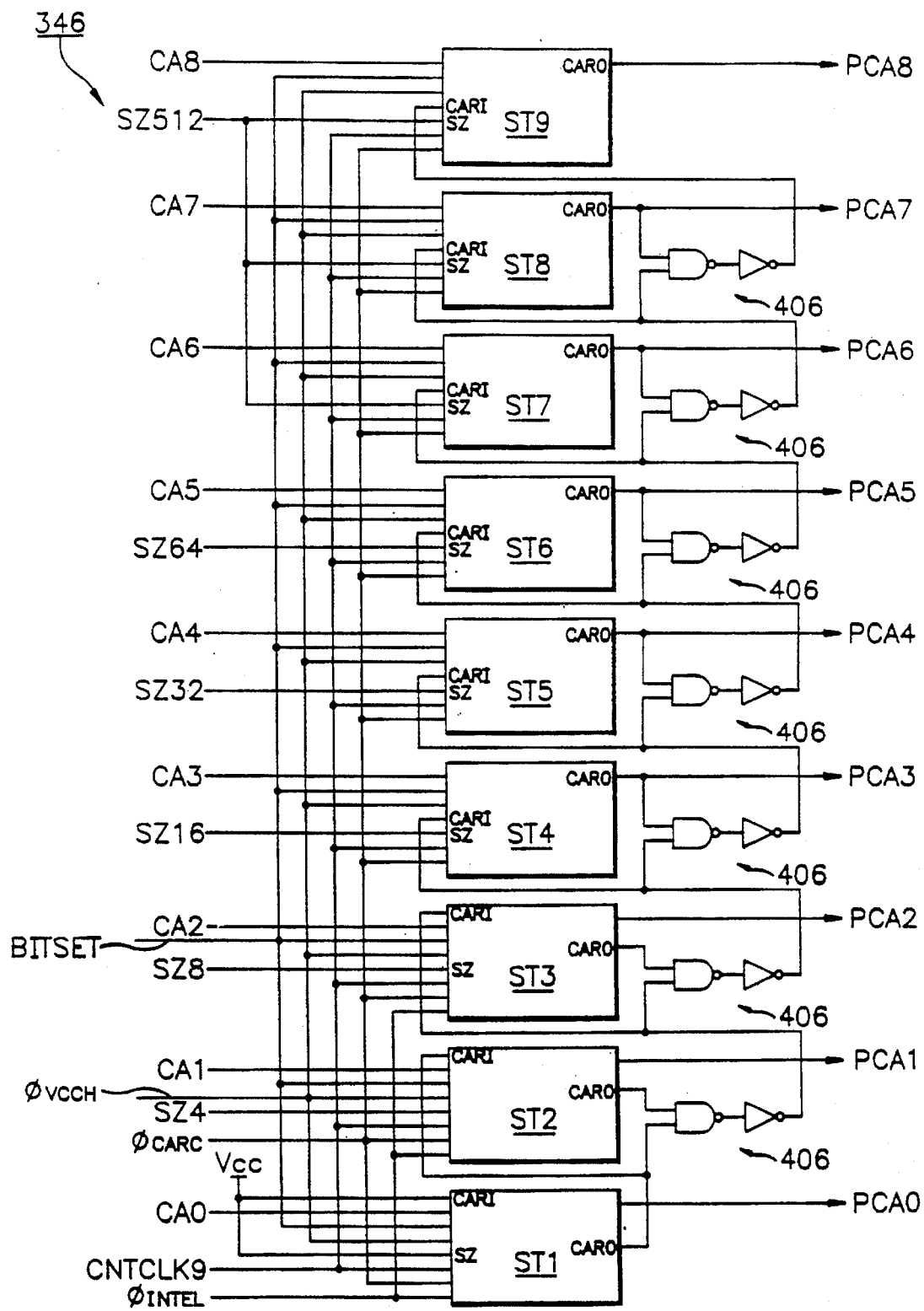
FIG. 35 is a schematic block diagram for a column address counter according to the present invention.

FIG. 35 is a drawing showing a schematic block diagram for the column address counter 346, and FIG. 36 is a drawing showing a schematic circuit diagram for each stage in the column address counter. Referring to the drawings, the column address counter 346 is a 9-bit counter comprised of nine stages ST1 to ST9, and comprises a first counter portion including lower stages ST1 to ST3 and AND gates 404 and a second counter portion including upper stages ST4 to ST9 and AND gates 406. The first counter portion may carry out counting operation in one of binary and interleave modes, and the second counter portion may perform counting operation in the binary mode. In the first counter portion, i.e., 3-bit counter, selection of either the binary or the interleave mode is enforced by the logic level of the address mode signal $\phi_{INTEL}$. In the least significant stage ST1, an input terminal of a carry input signal CARI and a burst length input terminal SZ are connected to the supply potential Vcc. Carry output signal CARO of the first stage ST1 inputs to a carry input signal CARI of the second stage ST2, and AND gate 404 corresponding to the second stage ST2 ANDs the carry outputs of the first and second stages ST1 and ST2. AND gate 404 corresponding to the third stage ST3 ANDs a carry output of the third stage ST3 and the output of the AND gate corresponding to the second stage ST2 which is connected to a carry input of the third stage ST3. The output of the AND gate associated with the most significant stage ST3 of the first counter portion is connected to a carry input signal CARI of the least significant stage ST4 of the second counter portion. A carry input signal CARI of each stage in the second counter portion is coupled to the output of the AND gate of the previous stage. Each AND gate 406 of the second counter portion inputs the output of the AND gate of previous stage and the output of the corresponding stage.

The column address counter 346 of the present invention may selectively perform one of both the binary and the interleave modes as an address sequence in order to enhance a design flexibility for memory system designers. The binary addressing mode is a mode representative of generating successive addresses increasing by one from a given starting address, and the interleave addressing mode is a mode representative of generating successive addresses in a specific way. The following Table 3 represents the address sequence representative of the decimal number in case of the burst length of 8.

TABLE 3

| Address Sequence (Burst Length n = 8) | |
|---|---|
| Binary Mode | Interleave Mode |
| 0,1,2,3,4,5,6,7 | 0,1,2,3,4,5,6,7 |
| 1,2,3,4,5,6,7,0 | 1,0,2,3,5,4,7,6 |
| 2,3,4,5,6,7,0,1 | 2,3,0,1,6,7,4,5 |
| 3,4,5,6,7,0,1,2 | 3,2,1,0,7,6,5,4 |
| 4,5,6,7,0,1,2,3 | 4,5,6,7,0,1,2,3 |
| 5,6,7,0,1,2,3,4 | 5,4,7,6,1,0,3,2 |
| 6,7,0,1,2,3,4,5 | 6,7,4,5,2,3,0,1 |
| 7,0,1,2,3,4,5,6 | 7,6,5,4,3,2,1 |

Figure 36A:
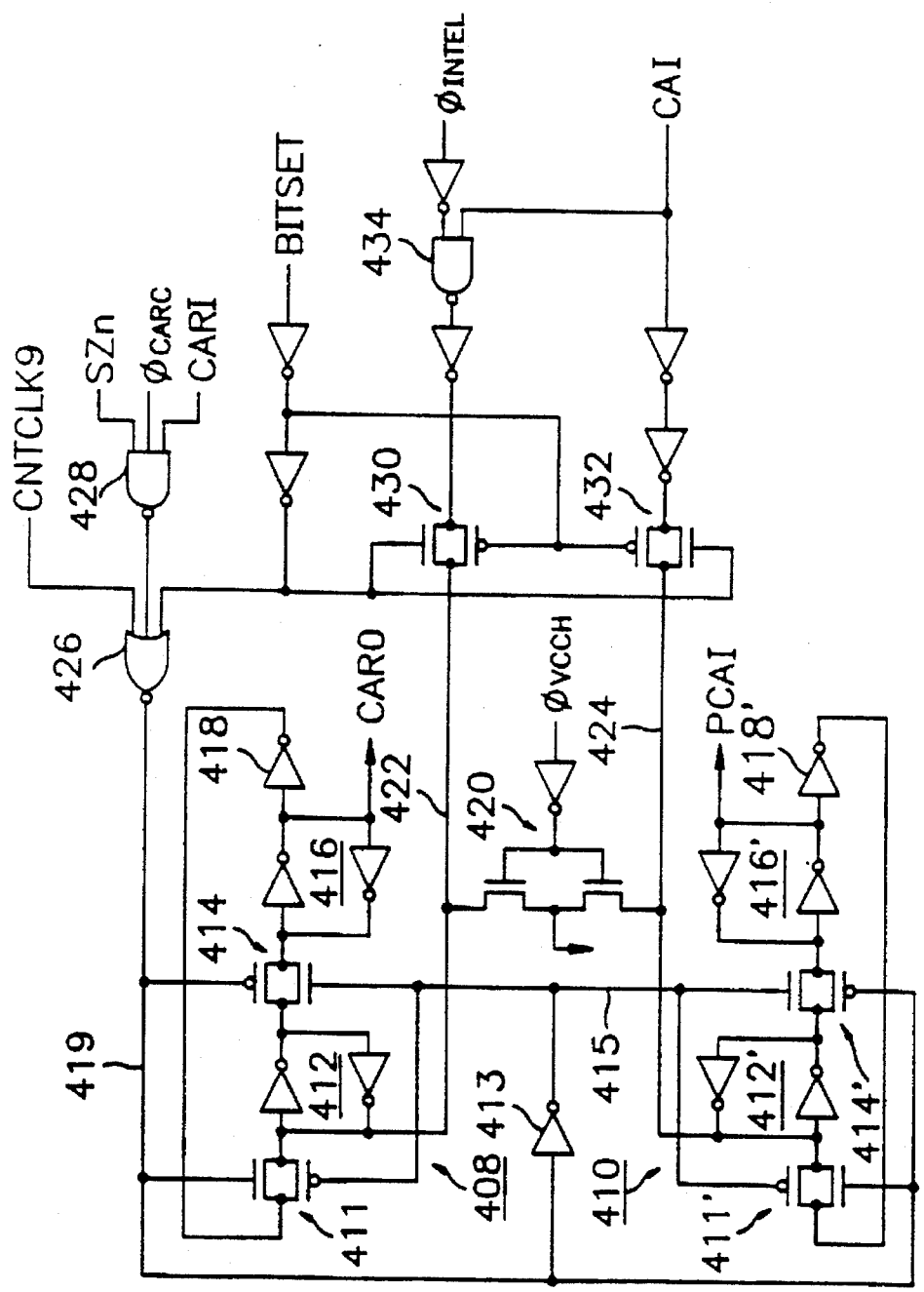
FIG. 36a and 36b are schematic circuit diagram for each stage which constitutes a first counting portion in FIG. 35.

FIG. 36a is a drawing showing a schematic circuit diagram for each stage of the first counter portion. Referring to the drawing, each stage of the first counter portion includes a carry portion 408 for generating a carry and a bit portion 410 for providing a bit output. The carry portion 408 comprises two latches 412 and 416, a transfer switch 414 connected between the latches 412 and 416, an inverter 418 and a transfer switch 411 connected in series between an output terminal of the latch 416 and an input terminal of the latch 412. Likewise, the bit portion 410 also comprises latches 412' and 416', transfer switches 411' and 414' are connected to a line 419 and a line 415 via an inverter 413. Input terminals of latches 412 and 412' are connected to lines 422 and 424, respectively. An initialization circuit 420 is connected between the lines 422 and 424 for providing an initial condition, i.e., a low level upon power-on to the latches 412 and 412'. The line 419 is connected to an output terminal of a NOR gate 426, three input terminals of which are respectively coupled to the clock CNTCLK9, the output of a NAND gate 428 and the signal BITSET. The NAND gate 428 receives the burst length signal SZn, a signal $\phi_{CARC}$ and the carry signal CARI which is the previous carry output signal CARO. Transfer switches 430 and 432 are turned on in response to the signal BITSET and thereby transfers an initial carry value and an initial column address value (or an initial bit value) on lines 422 and 424, respectively. The mode control signal $\phi_{INTEL}$ is at a high level in the interleave mode and at a low level in the binary mode, as discussed hereinabove. Thus, the transfer switches 430 and 432 turned on in the interleave mode respectively transfer a low level and the initial bit value CAI, and the switches 430 and 432 both transfer the initial bit value CAI in the binary mode.

Figure 37:
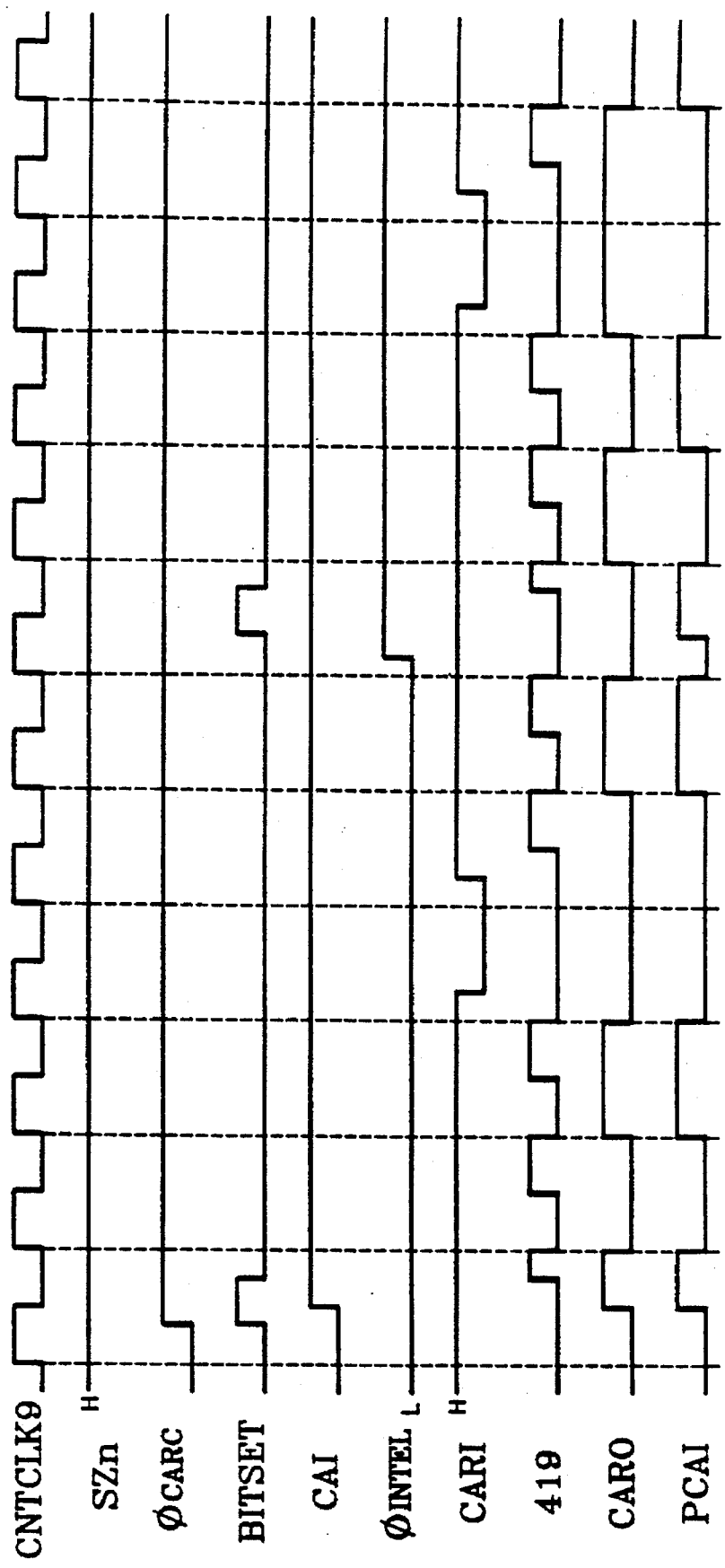

FIG. 37 is an operation timing diagram for the circuit diagram of FIG. 36a. Referring to FIGS. 36a and 37, when any one of input signals SZn, $\phi_{CARC}$ and CARI of NAND gate 428 is at a low level, NOR gate 426 inhibits the output of the clock CNTCLK9, maintaining a low level on the line 419. Thus, transfer switches 414 and 414' are in on states while transfer switches 411 and 411' are in off states. At this time, once transfer gates 430 and 432 are turned on with the pulse signal BITSET at a high level, the carry output signal CARO and the bit output signal PCAI are respectively an initial carry value of a low level and an initial bit value in an interleave mode while the carry output signal CARO and the bit output signal PCAI are both initial bit values CAI in a binary mode. Then the low level signal BITSET turns off the transfer switches 430 and 432 and thereby causes the previously preset initial carry and bit values to be maintain thereon. Thus, the signal BITSET is a signal for respectively presetting initial carry and bit values into the carry portion 408 and the bit portion 410 according to the mode control signal $\phi_{INTEL}$.

On the other hand, after the establishment of the initial values with the preset signal BITSET, when the signals SZn, $\phi_{CARC}$ and CARI are all at high levels, the NOR gate 426 outputs the clock CNTCLK9. Then, the carry portion 408 and the bit portion 410 respectively output binary sequential count values starting from the preset initial values every cycles of the clock CNTCLK9. During such a sequential operation, if a low level carry signal CARI inputs to the NAND gate 428, the line 419 becomes a low level, thereby freezing operations of the carry portion 408 and the bit portion 410. That is, since transfer switches 411 and 411' are turned off, CARO and PCAI are respectively frozen to inverted ones of binary values stored in latches 412 and 412'. When the signal CARI then goes to a high level, sequential operations are re-started beginning from the frozen values.

Figure 36B:
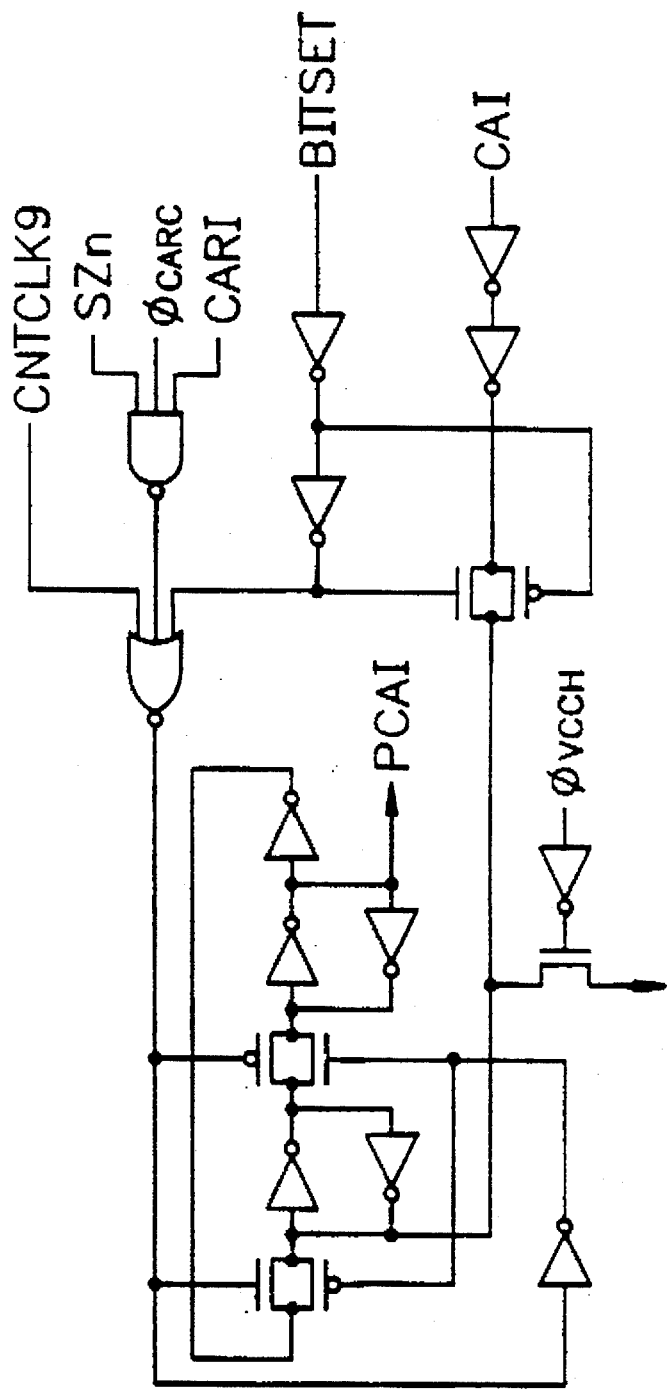

FIG. 36b is a diagram showing a schematic circuit diagram for each stage constituting the second counter portion of FIG. 35. Constructions of this stage are identical to those excluding the carry portion 408 and the mode control circuit 434 in the stage of FIG. 36a. Its operation is also identical to that of the bit portion 410 of FIG. 36a. Thus, detailed explanation for each of the stages ST4 to ST9 will be omitted.

Returning to FIG. 35, it is assumed that the burst length of n has been set by the operation mode program. Then, since burst length signals associated with burst length of n or less are all at high levels, only stages receiving high level burst length signals SZn are enabled. For example, if the burst length n is 512 (full pages), the column address counter operates as a 9-bit counter. If burst length of n=32 is programmed, five lower stages ST1 to ST5 perform sequential counting operations, and output signals PCA5 to PCA8 of upper stages ST6 to ST9 respectively maintain initial input bit values, i.e., input column address signals CA5 to CA8. Thus, the first counter portion comprised of three lower stages ST1 to ST3 outputs sequential binary or interleave address signals PCA0 to PCA2 according to the mode control signal $\phi_{INTEL}$, and the counter comprised of stages ST4 and ST5 outputs sequential binary address signals PCA3 and PCA4 starting from input column addresses CA3 and CA4, receiving carries from the first counter portion.

3. Column Decoder

As discussed hereinabove, the column address buffers.344 output column address signals CA1 to CA8 inputting to the column decoder for selecting columns.

Figure 38:
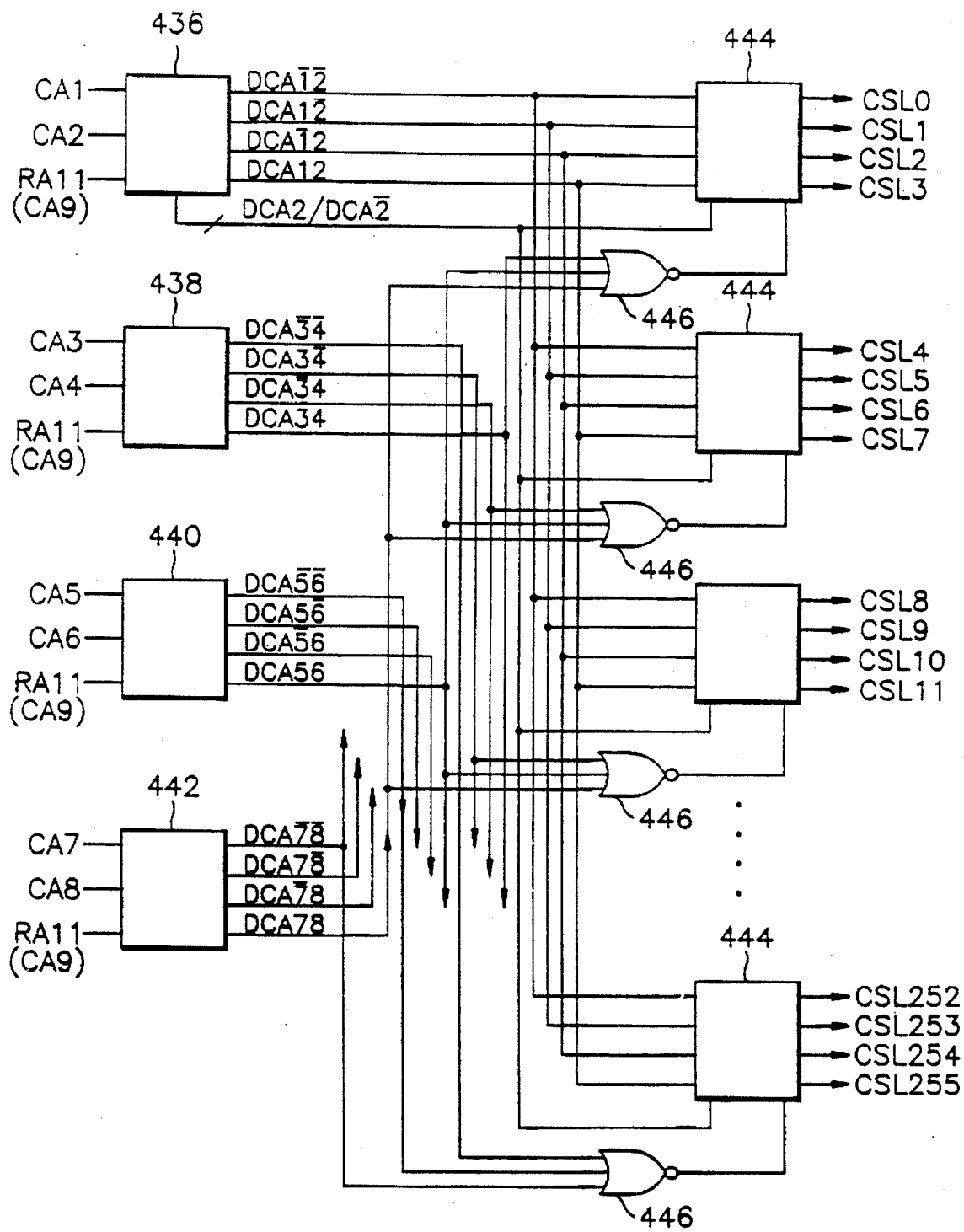
FIG. 38 is a schematic block diagram for a column decoder according to the present invention.

FIG. 38 is a drawing showing a schematic block diagram for the column decoder according to the present invention. In the drawing, predecoders 436 to 442 receive column address signals CA1 and CA2, CA3 and CA4, CA5 and CA6 and CA7 and CA8, respectively and also receive a row address signals RA11 or a column address signal CA9. The column address signal RA11 is used as a bank selection signals in case of performing either an interleave operation Of the first and second banks or an independent operation between both banks such as performing read or write operation and precharge operation of the second bank after performing read or write operation and precharge operation of the first bank. If RA11 is low, the first bank is selected, while if RA11 is high, the second bank is selected. On the other hand, CA9 is a bank selection signal in case of performing a $\overline{CAS}$ interrupt operation. The first bank is selected when CA9 is low, while the second bank is selected when CA9 is high.

The first predecoder 436 decodes column address signals CA1 and CA2, thereby generating predecode signals DCA$\overline{1}$ $\overline{2}$ to DCA12 and also generating a signal DCA2 and its complement DCA$\overline{2}$ which are faster than the signals DCA$\overline{1}$ $\overline{2}$ to DCA12. Neighboring signals of the predecode signals overlaps a predetermined portion of each end. The output signals of the first predecoder 436 are fed to main decoders 444. NOR gates 446 respectively input combinations of signals choosing one of predecode signals DCA$\overline{3}$ $\overline{4}$ to DCA34 from the predecoder 440 and one of predecode signals DCA$\overline{7}$ $\overline{8}$ to DCA78 from the predecoder 442, and their outputs are respectively coupled to the main decoder 444 so as to produce column selection signals CSL0 to CSL255.

Figure 39A:
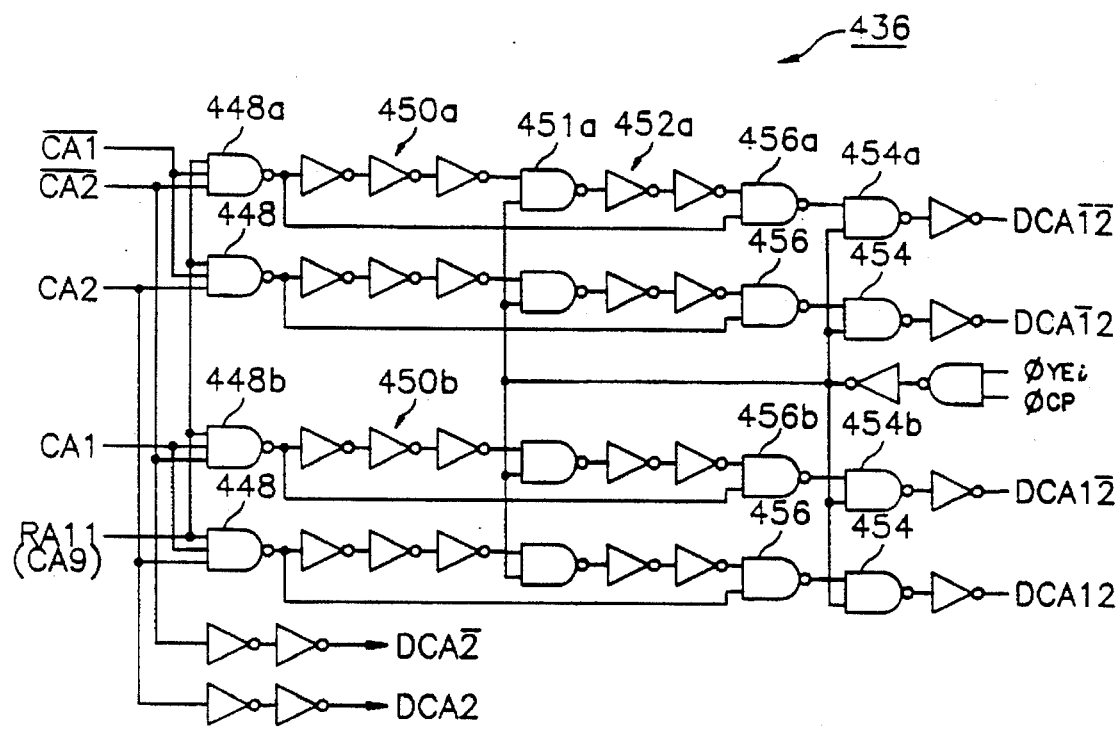
FIG. 39a is a schematic circuit diagram for a first predecoder in FIG. 38.

FIG. 39a is a drawing showing a schematic circuit diagram for the first predecoder 436. In the drawing, NAND gates 448 are enabled by the bank selection signal RA11 or CA9, decode column address signals CA1 and CA2 and their complements $\overline{CA1}$ and $\overline{CA2}$. After activation of $\overline{CAS}$, a short low level pulse $\phi_{CP}$ resets NAND gates 451 and 454, thereby causing the output signals DCA$\overline{1}$ $\overline{2}$ to DCA12 to become low. When φCPis then at a high level (at this time, φ$_{YEi}$ is high), the NAND gates 451 and 454 are enabled. It is now assumed that CA1 and CA2 have been at low levels. Then, NAND gate 448a outputs a low level, and NAND gate 456a then outputs a high level. Thus, DCA1 2 goes from the low level to a high level, while DCA1 2, DCA1,2 and DCA12 remain the low levels. When CA1 then goes to a high level and CA2 maintains the low level, this results in causing DCA12 to go high. However, the NAND gate 448a outputs a high level, thereby causing DCA1 2 to go low after delays via delay circuits 450a and 452a, NAND gates 451a, 456a and 454a and an inverter. Thus, DCA1 2 goes to the low level with the time delay determined by the delay elements after going to the high level. Consequently, overlapped portions occur end portions between successive predecoding signals. These overlapped portions guarantee an error free write time during a write operation.

Figure 39B:
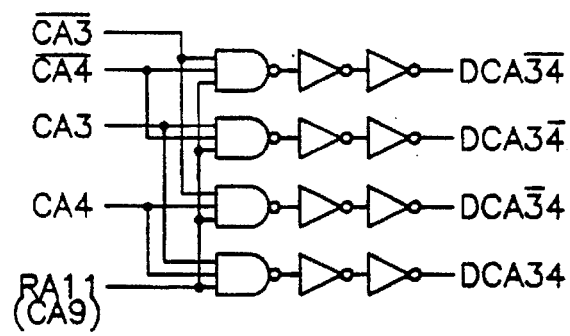
FIG. 39b is a schematic circuit diagram for a second predecoder in FIG. 38.

FIG. 39b is a drawing showing a schematic circuit diagram for one of second predecoders 438 to 442. It should be noted that each second predecoder is a low enable circuit in which a selected predecode signal goes to a low level.

Figure 40:
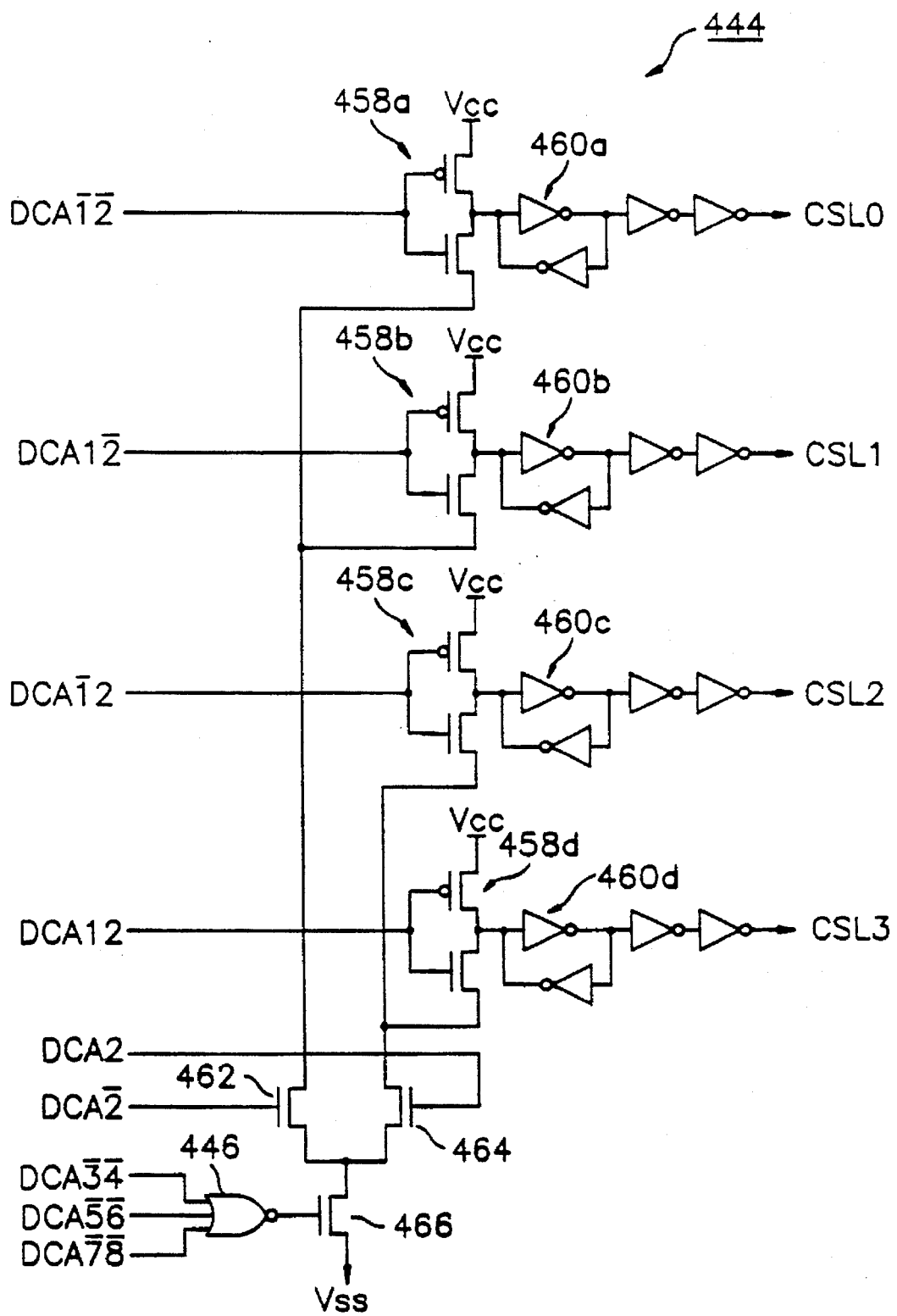
FIG. 40 is a schematic circuit diagram for one of main decoders in FIG. 38.

FIG. 40 is a drawing showing a schematic circuit diagram for first one of main decoders 444. Referring to the drawing, predecode signal DCA1 2 to DCA12 are respectively coupled to input terminals of inverters 458a to 458d which are partitioned into a first inverter group of inverters 458a and 458b and a second inverter group of inverters 458c and 458d. One terminal of each of inverters 458a and 458b constituting the first group is connected in common with a drain of a first transistor 462, while one terminal of each of inverters 458c and 458d constituting the second group is connected in common with a drain of a second transistor 464. The other terminal of each of the inverters 458a to 458d is connected to the supply potential Vcc. Output terminals of the inverters are respectively connected to latches 406a to 460d. Sources of first and second transistors 462 and 464 are connected in common with a drain of a third or pull-down transistor 466 whose source is connected to a reference potential Vss such as a ground potential and whose gate is connected with the output of NOR gate 446 inputting predecode signals DCA3 4, DCA5 6 and DCA7 8 from the second predecoders 438 to 442. Gates of the first and the second transistors 462 and 464 respectively received DCA 2 and DCA2. The input signals are generated in order of predecode signals DCA2 and DCA2, predecode signals DCA3 4, DCA5 6 and DCA7 8 and overlapped predecode signals DCA1 2 to DCA12. Thus, after the transistor 462 or 464 and the pull-down transistor 466 have been turned on, the inverters 458a to 458d can be turned on. It is now assumed that column address signals CA1 to CA8 have been low. Then, the transistor 462 is turned on and the transistor 466 is then turned on. The inverter 458a is then turned on by the high-going signals DCA1 2 and thereby the column selection signal CSL0 goes to a high level. Where the column address signal CA1 then changes into a high level, DCA1 2 goes to a high level, thereby causing the column selection signal CSL1 to go high. However, the column selection signal CSL0 becomes from the high level to a low level after a predetermined delay, as discussed above, due to the low-going signal DCA1 2. In the same manner as discussed above, column selection signals overlapping predetermined ones of end portions in response to column address signals CA1 to CA8 being sequentially changed. Referring to FIG. 33b, where initial external column addresses A$_0$ and A$_1$ to A$_8$ are respectively at a high level and low levels, illustration is made on a timing diagram showing timing relations between column address signals CA to CA8, signals DCA1 2 and DCA12 and column selection signals CSL0 and CSL1. It can be understood in the drawing that time periods for selecting columns are sufficiently guaranteed by overlapped portions.

Figure 41A:
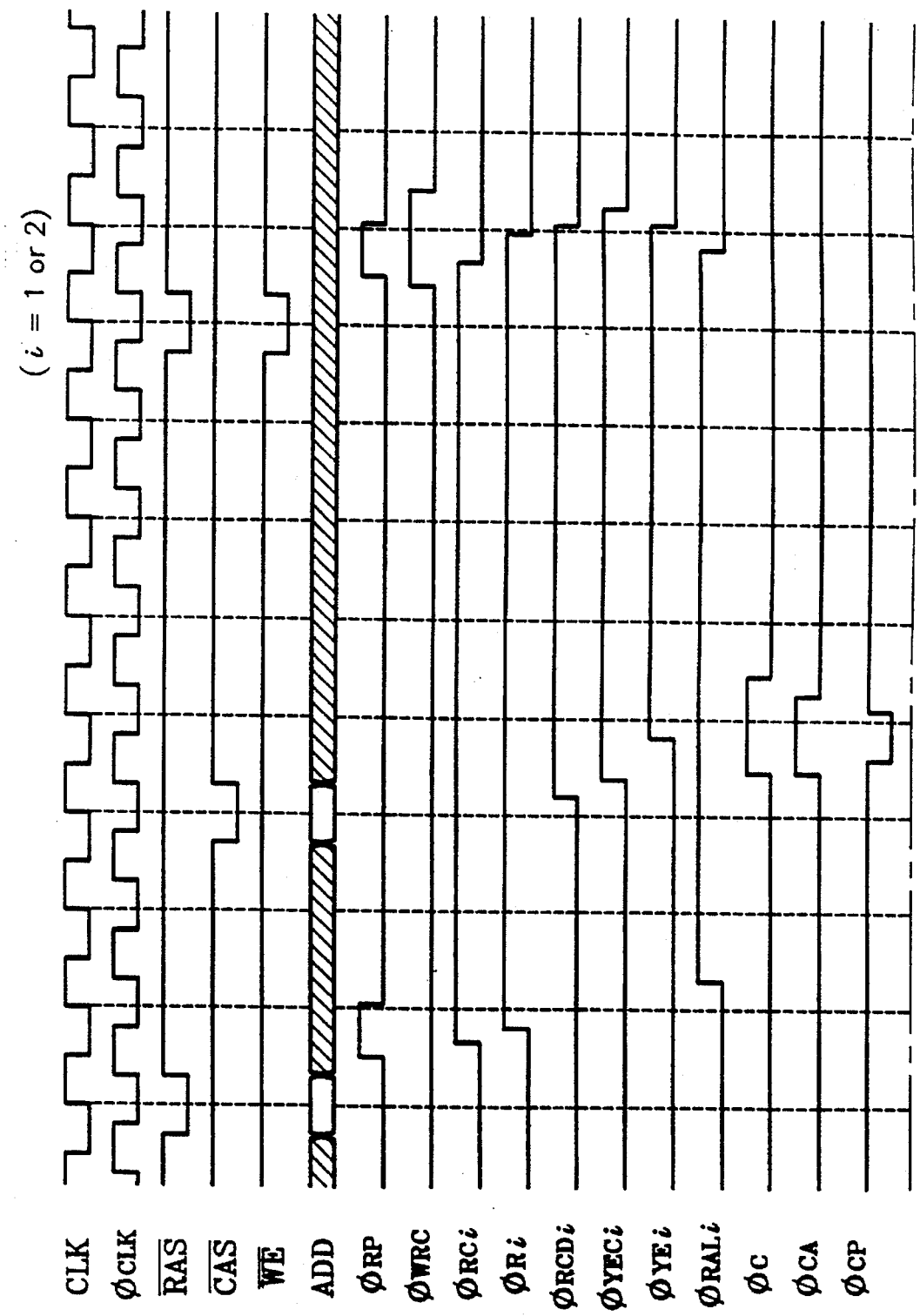
FIGS. 41a, 41b and FIG. 41c are a timing diagram showing a reading operation according to the present invention.

FIG. 41 is a timing diagram showing a read operation at the system clock frequency of 100 MHZ, the burst length of 4 and the CAS latency of 3. It can be understood in the drawing that sufficient read-out time periods can be guaranteed by overlapped portions of signals DCA1 2, DCA1 2 and CSL1 where A$_0$ and A$_1$ to A$_8$ are initially at a high level and low levels, respectively.

4. Data Bus Control Circuit

It is very important that Unnecessary internal operations are precluded to eliminate power consumption after completion of the burst length, i.e., after output or input of valid data. Such a control circuit comprises the burst length counter 350, the burst length detector 352 and the column address reset signal generator 354 as shown in FIG. 4.

The burst length counter 350 stops its counting operation when the column address reset signal φ$_{CAR}$ is at a low level. The counter 350 is reset by a short high level pulse BITSET, thereby re-starting its counting operation. Thus, the burst length counter 350 is a conventional 9-bit binary counter whose clock input terminal is connected to the system clock φ$_{CLK}$ and whose reset terminal is connected to the output of a OR gate inputting the signal BITSET and complement of φ$_{CAR}$. Count values CNTI (I=0, 1, ... 8) of the counter 350 input to the counter 350 input to the burst length detector 362.

Figure 41B:
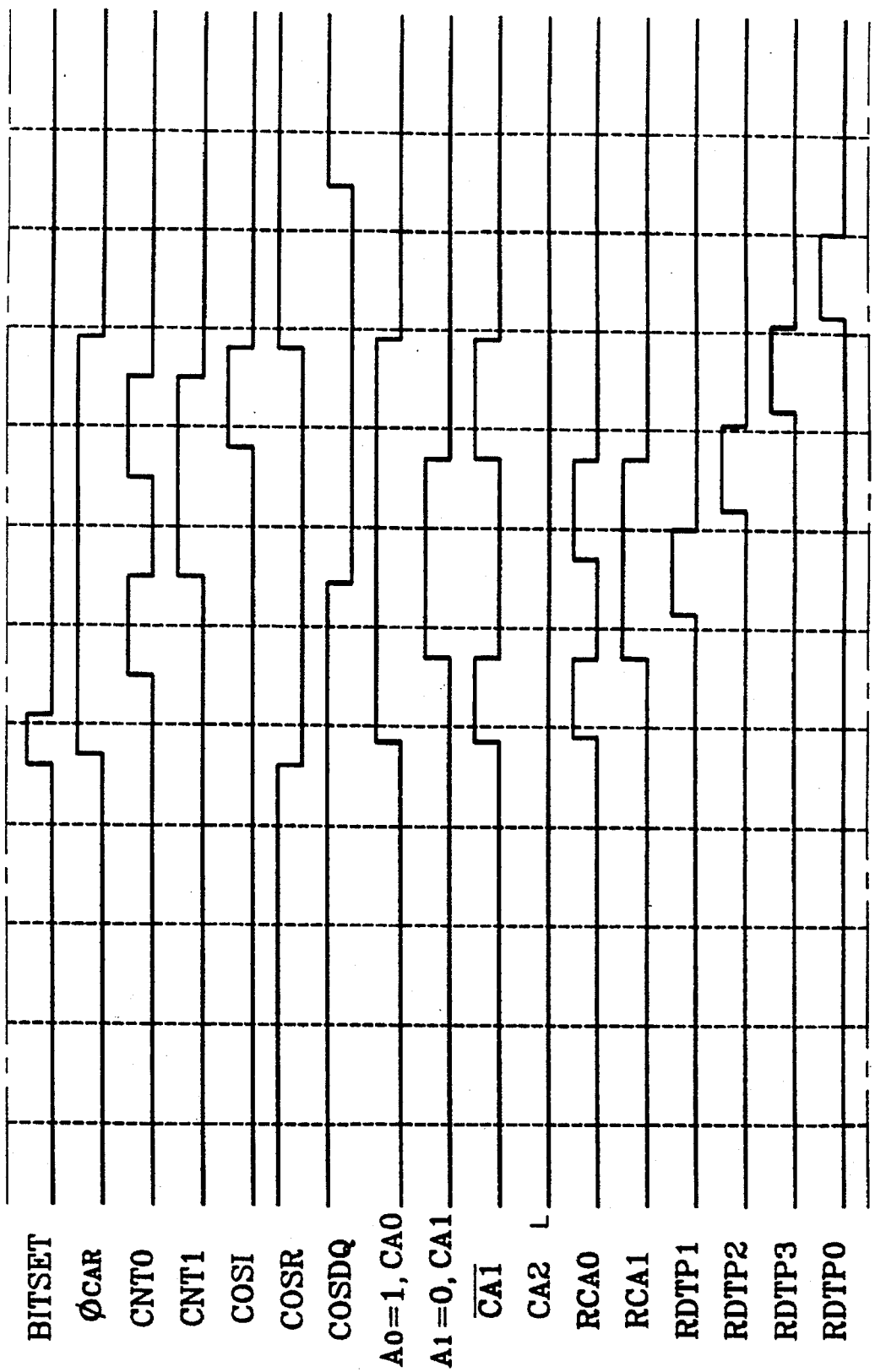
Figure 41C:
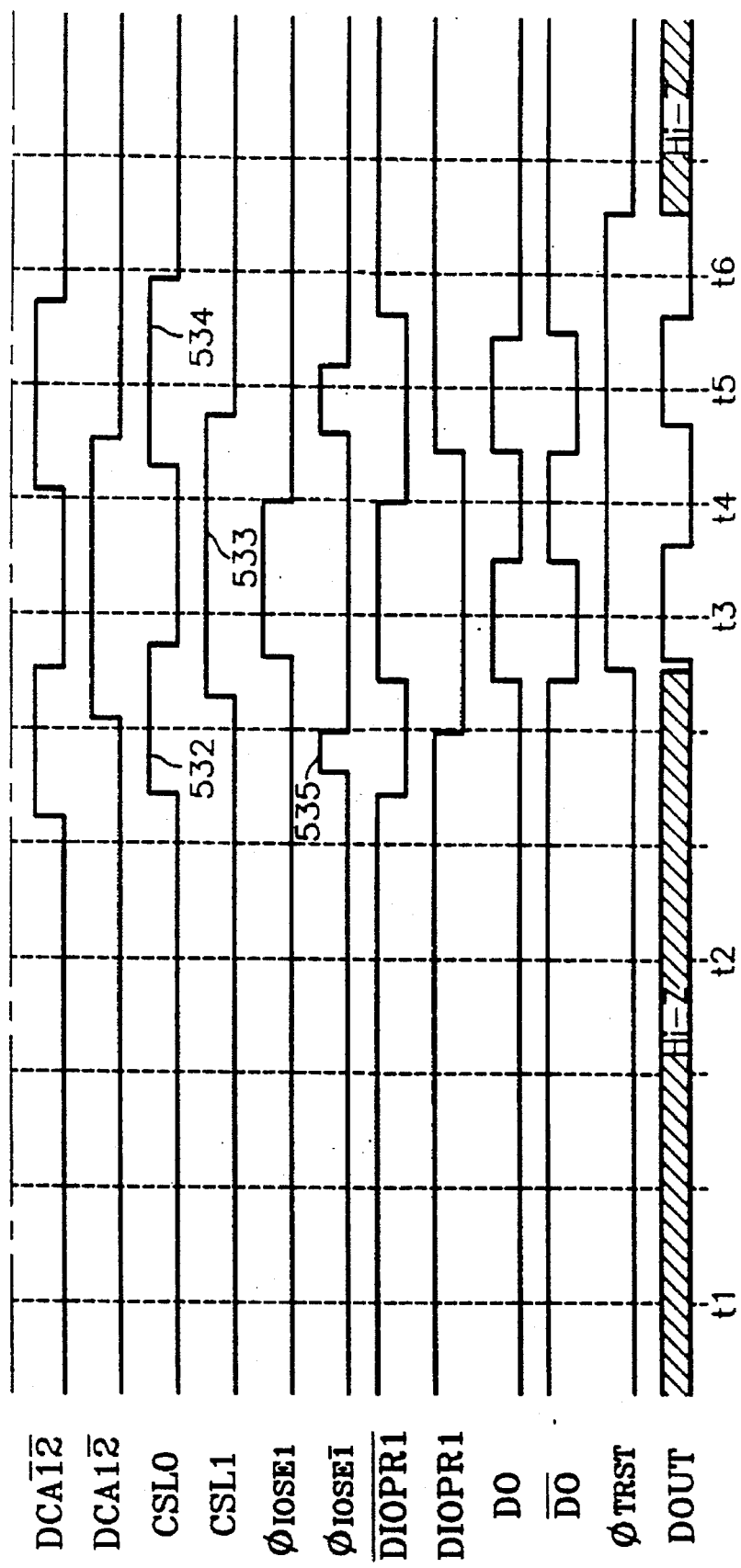
Figure 42:
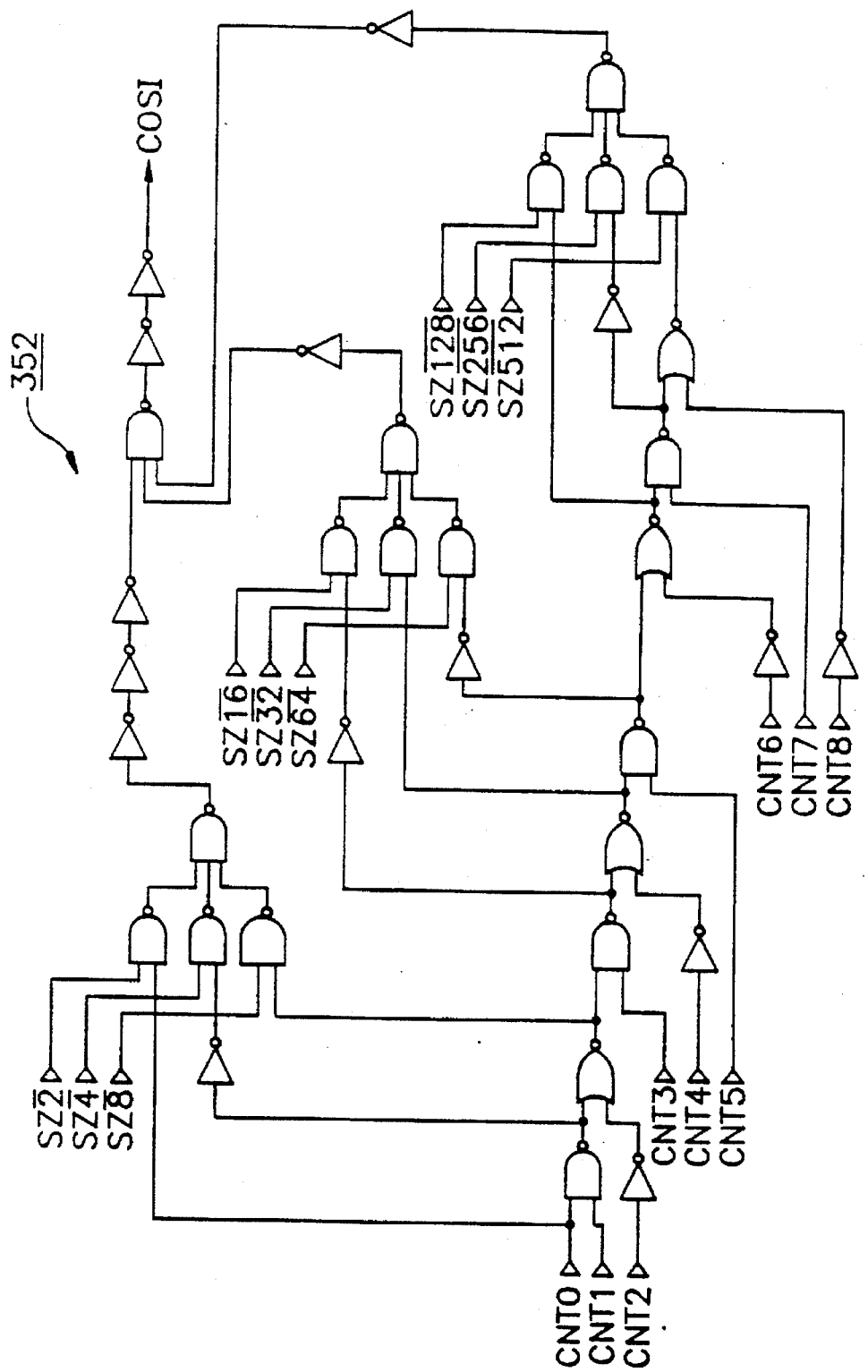
FIG. 42 and FIG. 43 are schematic circuit diagrams for a burst length detection circuit in FIG. 4.
Figure 43:
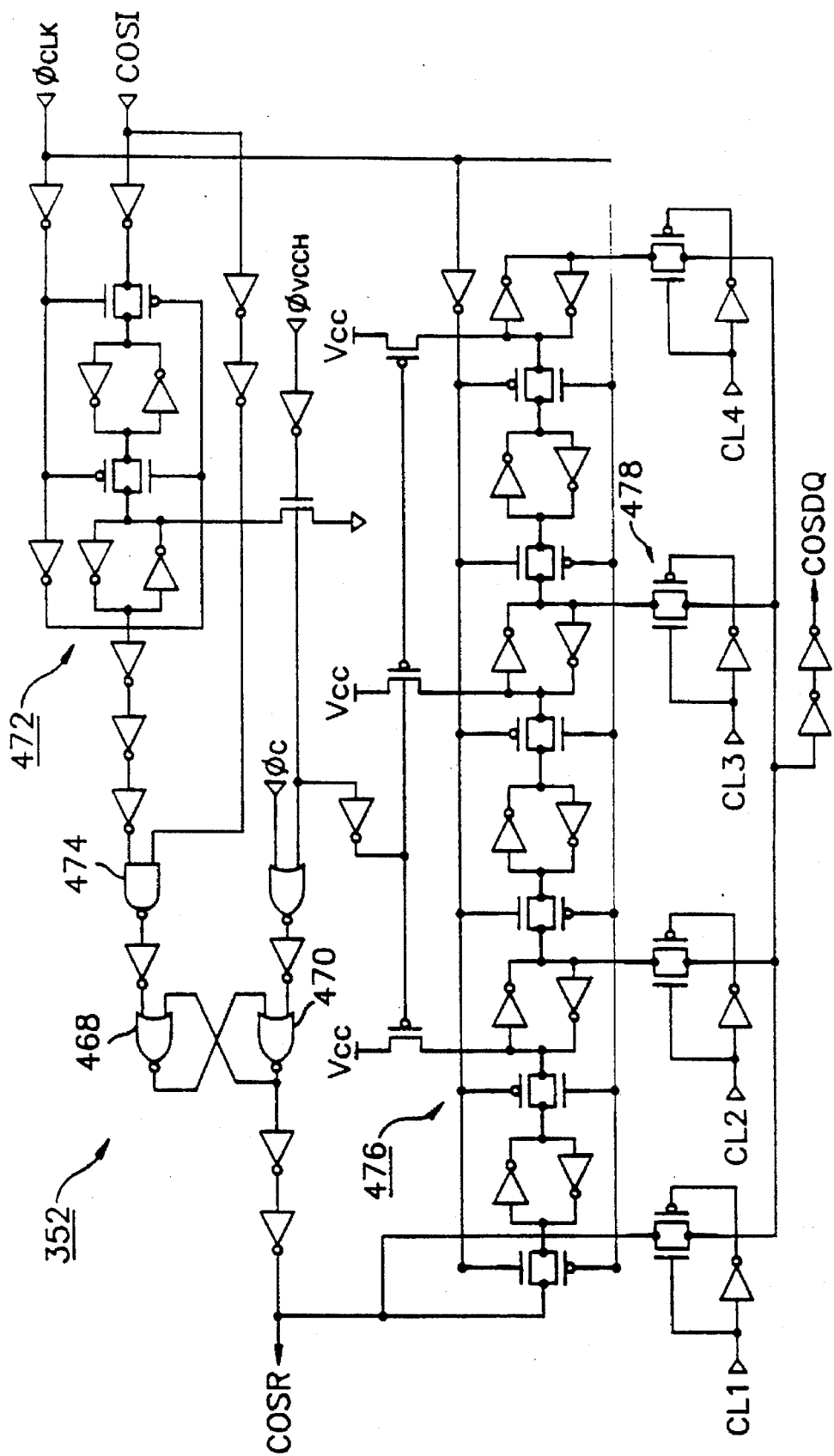

FIGS. 42 and 43 show a schematic circuit diagram for the burst length detector. The burst length detector 352 includes a logic circuit receiving the count values CNTI and burst length signals SZn for generating a signal COSI informing of the completion of burst length after activation of CAS. For example, referring to FIG. 41, once the pulse BITSET goes from the high level to the low level after the activation of CAS, the counter 350 counts clocks of φ$_{CLK}$, thereby producing count signals CNT0 and CNT1. Since SZ4=1 (high) in case of the burst length of 4, the burst length detector 352 produces the signals COSI having a pulse width of one cycle of φ$_{CLK}$ when CNT0 and CNT1 are all at high levels. On the other hand, the pulse φ$_C$ being at the high level after the activation of CAS renders to be latched low the output of a flip-flop comprised of NOR gates 468 and 470 as shown in FIG. 43, thereby causing the signal COSR to go low as shown in FIG. 41b. Once COSI then goes to a high level, two inputs of a NAND gate 474 become high after delay of a shift register 472 with the system clock φ$_{CLK}$. Thus, the output of the NOR gate 468 goes low. At this time, since φ$_C$ is low, the output of the NOR gate 470 goes to a high level, thereby causing COSR to go to a high level. Thus, it can be understood in FIG. 4b that the low level signal COSR is a signal indicating of the burst length, i.e., four pulses of the system clock CLK after the activation of CAS. A delay circuit 476 for providing time delays depending on CAS latency values receives the signal COSR and then outputs a signal COSDQ. Thus, it can be seen that the signal COSDQ is a signal indicating of a burst length considering a CAS latency. Referring to FIG. 41b, since the CAS latency is 3 (CL3 is a high level), a transfer switch 478 is turned on, thereby producing the signal COSDQ that the signal COSR is delayed by two cycles of the clock φ$_{CLK}$. It has been already discussed that the signal COSDQ being at a high level disables the data output buffer.

Figure 44:
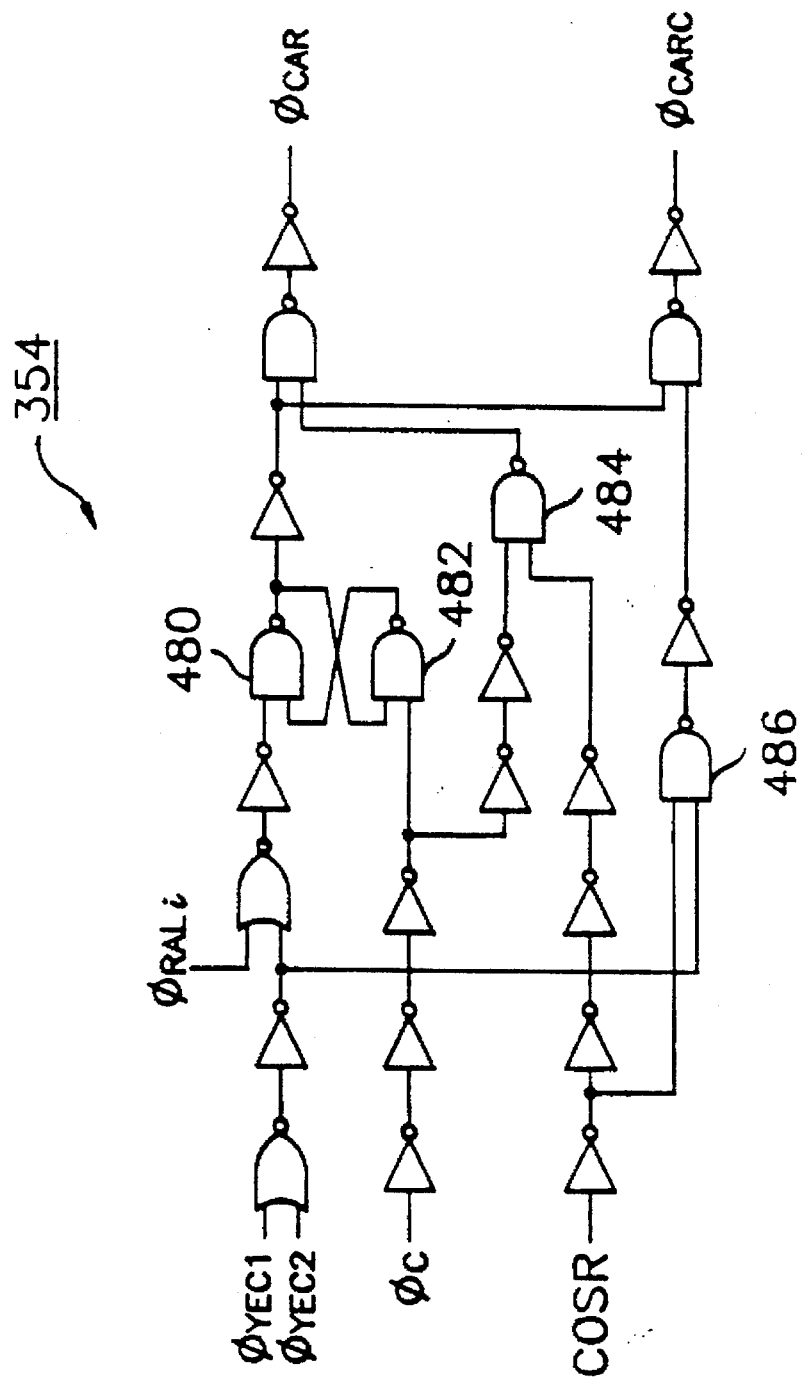
FIG. 44 is a schematic circuit diagram for a column address reset signal generator in FIG. 4.

FIG. 44 is a drawing showing a schematic circuit diagram for the column address generator 354. Referring to FIG. 41 or FIG. 33, the signal φ$_{RALi}$ had become high prior to the activation or CAS. Then, after the activation of CAS, NAND gates 482 and 484 output high levels in response to the high-going pulse $\phi_C$. Thus, a NAND gate 480 constituting a flip-flop is latched to a low level, thereby allowing $\phi_{CAR}$ to go high. Likewise, a NAND gate 486 outputs a low level in response to the signal COSR going to a low level when $\phi_C$ is high since one of $\phi_{YEC1}$ and $\phi_{YEC2}$ maintains a high level at this time. Thus, $\phi_{CARC}$ goes to a high level. Then once COSR goes to a high level, $\phi_{CAR}$ and $\phi_{CARC}$ goes to low levels. However, in case of using a system clock of a lower frequency such as 66 MHZ or less, signals $\phi_{RARi}$ and $\phi_{YEI}$ or $\phi_{YE2}$ rather than the signal COSR go first to low levels, thereby causing the signal $\phi_{CAR}$ to go low. Thus, the burst length counter 350 and the column address counter 346 are reset by the low-going signal $\phi_{CAR}$, thereby preventing unnecessary operations thereof.

5. Data Transfer Clock Generator

A data transfer Clock generator is a circuit for generating clock for transferring data via the data output multiplexer and the input data demultiplexer. The data transfer clock generator includes the data transfer control counter 348 and the read and write data transfer clock generators 356 and 358.

The column address generator 346 is using the multiplied system clock CNTCLK9 as synchronization clock to assure a faster precharge time in case of using a system clock of 33 MHZ or less, as previously discussed. In such a case, since data must be transferred in synchronism with the system clock CLK, the data transfer control counter 348 is essentially required. However, if such a technique is unnecessary, i.e., if such lower frequency system clock is not used, some modifications are required. Such modifications can be accomplished by the following explanation. That is, the column address counter 346 as shown in FIG. 35 uses the system clock $\phi_{CLK}$ in place of the clock CNTCLK9 as a synchronous count clock. Selection circuits 391 as shown in FIG. 34 respectively receive the lower 2-bit outputs PCA0 and PCA1 to produce column address signals CA0 and CA1. The read and write data transfer clock generators 356 and 358 directly input the signals CA0 and CA1 instead of outputs RCA0 and RCA1 from the data transfer control counter 348.

Figure 45:
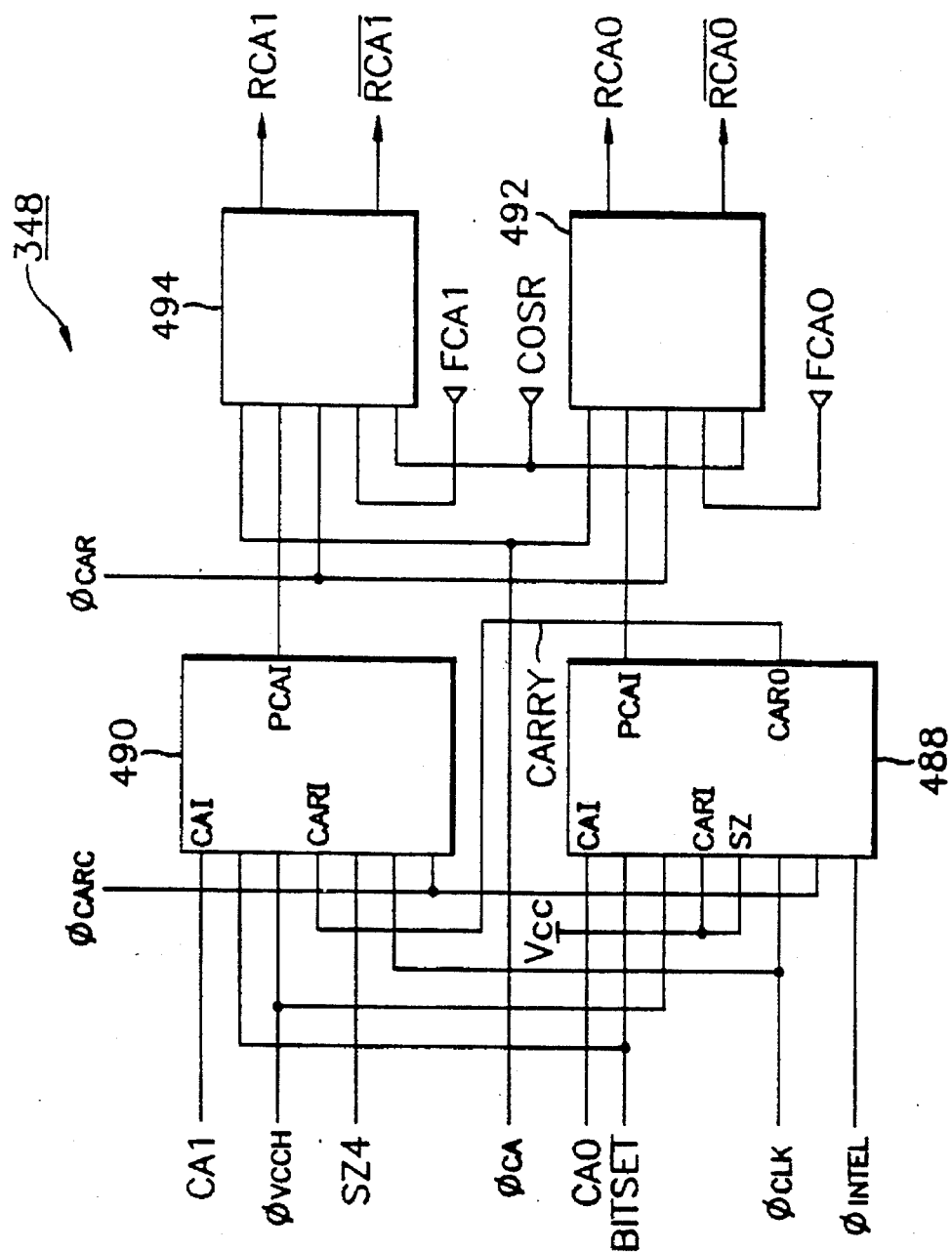
FIG. 45 is a schematic block diagram for a transfer control counter in FIG. 4.

FIG. 45 is a drawing showing a schematic block diagram for the data transfer control counter 348 which comprises a 2-bit counter 488 and 490 and selection circuits 492 and 494. The 2-bit counter receives column address signals CA0 and CA1 from the column address buffers 344 for generating internal sequential column address signals starting from the signals CA0 and CA1 in synchronism with the system clock $\phi_{CLK}$. The selection circuits 492 and 494 serve to generate serial column address stream with column address signals FCA0 and FCA1 from the column address buffers 344 and the internal sequential column address signals from the 2-bit counter. Stages 488 and 490 constituting the 2-bit counter are respectively identical in constructions to stages shown in FIGS. 36a and 36b. The difference therebetween is to use the system clock $\phi_{CLK}$ instead of the clock CNTCLK9. Each of the selection circuits 494 and 492 has the same construction as the selection circuit 391 of FIG. 34. The input signals ECAI of the transfer switch 394 and the input signal PCAI are respectively replaced by FCAI and the output of the corresponding 2-bit counter (wherein I is 0 or 1). The signal COSR is also fed to third inputs of NAND gates 400 and 402. Using the signal COSR in the selection circuits 492 and 494 is preventing unnecessary internal operation thereof upon completion of burst length. Operation explanation for the 2-bit counter and the selection circuits is referred to portions as discussed in connection with FIGS. 36a, 36b and 34. The outputs RCA0 and RCA1 of the data transfer control counter 348 and their complements $\overline{RCA0}$ and $\overline{RCA1}$ may be properly time delayed signals according to $\overline{CAS}$ latency values or the system clock in order to control a data transfer timing on data lines.

Figure 46:
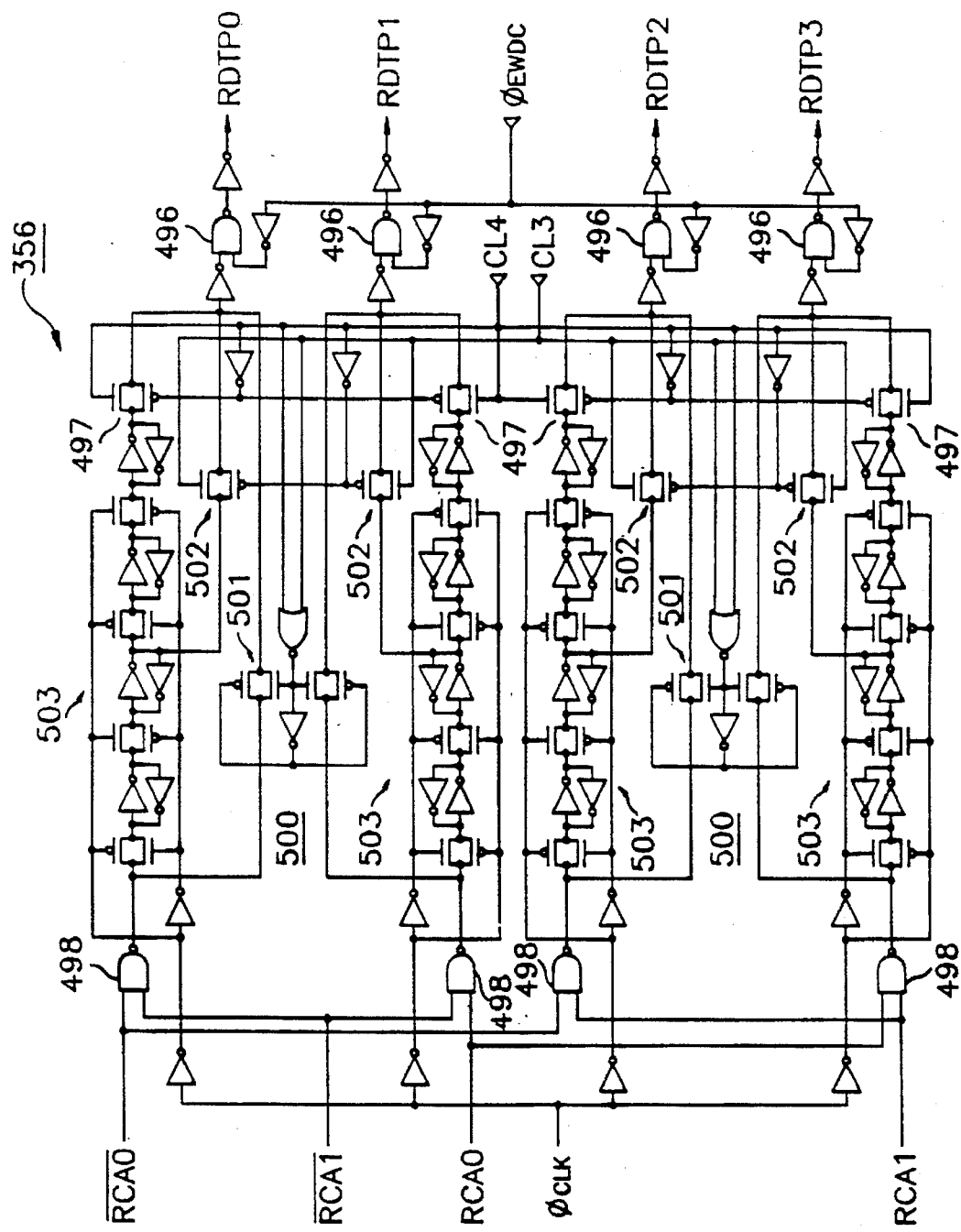
FIG. 46 is a schematic circuit diagram for a read data transfer clock generator in FIG. 4.

FIG. 46 is a drawing showing a schematic circuit diagram for the read data transfer clock generator 356 for generating read data transfer signal RDTP0 to RDTP3 which are used in the data output multiplexer. Referring to the drawing, the generator 356 comprises NAND gates 498 for decoding column address signals RCA0 and RCA1 and their complements $\overline{RCA0}$ and $\overline{RCA1}$, delay circuits 500 for receiving the decoded signals and producing read data transfer signals with different time delays according to $\overline{CAS}$ latency values, and NAND gates 496 for outputting the read data transfer signals in a read operation and resetting their outputs to low levels in a write operation. The outputs of NAND gates 496 become high in response to the signal $\phi_{EWDC}$ being at a high level in a write operation. Each of NAND gates 498 serves as a decoder outputting low in response to two inputs of high levels. Each delay circuit 500 includes a shift register 503 having a plurality of data paths and switches 497, 501 and 502 respectively connected to the data paths, and serves to provide a different time delay via a selected switch according to $\overline{CAS}$ latency signals CL3 and CL4. Referring to. FIG. 51b, where initial external column addresses $A_0$ and $A_1$ are respectively at a high level (=1) and a low level (=0), illustration is made on a timing diagram for column address signals RCA0 and RCA1 for controlling data transfer and read data transfer signal RDTP0 to RDTP3. Since the $\overline{CAS}$ latency value is 3, switches 502 are turned on.

Figure 47:
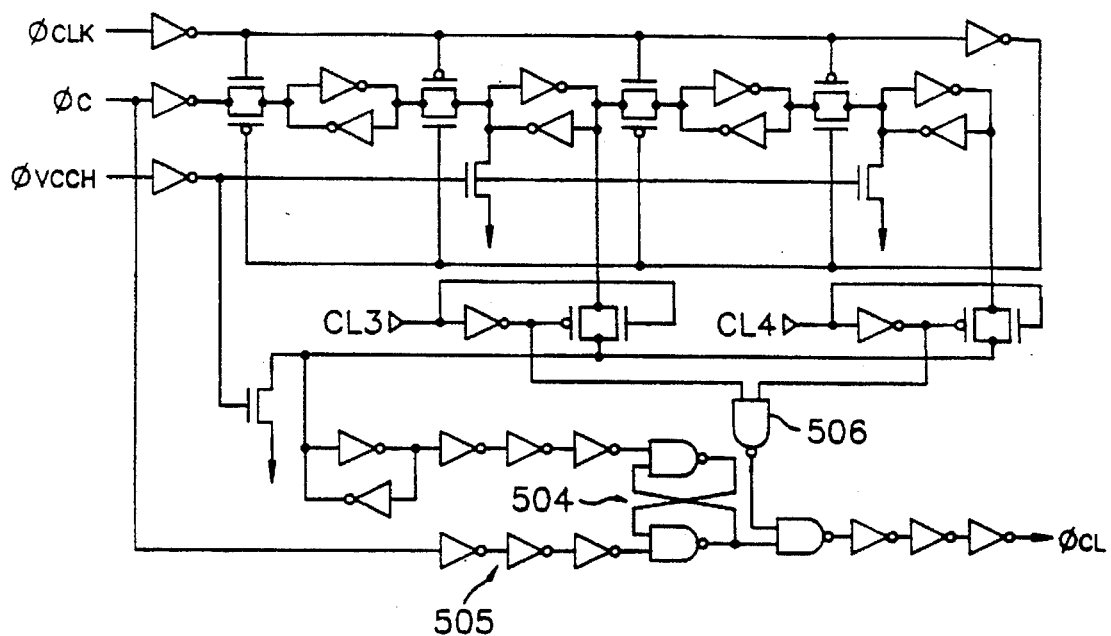
FIG. 47 is a schematic circuit diagram showing a circuit for generating a signal $\phi_{CL}$ using in the data output multiplexer of FIG. 25.

FIG. 47 shows a schematic circuit diagram of a circuit for generating the signal $\phi_{CL}$ being used in the data output multiplexer 268. Referring to the drawing, after the activation of $\overline{CAS}$, the high-going pulse $\phi_C$ renders high the output of a flip-flop 504 via a delay circuit 505. On the other hand, if one of $\overline{CAS}$ latency signals CL3 and CL4 is high, the output of a NAND gate 506 maintains high. Thus, the signal $\phi_{CL}$ goes high. Then if $\phi_C$ goes low, the signal $\phi_{CL}$ will go low after a delay of about one cycle of $\phi_{CLK}$ in case of a high level signal CL3, while the signals $\phi_{CL}$ will go low after a delay of about 2 cycles of $\phi_{CLK}$ in case of a high level signal CL4. However, if CL3 and CL4 are all low, i.e., where $\overline{CAS}$ latency is either 1 or 2, $\phi_{CL}$ is always lOW since the output of NAND gate 506 is low.

Figure 49A:
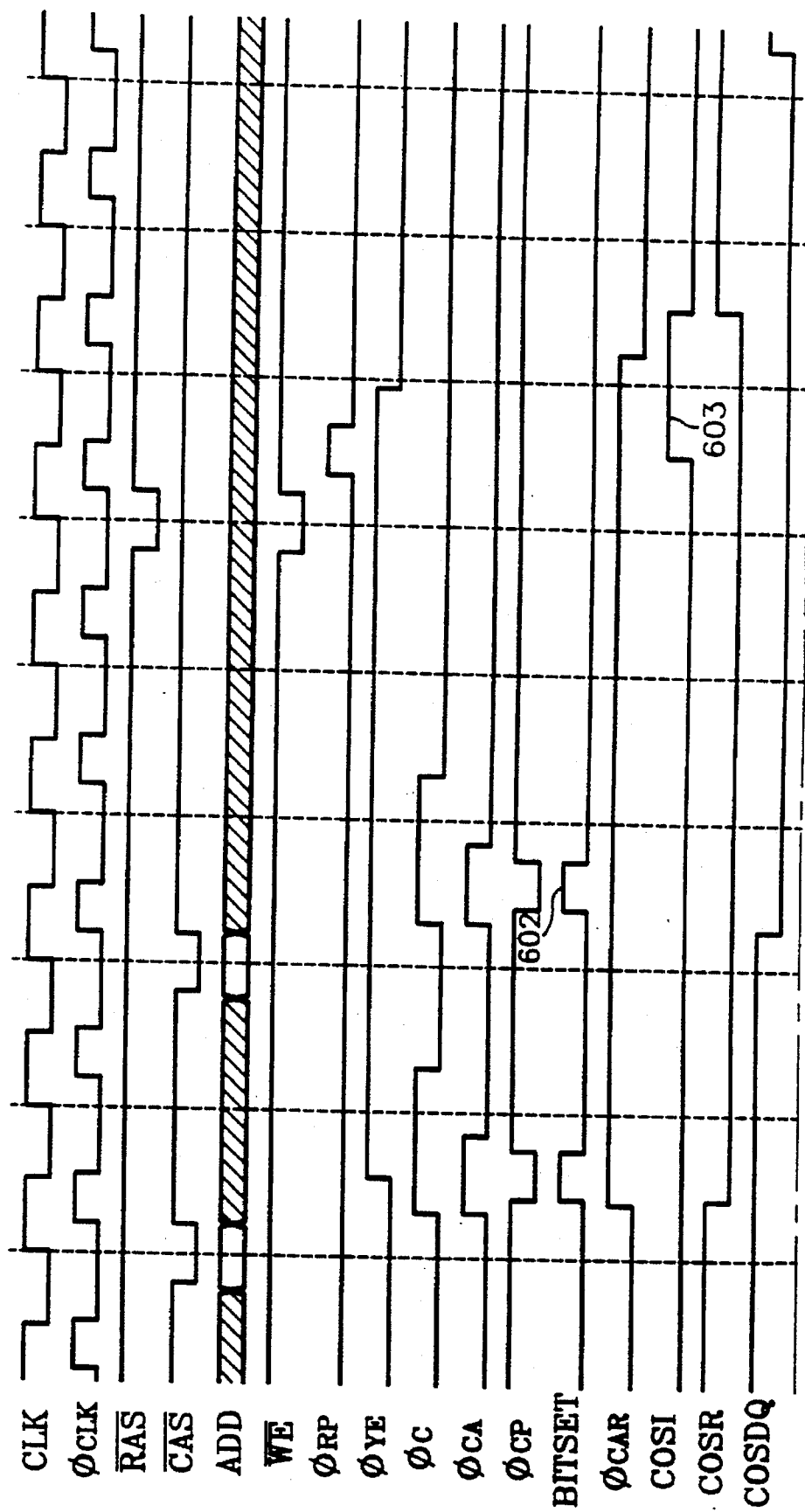
FIGS. 49a, 49b and FIG. 49c are a timing diagram for a $\overline{CAS}$ interrupt write operation according to the present invention.
Figure 49B:
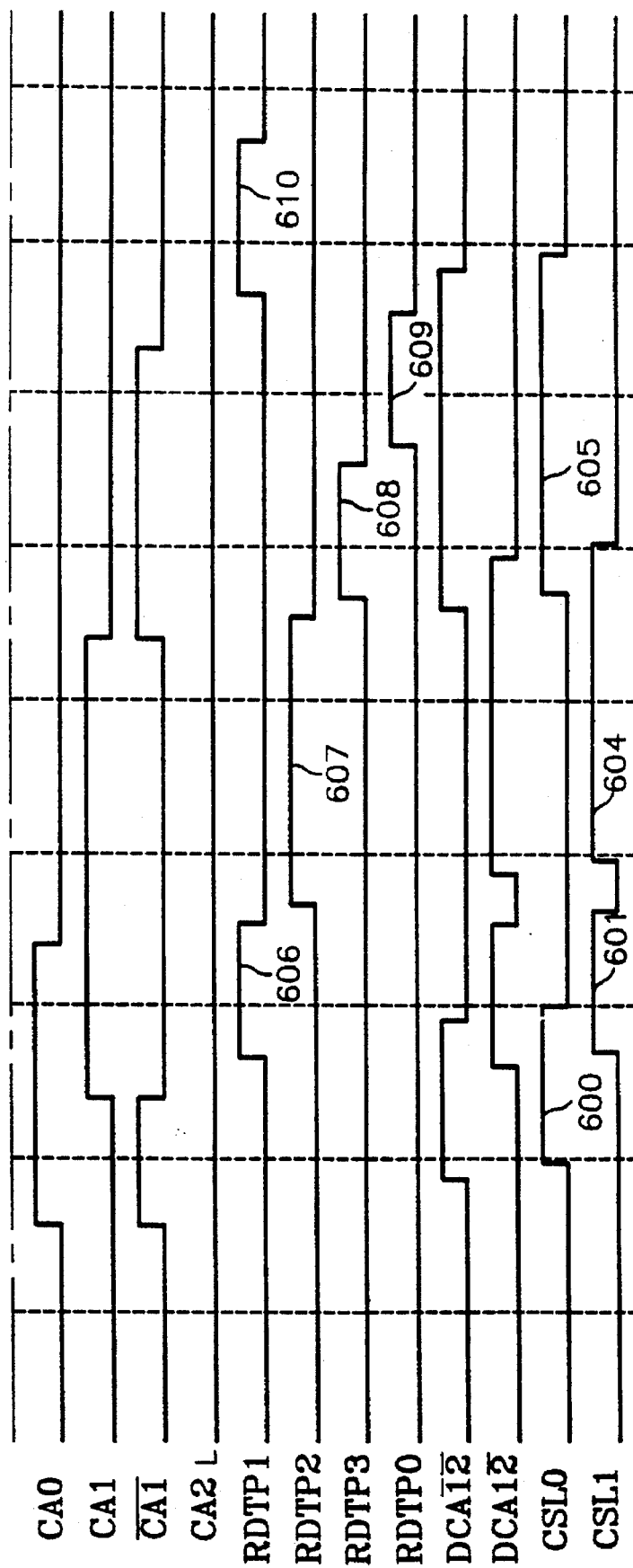
Figure 49C:
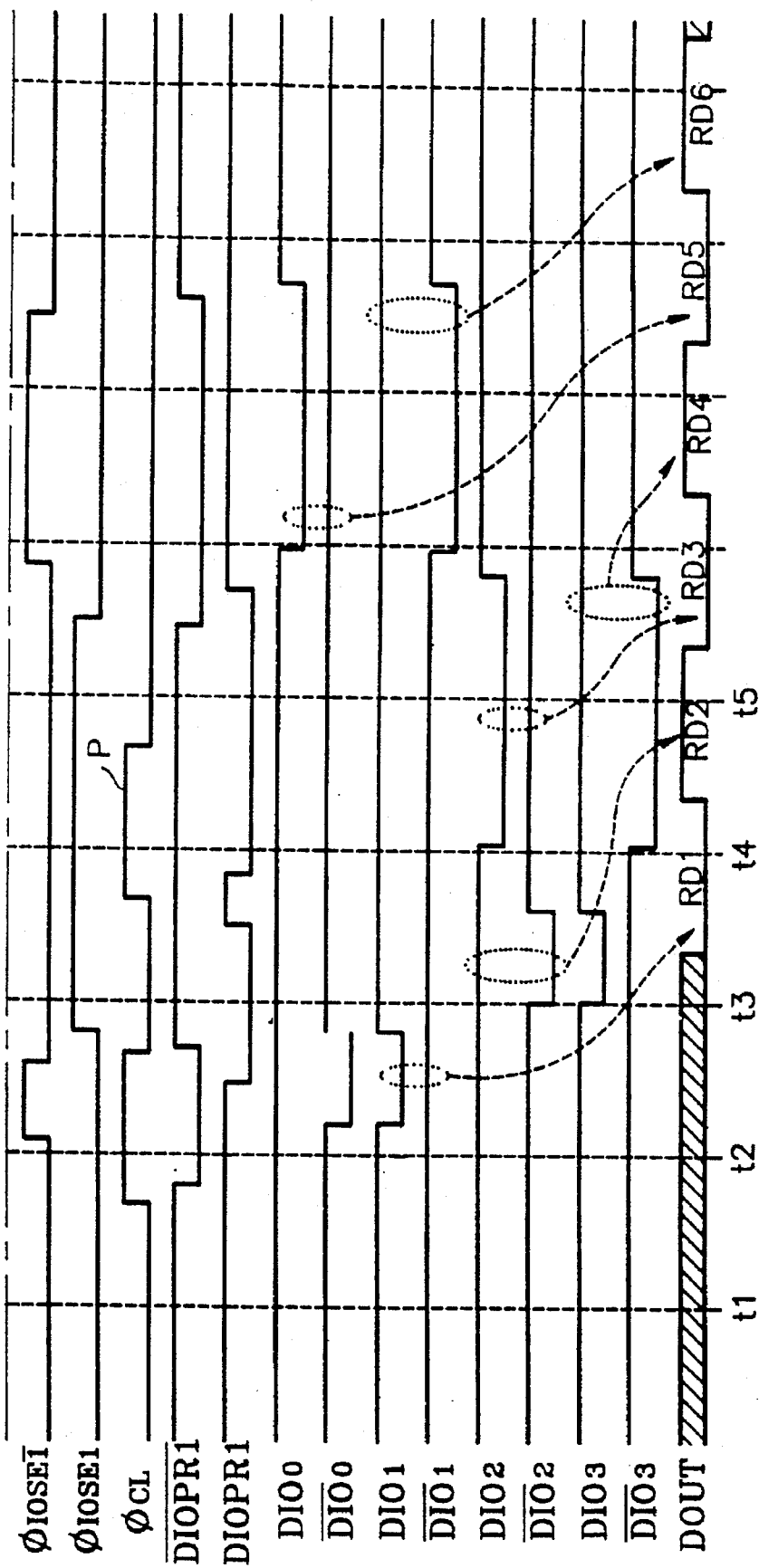

FIG. 49 shows a timing diagram of $\overline{CAS}$ interrupt read operation after activation of $\overline{RAS}$. The operation is performed at the $\overline{CAS}$ latency of 3 and the burst length of 4 with system clock of 66 MHZ. At time $t_1$, a read command is issued with external column addresses $A_0$, $A_1$, $A_2$, . . . , A8=1, 0, 0, . . . , 0. At time $t_3$, a $\overline{CAS}$ interrupt read command is issued with external column addresses $A_0$, $A_1$, $A_2$, . . . , A8=0, 1, 0, . . . , 0. Then, at $t_3$ and $t_4$, i.e., just before and after the issuance of the $\overline{CAS}$ interrupt read command, column address signals RCA0 and RCA1 are identical as a low level and a high level. Thus, read-out data is transferred in series via the same data line pairs $DIO_2$, $\overline{DIO_2}$ at times $t_3$ and $t_4$. It may be seen in FIG. 49C that read-out data was high just before the $\overline{CAS}$ interrupt, while read-out data was low immediately after the $\overline{CAS}$ interrupt. Then, as shown in the timing diagram of $DIO_2$ between $t_3$ and $t_5$ in FIG. 49C, serial data, i.e., 1,0 is transferred on the data line $DIO_2$. Thus, as shown in FIG. 25, if means 276 for isolating between serial registers 274 and 278 are not provided therebetween, the serial data is sequentially latched into the serial registers 274 and 278, and transferred only in series to the data output buffer via transfer switch 280 which is turned on by the read data transfer signals RDTP2. However, since the operation speed of semiconductor circuit varies according to ambient conditions such as ambient temperature, it is essentially necessary to provide means for preventing serial data contention due to variations of the operation speed of the transfer switch 280 or data output buffer. The signal $\phi_{CL}$ is used as a signal for isolating between serial registers 274 and 278 to prevent such a data contention. It is to be understood that the data contention between two serial data may be prevented by the high level pulse $\phi_{CL}$ indicating as P in FIG. 49C.

Figure 48:
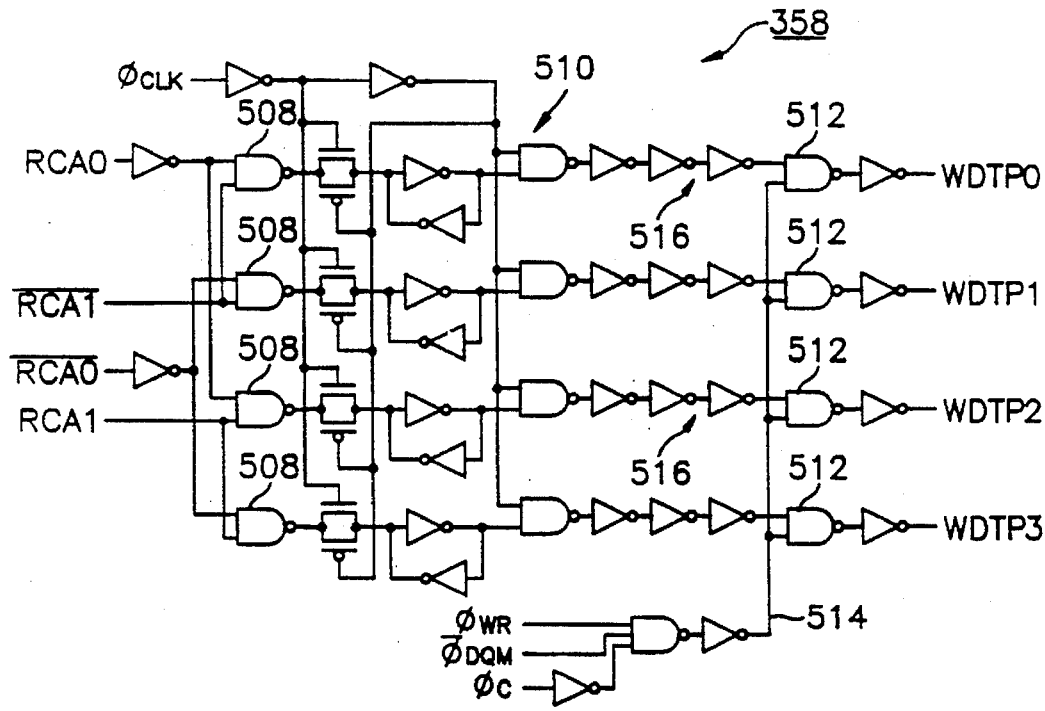
FIG. 48 is a schematic circuit diagram for a write data transfer clock generator in FIG. 4.

FIG. 48 shows a schematic circuit diagram of the write data transfer generator write data transfer signals WDTP0 to WDTP3 for use in the data input demultiplexer 314. The generator 358 comprises NAND gates for decoding column address signals RCA0 and RCA1 and their complements $\overline{RCA0}$ and $\overline{RCA1}$, a synchronization circuit 510 for synchronizing the decoding signals from the NAND gates with the system clock $\phi_{CLK}$ and producing synchronized write data transfer signals, and NAND gates 512 for gating the synchronized write data transfer signals. A line 514 stays at a low level to reset all of the gates 512 during a read operation, a $\overline{CAS}$ interrupt or a data input/output masking operation, thereby causing the signals WDTP10 to WDTP3 to go low. Reference numeral 516 represents a delay circuit. As shown in FIG. 33, by a high level address signal RCA0 and a low level address signal RCA1, a high level pulse signal WDTP1 is generated and next sequential address signals RCA0 and RCA1, which are respectively a low level and a high level, generates a high level pulse signal WDTP2.

6. Data Line Precharge Circuit

Data line precharge circuit is a circuit for generating control signals to precharge I/O lines, PIO lines and DIO lines. According to the present invention, data transfer and precharging between lines on data paths are sequentially performed in turn. To perform such a precharge operation, column address signal CA1 produced from external column address $A_1$ is utilized.

Figure 50:
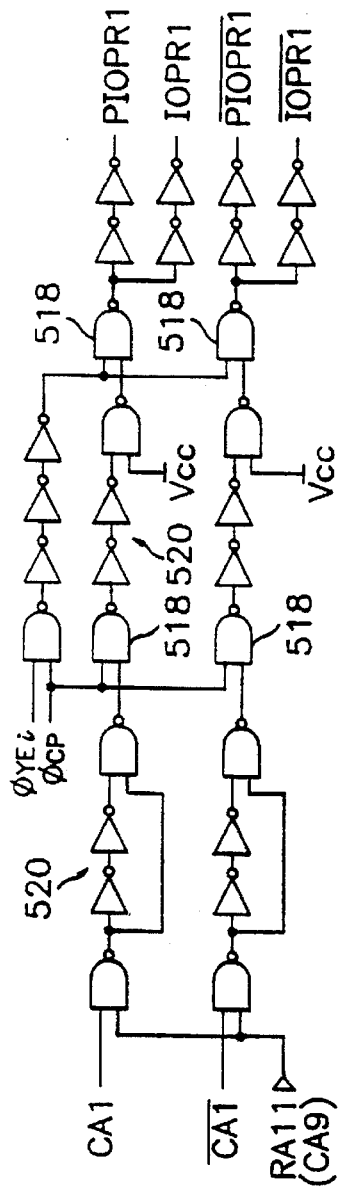
FIG. 50 is a schematic circuit diagram showing a circuit for generating control signals precharging I/O lines and PIO lines according to the present invention.

FIG. 50 shows a schematic circuit diagram of a circuit for generating control signals to precharge I/O lines and PIO lines. RA11 and CA9 are bank selection signals as discussed above, and I/O lines and PIO lines are initialized to precharge states. Thus, PIOPR1 and IOPR1 and their complements $\overline{PIOPR1}$ and $\overline{IOPR1}$ are at high levels. After activation of $\overline{CAS}$, once $\phi_{CP}$ goes from a low level to a high level ($\phi_{YEi}$ maintains a high level), NAND gates 518 are then enabled. If CAI is at a low level ($\overline{CAI}$ at a high level), precharge signals PIOPR1 and IOPR1 maintain high levels while $\overline{PIOPR1}$ and $\overline{IOPR1}$ go to low levels. Thus, in FIG. 24, if BLS is high, I/O line pairs I/O$_2$, $\overline{I/O_2}$ and I/O$_3$, $\overline{I/O_3}$ are continuously precharged. However, I/O$_0$, $\overline{I/O_0}$ and I/O$_2$, $\overline{I/O_2}$ cease precharging to be ready for data transfer. PIO line pairs PIO$_2$, $\overline{PIO_2}$ and PIO$_3$, $\overline{PIO_3}$, as shown in FIG. 28, are also precharged in the same, manner. Then, if CAI goes to a high level, lines I/O$_0$, $\overline{I/O_0}$, I/O$_1$, $\overline{I/O_1}$, PIO$_0$, $\overline{PIO_0}$, PIO$_1$ and $\overline{PIO_1}$ are conversely precharged. On the other hand, a short low level pulse $\phi_{CP}$ generated after activation of $\overline{CAS}$ in a $\overline{CAS}$ interrupt operation renders all of precharge signals PIOPR1, $\overline{PIOPR1}$ and $\overline{IOPR1}$ to become high level pulses. Thus, prior to receipt of column addresses upon $\overline{CAS}$ interrupt, all of I/O line pairs and PIO line pairs are precharged. By such a $\overline{CAS}$ precharge, internal operations may be performed at a high speed with no wait. Reference numeral 520 represents a delay circuit.

Figure 51:
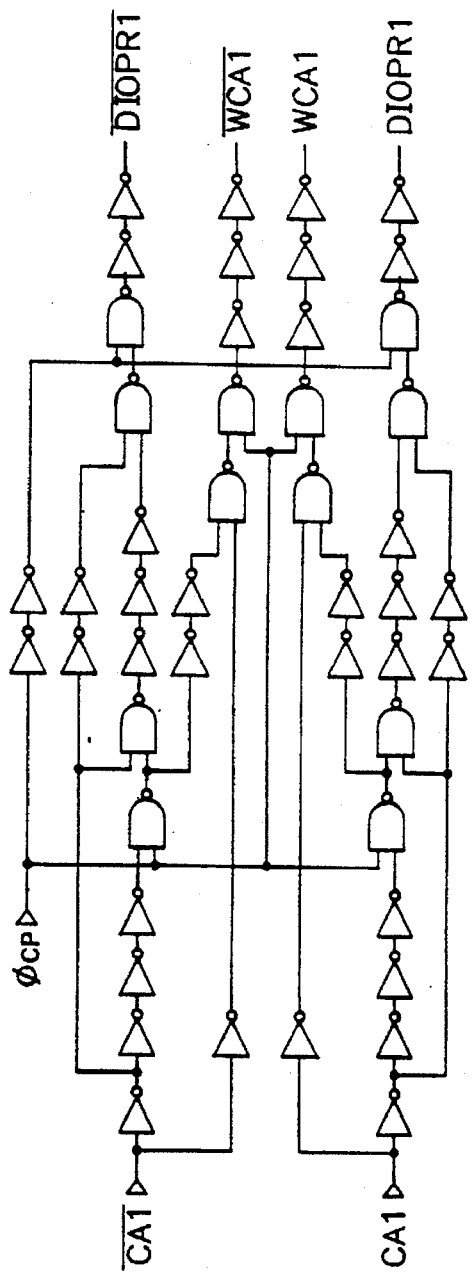
FIG. 51 is a schematic circuit diagram showing a circuit for generating control signals precharging DIO lines according to the present invention.

FIG. 51 shows a schematic circuit diagram of a circuit for generating control signals to precharge DIO lines. In the same manner as discussed above, once $\phi_{CP}$ goes to a low level, DIO line precharge signal DIOPR1 and its complement $\overline{DIOPR1}$ go high, and signal WCA1 and its complement $\overline{WCA1}$ go low, thereby precharging all of DIO lines. That is, this is in case of a $\overline{CAS}$ interrupt operation. If $\phi_{CP}$ goes to a high level and CA1 is at a low level ($\overline{CA1}$ is at a high level), signals DIOPR1 and WCA1 respectively maintain the high level and the low level while $\overline{DIOPR1}$ and $\overline{WCA1}$ respectively go to a low level and a high level. Thus, during a read or a write operation, precharge circuits 263c and 263d of FIG. 25 maintains on states while the circuits 263a and 263b thereof are turned off. Then, line pairs DIO$_2$, $\overline{DIO_2}$ and DIO$_3$, $\overline{DIO_3}$ keep precharging while DIO$_0$, $\overline{DIO_0}$ and DIO$_1$, $\overline{DIO_1}$ are ready for data transfer. In case of the write operation, transistors 318c and 318d of FIG. 27 maintain on states and transistors 318a and 318b thereof are turned off, thereby causing buffers 324c and 324d to keep off states and buffers 324a and 324b to transfer data depending on data states stored in latches 320. Then if CA1 goes to a high level, operations contrary to above mentioned ones are performed.

Figure 52:
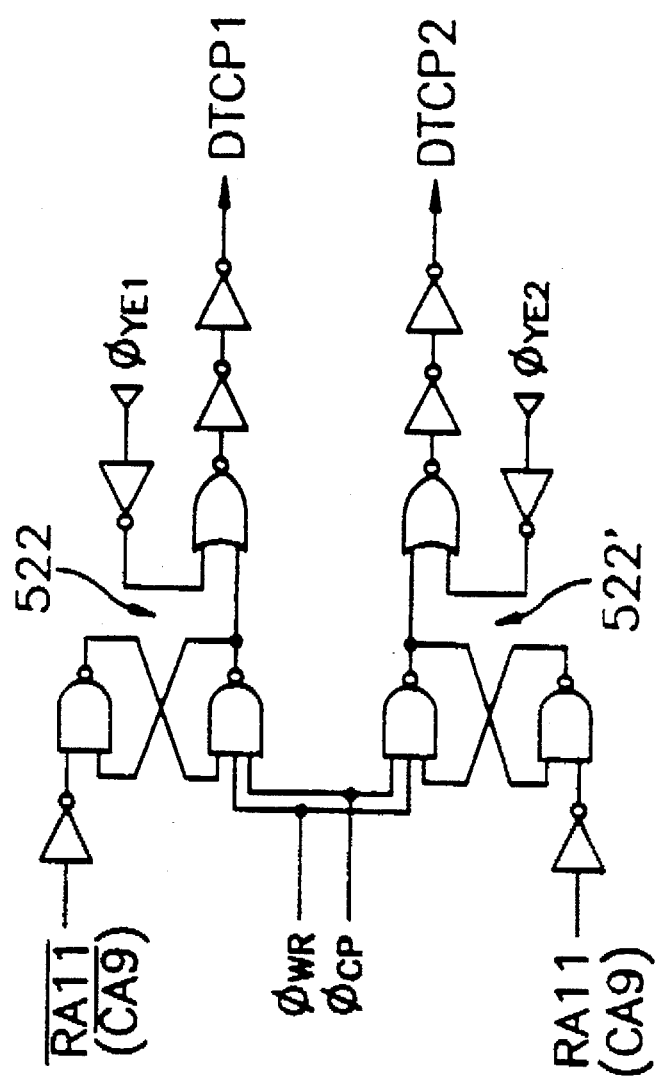
FIG. 52 is a schematic circuit diagram showing a circuit for generating bank selection signals using in the PIO line driver of FIG. 28.

FIG. 52 is a schematic circuit diagram of a circuit for generating bank selection signals for use in the PIO driver 330 shown in FIG. 28. Once a write command is issued, $\phi_{WR}$ and $\phi_{CP}$ then go to high levels. At this time, when RA11 or CA9 is at a low level, DTCP1 is latched to a high level and thereby the first bank is selected. Where precharge command is issued to the first bank, $\phi_{YE1}$ goes to a low level and thereby the first bank selection signal DTCP1 then goes to a low level. On the other hand, where a write command is issued to the second bank during the write operation for the first bank, a flip-flop 522' is latched to a low level and thereby a second bank selection signal DTCP2 then goes to a high level. Each of DTCP1 and DTCP2 is connected to PIO driver 330 associated with corresponding bank. Referring to FIG. 28, when bank selection signal DTCPi and block information signals BLS are all at high levels, switches 332 are enabled, thereby allowing data on corresponding DIO lines to be transferred.

7. Data Output Buffer Control Circuit

Figure 26:
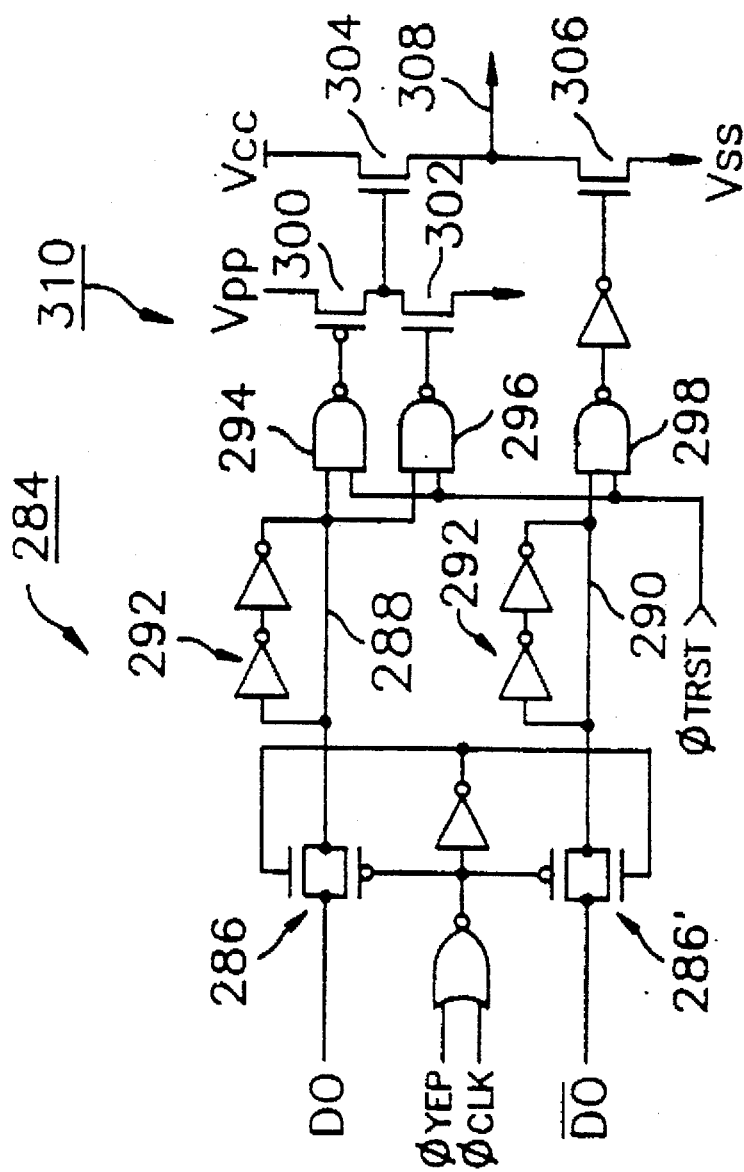
FIG. 26 is a schematic circuit diagram for a data output buffer according to the present invention.

Data output buffer control circuit is a circuit for controlling data outputs from the data output buffer 284 shown in FIG. 26. It is required that the data output buffer outputs data at eery predetermined rising edges of the system clock CLK in a read operation. Since the synchronous DRAM must output data information only within a given time period set by the $\overline{CAS}$ latency and the burst length, it is to be preferred that data output therefrom is precluded outside the given time period in order to as well increase the performance of the chip as prevent power consumption. Also, since one cycle time of the system clock of a predetermined frequency (33 MHZ in this embodiment) or less is long, it is meaningless to output data in synchronism with the system clock CLK.

Figure 53:
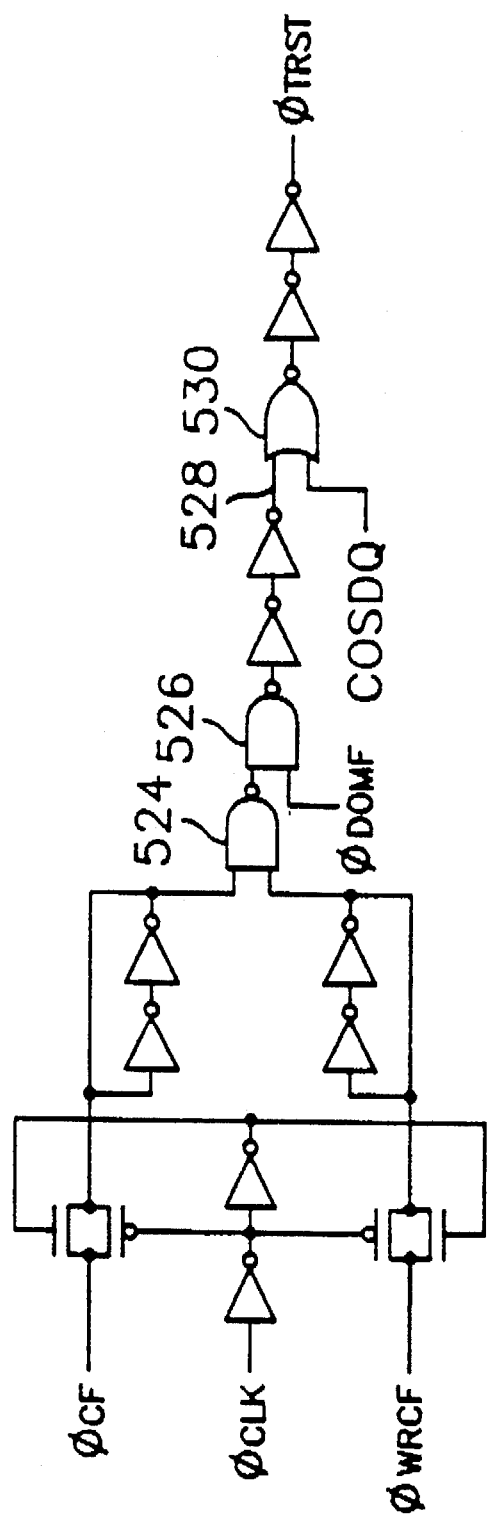
FIG. 53 is a schematic circuit diagram showing a control circuit for generating control signals being used in the data output buffer of FIG. 26.

FIG. 53 is a schematic circuit diagram of a control circuit for generating a control signals to inhibit data output of the data output buffer 284. NAND gate 524 outputs a low level in a write operation. A clock signal $\phi_{CF}$ stays a high level for one clock cycle of $\phi_{CLK}$ going to the high level at the first rising edge of $\phi_{CLK}$ after activation of $\overline{CAS}$. Likewise, $\phi_{WRCF}$ stays a high level for one clock cycle of $\phi_{CLK}$ after the activation of $\overline{WE}$. Where $\overline{CAS}$ and $\overline{WE}$ are all activated, the NAND gate 524 generates the low level, thereby allowing a signals $\overline{TRST}$ to go low. Also, when data output masking is requested by the external signal DQM, the DQM buffer 342 shown in FIG. 31 generates the low level clock signal $\phi_{DQMP}$ as shown in FIG. 32. Thus, the NAND gate 526 generates a high level pulse. This results in generating a row level pulse $\phi_{TRST}$. Likewise, the signal $\phi_{TRST}$ also becomes low with the signals COSDQ being at a high level after the delay depending on $\overline{CAS}$ latency j following the completion of the burst length. Thus, the output of the data output buffer shown in FIG. 26 becomes a high impedance in response to the low level signal $\phi_{TRST}$. Consequently, the data output buffer 284 inhibits data output at the rising edge of next system clock CLK after the issuance of the data output masking signal DQM. Also, upon the completion of the burst data output, the output of the buffer 284 becomes the high impedance.

Where external system clock of 33 MHZ or less is used, a control signal $\phi_{YEP}$ may be coupled to the $\overline{CAS}$ latency signal CL1 so as to output data irrespective of the internal system clock $\phi_{CLK}$. Since the $\overline{CAS}$ latency signal CL1 keeps a high level at such a system clock, the signal $\phi_{YEP}$ is at a high level. Thus, in the data output buffer 284 of FIG. 26, transfer switches 286 and 286' are always turned on and thereby not under the control of the system clock $\phi_{CLK}$. However, when system clock of a frequency above 33 MHZ is used, the signal CL1 is at a low level and the signal $\phi_{YEP}$ is also at a low level. Thus, the transfer switches 286 and 286' are turned on and off under the control of the system clock $\phi_{CLK}$.

OPERATION

Explanation will be now made on operation and using way of the present synchronous DRAM.

Referring to FIG. 41, illustration is made on a timing chart showing a read operation at the burst length of 4 and the $\overline{CAS}$ latency of 3, using an external system clock of 100 MHZ. At time $t_1$, activation command is issued. External addresses input along with the activation of $\overline{RAS}$. Then $\overline{RAS}$ buffer 56 produces the signal $\phi_{RP}$ and then generates the bank selection $\overline{RAS}$ signal $\phi_{RCi}$ defining one of the first and second banks 12 and 14 with the external address $A_{11}$. The row master clock generator 62 of FIG. 19 generates the row master clock $\phi_{Ri}$ in receipt of the signal $\phi_{RCi}$. The row address buffer 60 responds the row master clock $\phi_{Ri}$ to generate row address signals which are fed to the row decoder 18 of selected bank. In response to the row address signals, the row decoder 18 generates a block information signal BLS representative of a selected sub-array in each of the first to the fourth memory cell arrays and a signal selecting a word line in the selected sub-array. Sensing operation, which drives word lines selected by the word line selection signals and then develops data on corresponding bit lines, is performed by conventional techniques. After the completion of $\overline{RAS}$ chain, the row control clock generator 64 generates the signal $\phi_{RCDi}$ guaranteeing the $\overline{RAS}\text{-}\overline{CAS}$ delay time $t_{RCD}$. At time $t_2$, read command is issued and column addresses are inputted to the column address buffer 344. In response to the $\overline{CAS}$ signal being at the low level at the time $t_2$, the buffer 344 generates pulse signals $\phi_C$, $\phi_{CA}$, $\phi_{CP}$ and BITSET. The signal $\phi_{CAR}$ for controlling circuits associated with column address signal generation is generated from the column address reset signal generator 354 in response to the pulse signal $\phi_C$ and the signal $\phi_{YECi}$ which is generated from the column enable clock generator 66 in response to $\phi_{RCDi}$. The column address buffer 344 outputs column address signals CA0 to CA9 in response to the pulse signal $\phi_{CA}$ from the $\overline{CAS}$ buffer and the signal $\phi_{CAR}$. Thus, since the column address signals generated from the column address buffer 344 responsive to the column address enable/disable signal $\phi_{CAR}$, which is generated by the $\phi_{RCDi}$ signal representative of the completion of $\overline{CAS}$ chain, and the $\phi_C$ signal representative of the activation of $\overline{CAS}$, the time duration from the activation of $\overline{CAS}$ (time $t_2$) until the output of the column address signals becomes considerably short. After the transition of the $\phi_{CAR}$ signal to the high level, the burst length counter 350 carries out counting operation of the system clock $\phi_{CLK}$ to detect the burst length. In response to count signals CNT0 and CNT1 from the burst length counter 350, the burst length detector 352 generates the burst end signal COSI and the COSR signal representative of the burst length after the activation of $\overline{CAS}$. The detector 352 also produces COSDQ signal delayed by given clock cycles depending on a preset $\overline{CAS}$ latency value from the signal COSR to control the data output buffer 284 so as to provide data for the time period of data output which is defined by the burst length. Thus, since the $\overline{CAS}$ latency equals 3, the signal COSDQ is a signal delayed by approximately two cycles of $\phi_{CLK}$ from the signal COSR. Thus, the COSDQ signal is at the low level for the period of time defined by the $\overline{CAS}$ latency and the burst length (the time duration between $t_3$ and $t_6$).

The column address counter 346 loads column address signals from the column address buffer 344 in response to the pulse signal BITSET from the $\overline{CAS}$ buffer and the column address enable signal $\phi_{CARC}$, and then generates column address signals PCA0 to PCA8 in sequence, counting the clock CNTCLK9 according to the burst length and the address mode. The column address buffer 344 generates sequential column address signals CA0 to CA8 composed of initial column addresses and the column address signals PCA0 to PCA8.

FIG. 41 shows the timing chart at a binary address mode (($\phi_{INTEL}$=0) where initial external column address $A_0$ is high and the remaining external column addresses $A_1$ to $A_8$ are all low. Since the burst length was set to 4, only the burst length signal $SZ_4$ stays at a high level. Thus, only the lower two stages ST1 and ST2 of the first counter portion constituting the column address counter 346 of FIG. 35 executes the binary counting operation. Since the counting operation is performed at 100 MHZ, the clock CNTCLK9 is identical to the system clock $\phi_{CLK}$. Thus, the outputs RCA0 and RCA1 of the data transfer control counter 348 are identical to the outputs PCA0 and PCA1 of the column address counter 346. The outputs RCA0 and RCA1 of the counter 348 are fed to the read data transfer clock generator 356, thereby generating read data transfer pulses RDTP0 to RDTP3 therefrom.

On the other hand, column address signals CA0 to CA8 from the column address buffer 344 are fed to the column decoder 24, and the column predecoder 436 of FIG. 39a produces partly overlapped predecode signals $\overline{DCA1\,2}$ and $\overline{DCA1\,2}$ with the successive column address signals CA1 and CA2. The main column decoder 444 of FIG. 40 receives the predecode signals to generate column selection signals CSL0 and CSL1. Since the column selection signal CSL0 allows data developed on bit line pairs to be transferred to the first I/O line pairs I/O$_0$, $\overline{I/O_0}$ and I/O$_1$, $\overline{I/O_1}$ data on the first I/O line pairs, which is produced by the first pulse 532 of the column selection signal CSL0, inputs to the I/O sense amplifier via corresponding I/O line selection circuit and corresponding first PIO line pairs. In response to the activating signal 535 as shown in FIG. 41C, the I/O sense amplifier amplifies data on the first PIO line pairs to output to corresponding first data line pairs DIO$_0$, $\overline{DIO_0}$ and DIO$_1$, $\overline{DIO_1}$. At this time, since the DIO line precharge signal DIOPR1 is at a high level, the second data line pairs DIO$_2$, $\overline{DIO_2}$ and DIO$_3$, $\overline{DIO_3}$ are in precharging states. Data transferred via the first data line pairs is stored into the register 278 in the data output multiplexer 268' of FIG. 25. Data transferred via the data line pair DIO$_1$, $\overline{DIO_1}$ of the first data line pairs is selected by the pulse RDTP1 and then inputted to the data output buffer via the common data line pair CDL, $\overline{CDL}$, the data output latch 282 and the data output line pair DO, $\overline{DO}$. In the same manner as discussed above, parallel data on the second I/O line pairs I/O$_2$, $\overline{I/O_2}$ and I/O$_3$, $\overline{I/O_3}$, which is generated by the pulse 533 of column selection signal CSL1, is then inputted in series to the data output buffer. Last data on the I/O line pair I/O$_0$, $\overline{I/O_0}$ of the first I/O line pairs, which is generated by the second pulse 534 of the column selection signal CSL0, is then inputted to the data output buffer. If read-out is 1, 0, 1, 0, the data output buffer is enabled by the high level pulse $\phi_{TRST}$, and its output DOUT is like the illustration of FIG. 41C. Thus, when the signal $\phi_{TRST}$ is lOW, the data output buffer 284 becomes a high impedance and thereby prevents unnecessary operation thereof. It can be seen that the first data is generated at the rising edge of the third clock of the system clock CLK after the activation of $\overline{CAS}$, and continuous 4-bit data is outputted in synchronism with the system clock CLK.

FIG. 33 is the timing chart showing a write operation at the $\overline{CAS}$ latency of 2 and the burst length of 4, using a system clock of 66 MHZ. The timing of FIG. 33 is also of the case where external addresses A$_0$ and A$_1$ to A$_8$ are respectively applied with a high level and low levels in the same manner as above-mentioned read operation, and the input data DIN to the data input buffer is a serial data of 1,0,1,0. The $\overline{RAS}$ chain operation is performed as previously discussed, and the burst length signal COSR is generated by the burst end signal COSI. Sequential column address signals RCA0 and RCA1 for generating write data transfer pulses WDTP0 to WDTP3 are produced by column address signals CA0 and CA1. Write command is issued at time t$_2$, and write control signals $\phi_{WR}$ and $\phi_{EWDC}$ are produced from the $\overline{WE}$ buffer 340 by the low level signal $\overline{WE}$. In response to the signals RCA0 and RCA1, the write data transfer clock generator 358 generates write data transfer pulses WDTP0 to WDTP3 for converting a serial data to a parallel data. The input data DIN inputting via the data input buffer 312 is outputted on the input line DI as the serial data synchronized with $\phi_{CLK}$ as shown in FIG. 33. The data input demultiplexer 314 produces the parallel data on the data lines $\overline{DIO_1}$, DIO$_2$, $\overline{DIO_3}$ and DIO$_0$ under the control of control signals WCA1 and $\overline{WCA1}$ and the write data transfer pulses WDTP0 to WDTP3, having the timing as shown in FIG. 33. The parallel data is fed to corresponding I/O bus via the PIO line driver 330 under the control of control signals IOPR1 and $\overline{IOPR1}$, and then written into corresponding memory cells via bit lines selected by the column selection signals.

FIG. 49 is the timing chart showing the $\overline{CAS}$ interrupt read operation at the $\overline{CAS}$ latency of 3 and the burst length of 4, using a system clock of 66 MHZ. At the read command of time t$_1$, external addresses A$_0$ and A$_1$ to A$_8$ are respectively applied with a high level and low levels, and at the $\overline{CAS}$ interrupt read command of time t$_3$, external addresses A$_1$ and A$_0$ and A$_2$ to A$_8$ are respectively applied with a high level and low levels. This $\overline{CAS}$ interrupt read operation is identical to the previously discussed read operation, excepting that the last 2-bit data of the data, which must be read out by the read command issued at time t$_1$, can never be read out by the $\overline{CAS}$ interrupt command issued at time t$_3$. Referring to FIG. 49, explanation will be made in brief. The activation command, i.e., the $\overline{RAS}$ activation command is issued at two cycles of CLK before time t$_1$. Then since operation of $\overline{RAS}$ chain with row addresses is identical to that as previously discussed, explanation of this operation will be omitted. The read command is issued at time t$_1$, and the column predecode signal $\overline{DCA1\ 2}$ from the column predecoder (shown in FIG. 39a) then becomes high with CA1 and CA2 being at low levels. Then, the column selection signal CSL0 includes the high level pulse 600, as shown in FIG. 49b, with CA2 to CA8 being always at low levels. After the transition of CA1 from the low level to the high level, the column predecode signal DCA1$\overline{2}$ becomes high, overlapping one end portion of the signal $\overline{DCA1\ 2}$, and thereby the column selection signal CSL1 has the high level pulse 601. Once the $\overline{CAS}$ interrupt read command is issued at time t$_3$, the $\overline{CAS}$ buffer 338 then generates the signal BITSET of pulse 602. The burst length counter 350 is then reset by the pulse 602 and re-starts a binary counting operation with the system clock $\phi_{CLK}$. After counting the burst length of 4, the counter 350 generates the burst end signal COSI of pulse 603. Then, the burst length detector 352 produces the low level signal COSR indicating of a burst length from the first read command with the pulse $\phi_C$ and the signal COSR, and then outputs the signal COSDQ indicating of a data read-out time period with the signal COSR and the $\overline{CAS}$ latency signal. Thus, it can be seen that a total 6-bit data may be read out. The column address buffer 344 shown in FIG. 34 latches external column addresses inputted upon $\overline{CAS}$ interrupt (at time t$_3$) by the high level pulse $\phi_{CA}$ from the $\overline{CAS}$ buffer 338, and produces successive four column address signals with the help of the column address counter 346. Thus, column address signal CA1, which is latched by the external high level address A$_1$ inputted at time t$_3$, maintains high for about two clock cycles after the transition of $\phi_{CA}$ to the low level since the least significant column address signal CA0 stays at the low level. Then, since CA2 to CA8 are all low at this time, the column selection signal CSL1 becomes the high level pulse 604. After the transition of CA1 to the low level, CA1 and its complement $\overline{CA1}$ respectively stay low and high for about two clock cycles. However, the low-going signal $\phi_{CAR}$ causes CA1 and $\overline{CA1}$ to go low. This results in allowing the column selection signal CSL0 to become the high level pulse 605 on the other hand, with column addresses A$_0$ and A$_1$ being respectively high and low at t$_1$, and with column addresses A$_0$ and A$_1$ being respectively low and high at t$_3$, read data transfer pulses RDTP0 to RDTP3 are generated as shown in FIG. 49b.

Data on bit line pairs is transferred to first I/O line pairs by the pulse 600 of CSL0, and then transferred to first data pairs DIO$_0$, $\overline{DIO_0}$ and DIO$_1$, $\overline{DIO_1}$ via first PIO line pairs. FIG. 49c shows where a high level data and a low level data are respectively transferred in parallel on DIO$_0$ line and DIO$_1$ line. This parallel data is stored into latches 278a and 278b in the data output multiplexer 268 of FIG. 25, and the pulse 606 of RDTP1 then causes the stored data of the latch 278b associated with the line DIO$_1$ to output therefrom. Consequently, the data output buffer outputs the low level data RD1. Parallel data selected by the pulse 601 of CSL1 is transferred to second data line pairs DIO$_2$, $\overline{DIO_2}$ and DIO$_3$, $\overline{DIO_3}$ via second I/O line pairs and second PIO line pairs. It can be seen that data on DIO$_2$ and DIO$_3$ is respectively high and low. The pulse 607 of RDTP2 selects data stored into the latch 278c and the data output buffer then outputs the high level data RD2. Likewise, parallel data selected by the pulse 604 of CSL1 is transferred to data lines DIO$_2$ and DIO$_3$. The drawing of FIG. 49c shows that a low level data and a high level data are transferred on data lines DIO$_2$ and DIO$_3$, respectively. The transfer switch 276 of FIG. 25 becomes an off state with the high level pulse P of $\phi_{CL}$. However, after the data, which was stored into the latch 278c via the line DIO$_2$ in the previous operation, has been transferred toward the data output buffer by the pulse 607 of RDTP2, the pulse P goes low. Then, the switch 276 becomes on. Thus, data on the data lines $DIO_2$ and $DIO_3$ is respectively stored into latches 278c and 278d. Data stored into the latch 278c is then outputted by the pulse 607 of RDTP2 and thereby the data output buffer 284 outputs the low level data RD3. Data stored into the latch 278d is then outputted by the pulse 608 of RDTP3, thereby resulting in outputting the high level data RD4 from the data output buffer 284. Likewise, data selected by the pulse 605 of CSL0 is transferred to first data line pairs. It can be seen in the drawing that a low level data and a high level data are respectively transferred in parallel on data lines $DIO_0$ and $DIO_1$. In the same manner as discussed above, this parallel data is selected in sequence by the pulses 609 and 610 shown in FIG. 49b, and the data output buffer 284 then outputs the low level data RD5 and the high level data RD6 in sequence. The data output buffer 284 then becomes a high impedance with the high level signal COSDQ.

Figure 54:
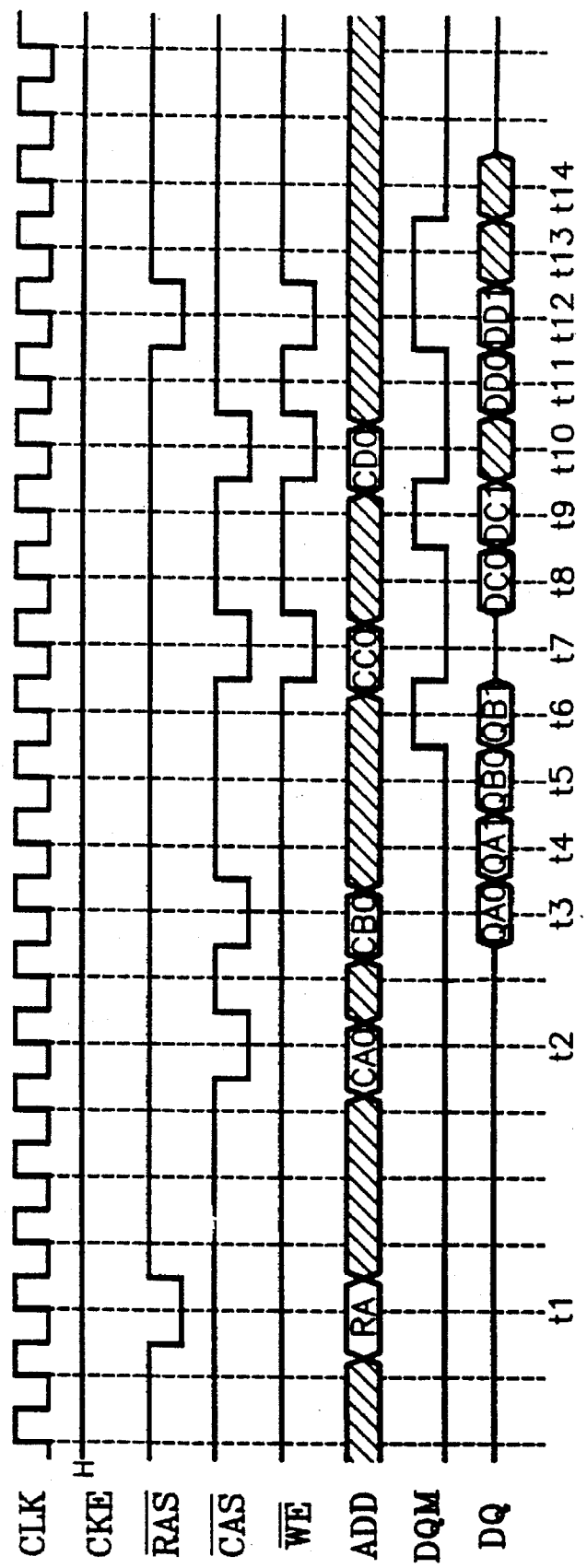
FIGS. 54, 55, 56 and FIG. 57 are timing diagrams showing the timing relationship according to various operation modes in the synchronous DRAM using the pulse $\overline{RAS}$.

FIG. 54 is a timing chart showing various operations at the $\overline{CAS}$ latency of 2 and the burst length of 4, using only one selected bank. Commands are given as follows: activation command at $t_1$, read command with external column addresses CA0 at $t_2$, $\overline{CAS}$ interrupt read command with external column addresses CB0 at $t_3$, $\overline{CAS}$ interrupt write command with external column addresses CC0 at $t_7$, $\overline{CAS}$ interrupt write command with external column addresses CD0 at $t_{10}$, precharge command at $t_{12}$ and data input/output masking command at $t_6$, $t_9$, $t_{12}$ and $t_{13}$. Data QA0 and QA1 respectively output at $t_3$ and $t_4$ due to the read command issued at $t_2$, and data QB0 and QB1 successively output at $t_5$ and $t_6$ due to the read command issued at $t_3$. At $t_7$, data output is inhibited and stays in a high impedance state due to the data output masking command issued at $t_6$. At $t_8$ and $t_9$, write data DC0 and DC1 respectively input due to the write command at $t_7$. The data input masking command at $t_9$, write data DC0 and DC1 respectively input due to the write command at $t_7$. The data input masking command at $t_9$ interrupts receipt of write data at time $t_{10}$. Likewise, at $t_{11}$ and $t_{12}$, write data DD0 and DD1 are respectively inputted due to the write command at $t_{10}$. The data input masking command issued at $t_{12}$ and $t_{14}$ after the precharge command at $t_{12}$.

Figure 55:
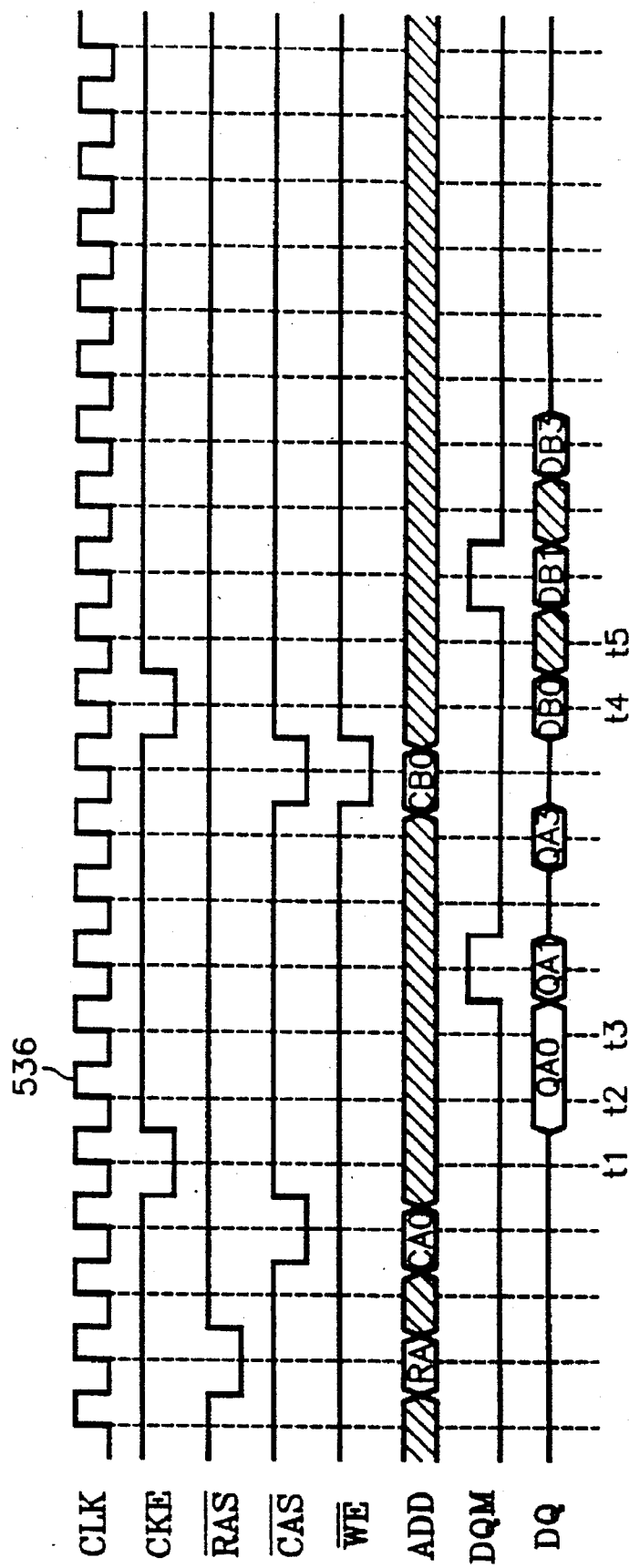

FIG. 55 is a timing chart showing various operations at the $\overline{CAS}$ latency of 2 and the burst length of 4 with one selected bank. Read, write and data input/output masking operations are the same as those of FIG. 54. After issuance of freeze command at $t_1$, generation of a pulse of internal system clock $\phi_{CLK}$ corresponding to the pulse 536 of the system clock CLK is inhibited. Thus, the output of data at $t_3$ is frozen so as to output the same data as the output of data at $t_2$. Likewise, the internal system clock, in which the generation of corresponding pulse is precluded, causes operation of the column address counter to be frozen, thereby inhibiting writing of data at $t_5$.

Figure 56:
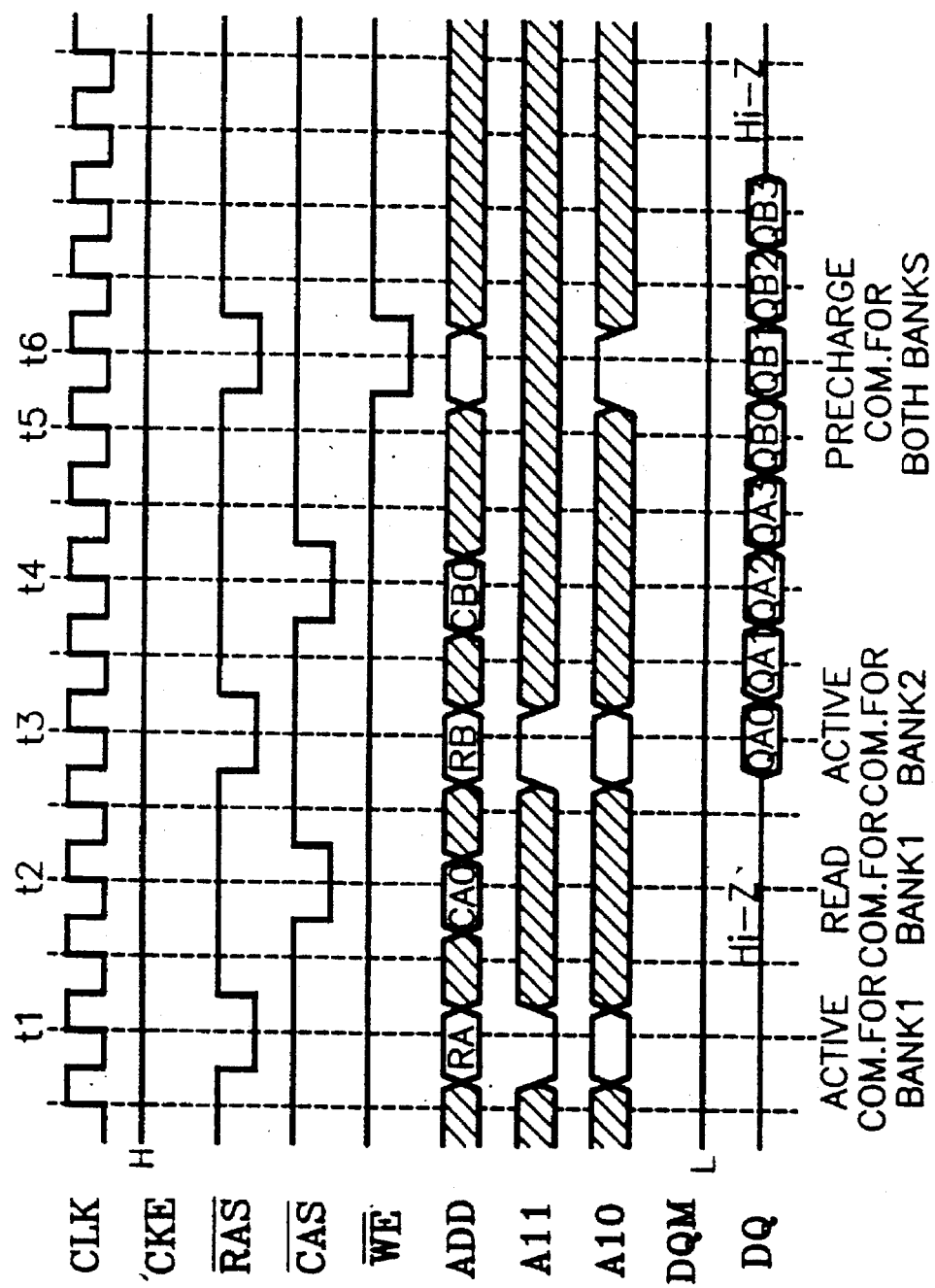

FIG. 56 is a timing diagram showing a read operation at the $\overline{CAS}$ latency of 2 and the burst length of 4 with two banks. With activation command of the first bank at $t_1$, and with read command at $t_2$, successive data QA0 to QS3 outputs from time $t_3$. With activation command of the second bank at $t_3$, and with read command at $t_4$, successive data QB0 to QB3 also outputs from time $t_5$. At time $t_6$, simultaneous precharge command is issued at $t_6$.

Figure 57:
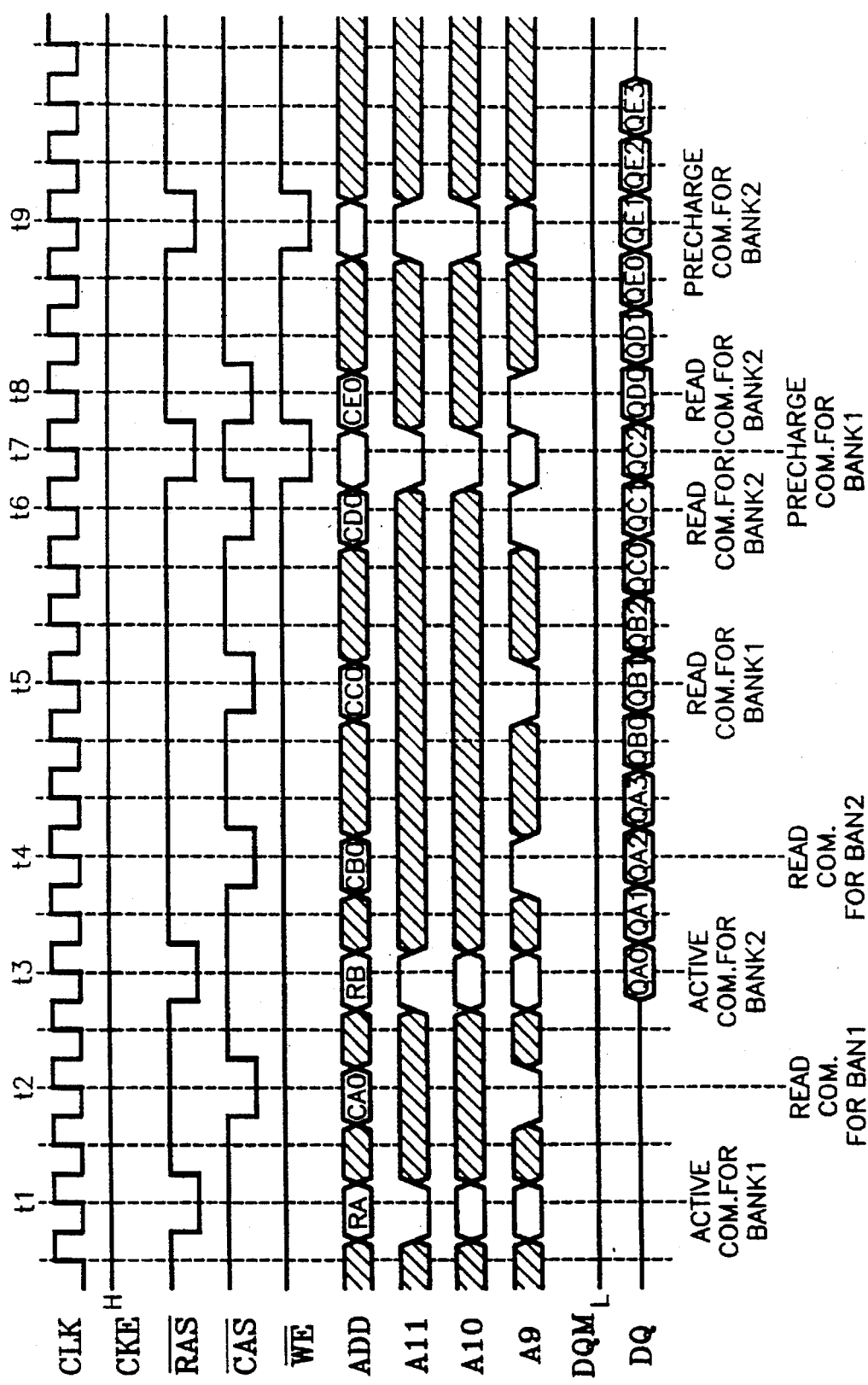

FIG. 57 is a timing diagram showing an interleave read operation with the $\overline{CAS}$ latency of 2 and the burst length of 4. Activation command for the first bank is issued at time $t_1$, and that for the second bank is then issued at time $t_2$. Thus, data QA0 to QA3 is read out from the first bank from time $t_3$. At the same time, activation command for the second bank is issued at $t_3$. At time $t_4$, read command is issued for the second bank selected with the high level column address $A_9$. Then, after output of successive 4-bit data QA0 to QA3, read-out data QB0 and QB1 outputs from the second bank with no gap. At time $t_5$, read command is issued for the first bank with the low level column address $A_9$, thereby successively outputting read-out data QC0 and QC1 from the first bank. Read command is then issued for the second bank at time $t_6$, thereby outputting read-out data QD0 and QD1. Precharge command is then issued for the first bank at time $t_7$. Read command is then issued for the second bank at time $t_8$, thereby outputting read-out data QE0 to QE3. Precharge command is issued for the second bank with external addresses $A_{10}$ and $A_{11}$ at time $A_9$.

Explanation has been made on various operation modes with a single data input/output pad in connection with FIGS. 54 to 57. However, it should be noted that the present embodiment has eight data input/output pads and various applications are also possible.

OTHER EMBODIMENTS

As discussed hereinabove, the present synchronous DRAM has been modified with pulse $\overline{RAS}$. However, the synchronous DRAM of the present invention may be embodied with the level $\overline{RAS}$. Various operation commands for the level $\overline{RAS}$ have been already explained. In order for the present synchronous DRAM to operate with the level $\overline{RAS}$, some circuits need modifications, but others may be used with no modification.

Figure 58:
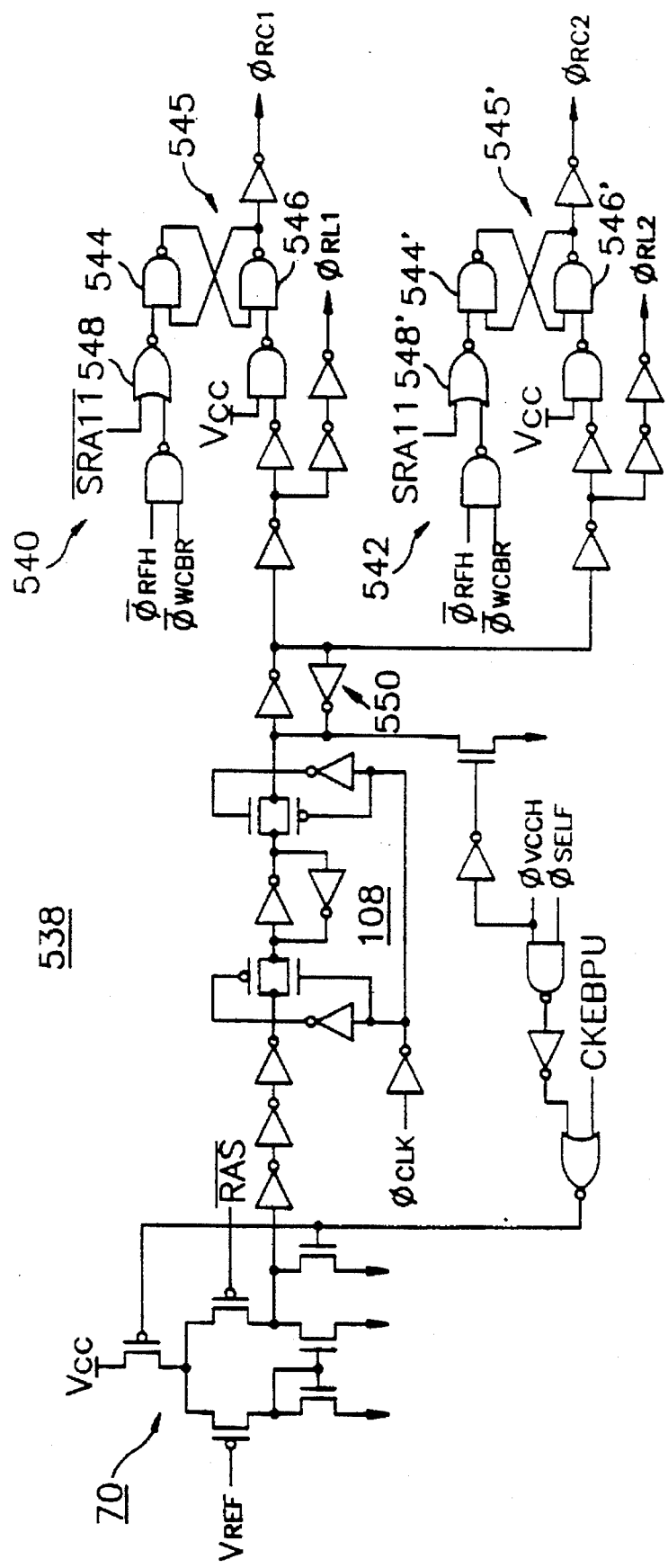
FIG. 58 is a schematic circuit diagram for a $\overline{RAS}$ buffer using in the level $\overline{RAS}$.

FIG. 58 is a drawing showing a schematic circuit diagram for a $\overline{RAS}$ buffer using the level $\overline{RAS}$. Referring to the drawing, an input buffer 70 and a synchronization circuit 108 which constitute the level $\overline{RAS}$ buffer 538 are the same in constructions and operations as the $\overline{RAS}$ buffer 56 for the pulse $\overline{RAS}$ showing in FIG. 9. The output of the synchronization circuit 108 is connected in common with a first $\overline{RAS}$ signal generator 540 for the first bank and with a second $\overline{RAS}$ signal generator 542 for the second bank via a latch 550. The first $\overline{RAS}$ signal generator 540 comprises a flip-flop 545 for storing a first bank $\overline{RAS}$ signal in response to a bank selection signal $\overline{SRA11}$ produced by an address $A_{11}$. The flip-flop 545 is a NAND type flip-flop comprised of NAND gates 544 and 546. One input terminal of the flip-flop 545 is connected to the output Of a NOR gate 548, and the other input terminal of the flip-flop 545 receives a $\overline{RAS}$ signal from the synchronization circuit 108. The NOR gate 548 receives the bank selection signal $\overline{SRA11}$ on its first input terminal and a signal on its second input terminal which is staying at a high level during a refresh, a mode set or a test operation. The construction of the second $\overline{RAS}$ signal generator is the same as that of the first $\overline{RAS}$ signals generator. Thus, Upon the activation of $\overline{RAS}$, if the external address $A_{11}$ is low, i.e., $\overline{RAS}$ signal $\phi_{RC1}$ is then latched to a high level. At this time, since the NOR gate 548' of the second $\overline{RAS}$ signal generator 542 outputs high, the flip-flop 545' maintains the previous state. That is, if upon the activation of $\overline{RAS}$ in the previous operation, $A_{11}$ was high, i.e., SRA11 was high, the second bank $\overline{RAS}$ signal $\phi_{RC2}$ keeps high. On the other hand, if $\overline{RAS}$ goes from a low level to a high level, the latch 550 latches a high level at the rising edge of the next system clock $\phi_{CLK}$. Thus, NAND gates 546 and 546' each receives a low level, and thereby the signals $\phi RC1$ and $\phi_{RC2}$ becomes low. That is, both banks go to precharge states. In addition, since $O_{RFH}$ is low during a refresh, and $O_{WCBR}$ is low during a mode set operation, the signals $\phi_{RC1}$ and $\phi_{RC2}$ are all high in such operations. Signals $\phi_{RC1}$ and $\phi_{RL2}$ are faster signals than the signals $\phi_{RC1}$ and $\phi_{RC2}$.

Figure 59:
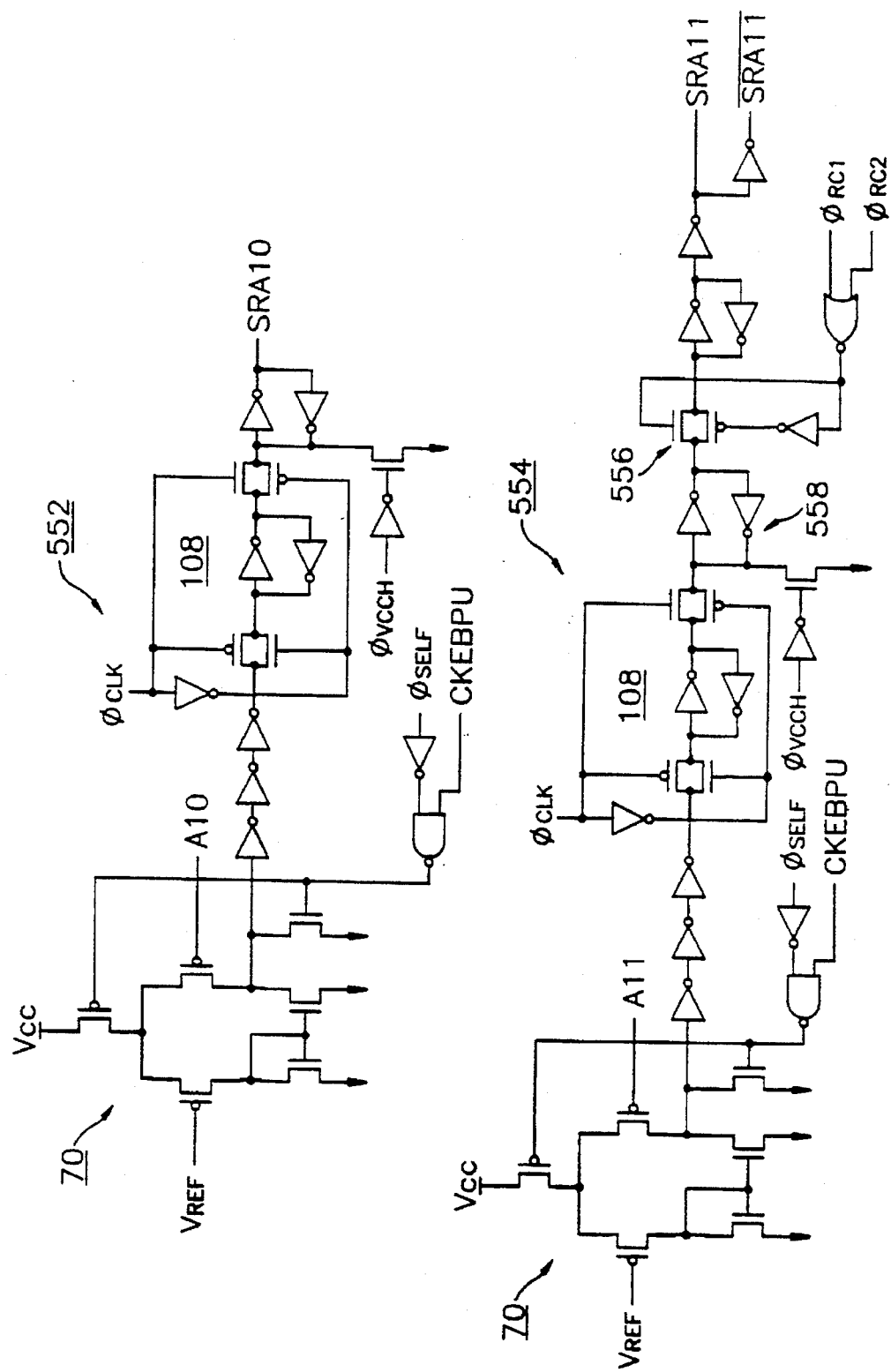
FIG. 59 is a schematic circuit diagram for a special address buffer according to the present invention.

FIG. 59 is a drawing showing address buffers for generating special addresses SRA10 and SRA11. These address buffers is independent buffers separated from the row and column address buffers. The address buffer 552 for producing SRA10 in response to an address $A_{10}$ is used in the pulse $\overline{RAS}$, but not in the level $\overline{RAS}$. The address buffer 552 has the same construction as previously mentioned buffers each comprised of the input buffer 70 and the synchronization circuit 108. The address buffer 554 for producing SRA11 in response to an address A11 comprises a transfer switch 556 which is turned on in response to signals $\phi_{RC1}$ and $\phi_{RC2}$ produced in case of level $\overline{RAS}$. The transfer switch 556 is turned off by activation of either the first or the second bank and also serves to prevent from changing a logic level of the signal SRA11 with the system clock $\phi_{CLK}$ after activation of one of both banks. In case that the address buffer 554 is used for the pulse $\overline{RAS}$, it may be modified so that the output of the latch 558 becomes SRA11.

Figure 60:
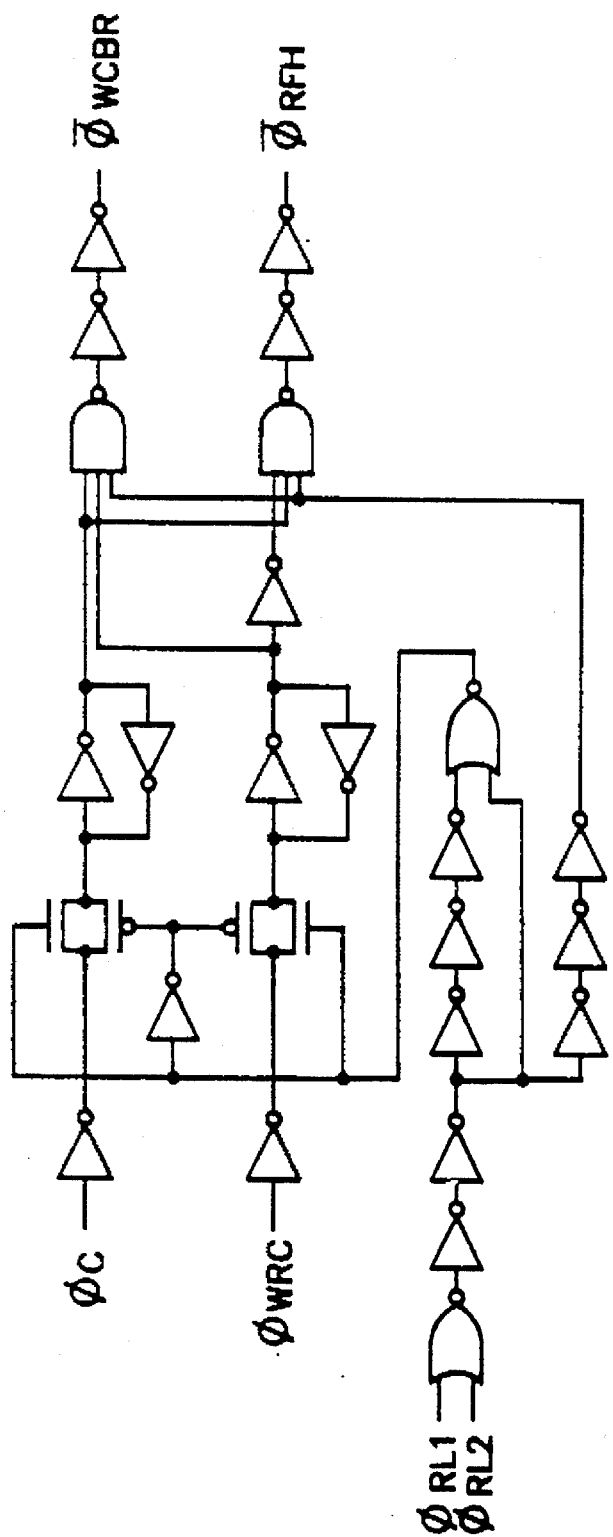
FIG. 60 is a schematic circuit diagram showing a control circuit for generating a mode set master clock and a refresh master clock which use in the level $\overline{RAS}$.

FIG. 60 is a schematic circuit diagram of a level $\overline{RAS}$ control circuit for generating a mode set control signal $O_{WCBR}$ and a refresh clock $O_{RPH}$ in case of the level $\overline{RAS}$. In the mode set control signal generator 200 of FIG. 14 used in the pulse $\overline{RAS}$, the transfer switches are gated by the signal $\phi_{RP}$. However, in case of the level $\overline{RAS}$, the transfer switches are gated by a signal being produced by the signals $\phi_{RL1}$ and $\phi_{RL2}$ in place of the signals $\phi_{RP}$. This is to generate the signals $O_{WCBR}$ and $O_{RFH}$ with faster signals $\phi_{RL1}$ and $\phi_{RL2}$ than $\phi_{RC1}$ and $\phi_{RC2}$. Its operation is the same as that explained in connection with FIG. 14.

Figure 61:
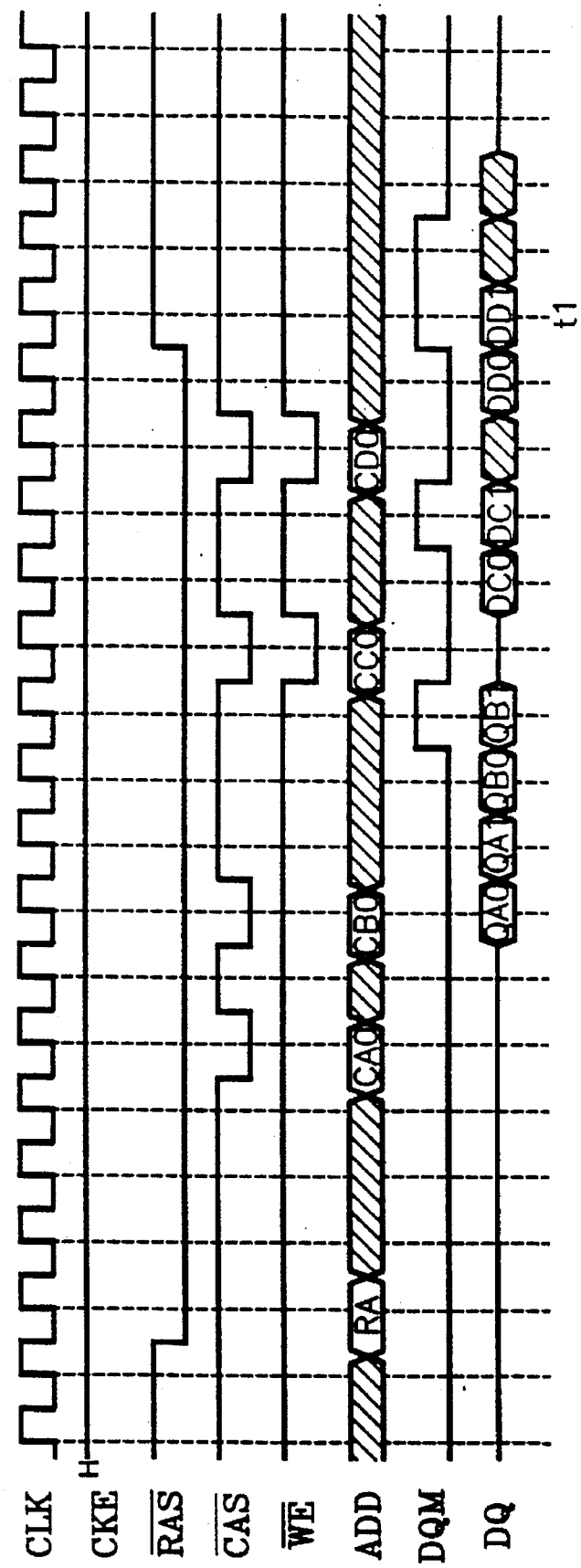
FIG. 61 is a timing diagram showing the operation timing relationship in the synchronous DRAM using the level $\overline{RAS}$.

FIG. 61 is a drawing showing an operation timing charge of the synchronous DRAM using the level $\overline{RAS}$. The operation timing chart as shown in this drawing has relationship with that using the pulse $\overline{RAS}$ as shown in FIG. 54. In the drawing of FIG. 61, a precharge command is issued at time $t_1$. Remaining operations are the same as those of the pulse $\overline{RAS}$.

As explained hereinabove, the system design and using ways of the present synchronous DRAM have been explained in detail. Although embodiments of the present invention have been explained in connection with a synchronous DRAM, it would be obvious to those skilled in the art that the present invention may also be applied to other semiconductor memories.

What is claimed is:

1. A dynamic random access memory receiving an external clock comprising:

a plurality of memory banks each including a plurality of memory cells having an address associated therewith and operable in either one of an active cycle and a precharge cycle at any one time;

means for receiving a row address strobe signal and latching a logic level of the row address strobe signal in response to one of a rising edge and a falling edge of said clock;

address input means for receiving a portion of one of said addresses to indicate selection of one of the memory banks; and means, receiving the latched logic level and the one address portion, for outputting an activation signal to said one selected memory bank and an inactivation signal to unselected memory banks when the latched logic level is at a first logic level, so that said one selected memory bank operates in the active cycle while the unselected memory banks operate in the precharge cycle.

* * * * *